(12) United States Patent
Naito et al.

(10) Patent No.: US 11,306,243 B2
(45) Date of Patent: Apr. 19, 2022

(54) COMPOSITION, FILM, MULTILAYER STRUCTURE, LIGHT EMITTING DEVICE AND DISPLAY

(71) Applicant: Sumitomo Chemical Company, Limited, Tokyo (JP)

(72) Inventors: Shota Naito, Tsukuba (JP); Yoshiaki Sakatani, Niihama (JP)

(73) Assignee: Sumitomo Chemical Company, Limited, Tokyo (JP)

( * ) Notice: Subject to any disclaimer, the term of this patent is extended or adjusted under 35 U.S.C. 154(b) by 73 days.

(21) Appl. No.: 16/623,596

(22) PCT Filed: Jun. 22, 2018

(86) PCT No.: PCT/JP2018/023824
§ 371 (c)(1),
(2) Date: Dec. 17, 2019

(87) PCT Pub. No.: WO2018/235945
PCT Pub. Date: Dec. 27, 2018

(65) Prior Publication Data
US 2020/0181484 A1    Jun. 11, 2020

(30) Foreign Application Priority Data
Jun. 23, 2017 (JP) .............................. JP2017-123641

(51) Int. Cl.
| | | |
|---|---|---|
| C09K 11/02 | (2006.01) | |
| C09K 11/88 | (2006.01) | |
| H01L 33/50 | (2010.01) | |
| C09K 11/66 | (2006.01) | |
| C09K 11/62 | (2006.01) | |
| B82Y 20/00 | (2011.01) | |
| B82Y 30/00 | (2011.01) | |

(52) U.S. Cl.
CPC ............ *C09K 11/025* (2013.01); *C09K 11/62* (2013.01); *C09K 11/664* (2013.01); *C09K 11/665* (2013.01); *C09K 11/883* (2013.01); *H01L 33/50* (2013.01); *B82Y 20/00* (2013.01); *B82Y 30/00* (2013.01)

(58) Field of Classification Search
CPC ..... C09K 11/025; C09K 11/883; C09K 11/02; C09K 11/664; C09K 11/665
See application file for complete search history.

(56) References Cited

U.S. PATENT DOCUMENTS

| | | | | |
|---|---|---|---|---|
| 8,043,793 | B2 * | 10/2011 | Iizumi .................... | H05B 33/10 430/311 |
| 8,334,527 | B2 * | 12/2012 | Iizumi .................... | H05B 33/20 257/40 |
| 2010/0224856 | A1 | 9/2010 | Iizumi et al. | |
| 2011/0082026 | A1 | 4/2011 | Sakatani et al. | |
| 2012/0301971 | A1 | 11/2012 | Murase et al. | |
| 2014/0084212 | A1 | 3/2014 | Kikuchi | |
| 2016/0115383 | A1 * | 4/2016 | Kuzumoto ........... | C09K 11/703 252/301.33 |
| 2016/0333265 | A1 | 11/2016 | Murase et al. | |
| 2017/0025583 | A1 | 1/2017 | Kuzumoto et al. | |
| 2017/0222095 | A1 | 8/2017 | Yamashita et al. | |

FOREIGN PATENT DOCUMENTS

| | | | |
|---|---|---|---|
| CN | 103205257 | A | 7/2013 |
| CN | 104576930 | A | 4/2015 |
| CN | 105449104 | A | 3/2016 |
| CN | 106025042 | A | 10/2016 |
| CN | 106634133 | * | 5/2017 |
| JP | 2011-026535 | A | 2/2011 |
| JP | 2013-161861 | A | 8/2013 |
| JP | 2013-177258 | A | 9/2013 |
| JP | 2013-189367 | A | 9/2013 |
| JP | 2014-118529 | A | 6/2014 |
| TW | 201129423 | A | 9/2011 |
| WO | 2011/081037 | A1 | 7/2011 |
| WO | 2014/007966 | A1 | 1/2014 |
| WO | 2016/021509 | A1 | 2/2016 |
| WO | WO 2017/166106 | * | 10/2017 |

OTHER PUBLICATIONS

Translation for CN 106634133, May 10, 2017.*
International Search Report issued in corresponding International Patent Application No. PCT/JP2018/023824 dated Aug. 21, 2018.
Sun et al., "Efficient and Stable White LEDs with Silica-Coated Inorganic Perovskite Quantum Dots," Advanced Materials 28: 10088-10094 (2016).
Huang et al., "Enhancing the Stability of CH3NH3PbBr3 Quantum Dots by Embedding in Silica Spheres Derived from Tetramethyl Orthosilicate in "waterless" Toluene," Journal of the American Chemical Society, 138: 5749-5752 (2016).
Xiong et al., "Hydrophobic coating over a CH3NH3PbI3 absorbing layer towards air stable perovskite solar cells," Journal of Materials Chemistry C, 4: 6848-6854 (2016).
Yang et al., "In situ silica coating-directed synthesis of orthorhombic methylammonium lead bromide perovskite quantum dots with high stability," Journal of Colloid and Interface Science, 509: 32-38 (2018).

(Continued)

*Primary Examiner* — C Melissa Koslow

(74) *Attorney, Agent, or Firm* — Morgan, Lewis & Bockius LLP

(57) ABSTRACT

A light-emitting composition including: semiconductor fine particles as component (1); and a compound represented by Formula (X) or a modified product thereof as component (2).

$$[R^{16}-Y\frac{}{a}-Si-OR^{17}]_{4-a} \quad (X)$$

19 Claims, 1 Drawing Sheet

(56) References Cited

OTHER PUBLICATIONS

Extended European Search Report issued in related European Patent Application No. 18821090.0 dated Feb. 9, 2021.
Office Action issued in corresponding Taiwanese Patent Application No. 107121528 dated Nov. 30, 2021 (see partial English translation).
Office Action issued in corresponding Chinese Patent Application No. 201880041094.3 dated Jan. 10, 2022.
Office Action issued in corresponding Japanese Patent Application No. 2019-525705 dated Mar. 8, 2022.

* cited by examiner

COMPOSITION, FILM, MULTILAYER STRUCTURE, LIGHT EMITTING DEVICE AND DISPLAY

TECHNICAL FIELD

The present invention relates to a composition, a film, a laminated structure, a light-emitting device, and a display.

Priority is claimed on Japanese Patent Application No. 2017-123641, filed on Jun. 23, 2017, the content of which is incorporated herein by reference.

BACKGROUND ART

In recent years, there has been an increasing interest in semiconductor fine particles having a high quantum yield as a luminescent material. On the other hand, the luminescent materials are required to have stability. As a composition containing semiconductor fine particles, for example, a composition containing semiconductor fine particles coated with aminopropyltriethoxysilane or tetramethoxysilane has been reported (Non-Patent Document 1 and Non-Patent Document 2).

CITATION LIST

Patent Literature

[Non-Patent Document 1] Advanced Materials 2016, 28, p. 10088-10094
[Non-Patent Document 2] S. Huang, Z. Li, L. Kong, N. Zhu, A. Shan, L. Li, J. Am. Chem. Soc., 138, 5749-5752 (2016)

DISCLOSURE OF INVENTION

Technical Problem

However, the compositions containing the semiconductor fine particles as described in Non-Patent Document 1 and Non-Patent Document 2 do not necessarily have sufficient durability with respect to water vapor.

The present invention has been made in view of the above circumstances, and the purpose of the present invention is to provide a composition having a high durability with respect to water vapor, as well as a film, a laminated structure, a light-emitting device and a display, each utilizing such a composition.

Solution to Problem

In order to solve the above problems, one embodiment of the present invention provides a light-emitting composition including:
component (1): semiconductor fine particles; and
component (2): a compound represented by Formula (X) or a modified product thereof,
wherein:
Y is a direct bond, an oxygen atom, or a sulfur atom, with the proviso that, when Y is an oxygen atom,
$R^{16}$ is an alkyl group having 3 to 20 carbon atoms, a cycloalkyl group having 3 to 30 carbon atoms, or an unsaturated hydrocarbon group having 2 to 20 carbon atoms, and $R^{17}$ is an alkyl group, a cycloalkyl group, an unsaturated hydrocarbon group or a hydrogen atom, with the proviso that R17 has a smaller number of carbon atoms than $R^{16}$, and
when Y is a direct bond or a sulfur atom,
$R^{16}$ is an alkyl group having 1 to 20 carbon atoms, a cycloalkyl group having 3 to 30 carbon atoms, or an unsaturated hydrocarbon group having 2 to 20 carbon atoms,
$R^{17}$ is an alkyl group having 1 to 20 carbon atoms, a cycloalkyl group having 3 to 30 carbon atoms, an unsaturated hydrocarbon group having 2 to 20 carbon atoms, or a hydrogen atom,
hydrogen atoms in the alkyl group, the cycloalkyl group and the unsaturated hydrocarbon group as $R^{16}$ or $R^{17}$ are each independently substituted by or not substituted by a halogen atom, and
hydrogen atoms in the cycloalkyl group as $R^{16}$ or $R^{17}$ are each independently substituted by or not substituted by an alkyl group; and
a is an integer of 1 to 3, with the proviso that,
when a is 2 or 3, a plurality of Y may be the same or different,
when a is 2 or 3, a plurality of R16 may be the same or different, and
when a is 1 or 2, a plurality of R17 may be the same or different.

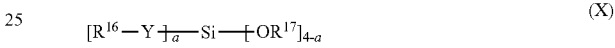
(X)

In one embodiment of the present invention, the composition may further include at least one component selected from the group consisting of:
component (3): a solvent; and
component (4): a polymerizable compound or a polymer.

In one embodiment of the present invention, the composition may further include:
component (4'): a polymer,
wherein a total content ratio of the component (1), the component (2), and the component (4') is 90% by mass or greater with respect to the total mass of the composition.

In one embodiment of the present invention, the composition may further include:
component (5): at least one compound or ion selected from group consisting of ammonia, amines, and carboxylic acids, and salts or ions thereof.

In one embodiment of the present invention, the component (1) may be a perovskite compound including constituent components A, B, and X,
wherein the constituent component A indicates a component positioned at each vertex of a hexahedron having the constituent component B at its center in a perovskite type crystal structure and is a monovalent cation,
the constituent component X indicates a component positioned at each vertex of an octahedron having the constituent component B at the center in the perovskite type crystal structure and is one or more kinds of anions selected from the group consisting of a halide ion and a thiocyanate ion, and
the constituent component B indicates a component positioned at a center of a hexahedron where the constituent component A is disposed at each vertex and at a center of an octahedron where the constituent component X is disposed at each vertex in the perovskite type crystal structure and is a metal ion.

In one embodiment of the present invention, a film including the composition as a fabrication material is provided.

In one embodiment of the present invention, a laminated structure including the film is provided.

In one embodiment of the present invention, a light-emitting device including the laminated structure is provided.

In one embodiment of the present invention, a display including the laminated structure is provided.

That is, the embodiments of the present invention are as follows.

[1] A light-emitting composition including:
component (1): semiconductor fine particles; and
component (2): a compound represented by Formula (X) or a modified product thereof,
wherein:
Y is a direct bond, an oxygen atom, or a sulfur atom,
with the proviso that, when Y is an oxygen atom,
$R^{16}$ is an alkyl group having 3 to 20 carbon atoms, a cycloalkyl group having 3 to carbon atoms, or an unsaturated hydrocarbon group having 2 to 20 carbon atoms, and
$R^{17}$ is an alkyl group, a cycloalkyl group, an unsaturated hydrocarbon group, or a hydrogen atom, with the proviso that $R^{17}$ has a smaller number of carbon atoms than $R^{16}$, and
when Y is a direct bond or a sulfur atom,
$R^{16}$ is an alkyl group having 1 to 20 carbon atoms, a cycloalkyl group having 3 to carbon atoms, or an unsaturated hydrocarbon group having 2 to 20 carbon atoms,
$R^{17}$ is an alkyl group having 1 to 20 carbon atoms, a cycloalkyl group having 3 to carbon atoms, an unsaturated hydrocarbon group having 2 to 20 carbon atoms, or a hydrogen atom,
hydrogen atoms in the alkyl group, the cycloalkyl group and the unsaturated hydrocarbon group as $R^{16}$ or $R^{17}$ are each independently substituted by or not substituted by a halogen atom, and
hydrogen atoms in the cycloalkyl group as $R^{16}$ or $R^{17}$ are each independently substituted by or not substituted by an alkyl group; and
a is an integer of 1 to 3, with the proviso that,
when a is 2 or 3, a plurality of Y may be the same or different,
when a is 2 or 3, a plurality of $R^{16}$ may be the same or different, and
when a is 1 or 2, a plurality of $R^{17}$ may be the same or different.

[2] The composition according to [1], which further includes at least one component selected from the group consisting of:
component (3): a solvent; and
component (4): a polymerizable compound or a polymer.

[3] The composition according to [1], which further includes:
component (4'): a polymer,
wherein a total content ratio of the component (1), the component (2), and the component (4') is 90% by mass or greater with respect to the total mass of the composition.

[4] The composition according to any one of [1] to [3], which further includes:
component (5): at least one component selected from the group consisting of ammonia, amines, carboxylic acids, and salts or ions thereof.

[5] The composition according to any one of [1] to [4], wherein the component (1) is a perovskite compound including constituent components A, B, and X,
wherein the constituent component A indicates a component positioned at each vertex of a hexahedron having the constituent component B at its center in a perovskite type crystal structure and is a monovalent cation,
the constituent component X indicates a component positioned at each vertex of an octahedron having the constituent component B at its center in the perovskite type crystal structure and is one or more kinds of anions selected from the group consisting of a halide ion and a thiocyanate ion, and
the constituent component B indicates a component positioned at a center of a hexahedron where the constituent component A is disposed at each vertex and at a center of an octahedron where the constituent component X is disposed at each vertex in the perovskite type crystal structure and is a metal ion.

[6] A film including the composition according to any one of [1] to [5] as a fabrication material.

[7] A laminated structure including the film according to [6].

[8] A light-emitting device including the laminated structure according to [7].

[9] A display including the laminated structure according to [7].

Advantageous Effects of Invention

The present invention can provide a composition having a high durability with respect to water vapor, as well as a film, a laminated structure, a light-emitting device and a display, each utilizing such a composition.

DESCRIPTION OF THE EMBODIMENTS

<Composition>

Figure 1:
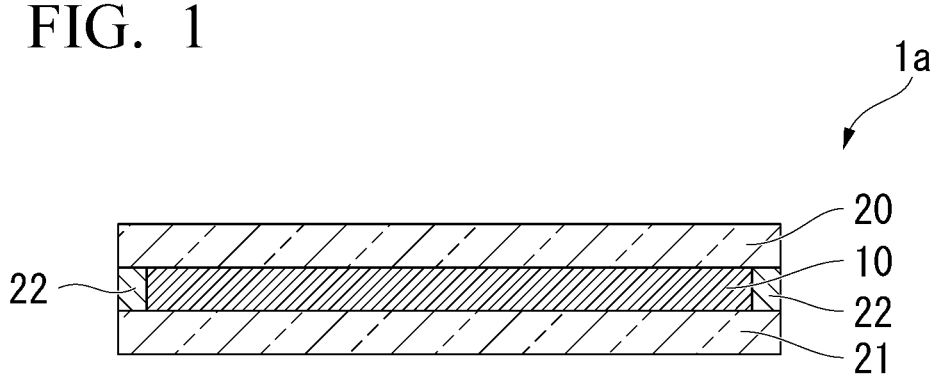
FIG. 1 is a cross-sectional view showing an embodiment of a laminated structure according to the present invention.

A composition according to the present embodiment has a light-emitting property. The "light-emitting property" of the composition indicates a property of the composition to emit light. The composition preferably has a property of emitting light by absorbing excitation energy, and more preferably has a property of emitting light by excitation light. The wavelength of excitation light may be, for example, in a range of 200 nm to 800 nm, in a range of 250 nm to 750 nm, or in a range of 300 nm to 700 nm.

The composition according to the present embodiment includes:
component (1): semiconductor fine particles, which may be hereinafter referred to simply as "component (1)"; and
component (2): a compound represented by Formula (X), which may be hereinafter referred to simply as "component (2)",
wherein:
Y is a direct bond, an oxygen atom, or a sulfur atom,
with the proviso that, when Y is an oxygen atom, $R^{16}$ is an alkyl group having 1 to 20 carbon atoms, a cycloalkyl group having 3 to 30 carbon atoms, or an unsaturated hydrocarbon group having 2 to 20 carbon atoms,
wherein a number of carbon atoms of each of the alkyl group, the cycloalkyl group, and the unsaturated hydrocarbon group as $R^{16}$ is smaller than that of each of the alkyl group, the cycloalkyl group, and the unsaturated hydrocarbon group as $R^{17}$, and
when Y is a direct bond or a sulfur atom, $R^{16}$ is an alkyl group having 1 to 20 carbon atoms, a cycloalkyl group having 3 to 30 carbon atoms, or an unsaturated hydrocarbon group having 2 to 20 carbon atoms, $R^{17}$ is an alkyl group having 1 to 20 carbon atoms, a cycloalkyl group having 3 to carbon atoms, an unsaturated hydrocarbon group having 2 to 20 carbon atoms, or a hydrogen atom, hydrogen atoms in the alkyl group, the cycloalkyl group and the unsaturated hydrocarbon group as $R^{16}$ or $R^{17}$ are each independently substituted by or not substituted by a halogen atom, and hydrogen atoms in the cycloalkyl group as $R^{16}$ or $R^{17}$ are each independently substituted by or not substituted by an alkyl group; and a is an integer of 1 to 3, with the proviso that, when a is 2 or 3, a plurality of Y may be the same or different, when a is 2 or 3, a plurality of $R^{16}$ may be the same or different, and when a is 1 or 2, a plurality of $R^{17}$ may be the same or different.

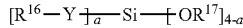 (X)

The composition of the present embodiment is presumed to have a protected region formed in the vicinity of the component (1) due to the presence of the component (2) in the composition. This presumably enables the suppression of deterioration of the component (1) in a wet heat environment, and the production of a composition having a high durability with respect to water vapor.

The composition according to the present embodiment may further include at least one component selected from the group consisting of the following components (3) and (4). Hereinafter, this composition may be referred to as "composition (1)".

Component (3): a solvent, which may be hereinafter referred to simply as "component (3)".

Component (4): a polymerizable compound or a polymer, which may be hereinafter referred to simply as "component (4)".

In the composition according to the present embodiment, it is preferable that the component (1) is dispersed in at least one component selected from the group consisting of the component (3) and the component (4).

The composition according to the present embodiment may further include the following component (5).

Component (5): at least one compound or ion selected from group consisting of ammonia, amines, and carboxylic acids, and salts or ions thereof, which may be hereinafter referred to simply as "component (5)".

The composition according to the present embodiment may further include components other than the above-described components (1) to (5).

Examples of other components include a small amount of impurities, a compound having an amorphous structure formed of elements constituting the component (1), a polymerization initiator, a nonionic organic compound, and a silicon atom-containing compound not encompassed by the component (2).

The amount of other components is preferably 10% by mass or less, more preferably 5% by mass or less, and still more preferably 1% by mass or less with respect to the total mass of the composition.

The composition according to the present embodiment may further includes:

component (4'): a polymer, wherein a total content ratio of the component (1), the component (2), and the component (4') may be 90% by mass or greater with respect to the total mass of the composition. Hereinafter, this composition may be referred to as "composition (2)".

Hereinafter, among species of the component (4), only the polymer may be referred to as "component (4')".

In the composition according to the present embodiment, it is preferable that the component (1) is dispersed in the component (4').

In the composition (2) according to the present embodiment, the total amount of the component (1), the component (2), and the component (4') may be 95% by mass or greater, 99% by mass or greater, or 100% by mass with respect to the total mass of the composition.

The composition according to the present embodiment may further include the component (5). The composition may include other components than the component (1), the component (2), the component (4'), and the component (5), the examples of which may be the same as those exemplified above as the other components.

In the composition (1) according to the present embodiment, the content ratio of the component (1) with respect to the total mass of the composition (1) is not particularly limited as long as the effects of the present invention can be achieved.

In the composition (1) according to the present embodiment, from the viewpoints of making the component (1) difficult to be condensed and preventing the concentration quenching, the amount of the component (1) is preferably 50% by mass or less, more preferably 2% by mass or less, still more preferably 1% by mass or less, and particularly preferably 0.5% by mass or less with respect to the total mass of the composition (1).

In the composition (1) according to the present embodiment, from the viewpoint of obtaining an excellent quantum yield, the amount of the compound (1) with respect to the total mass of the composition (1) is preferably 0.0001% by mass or greater, more preferably 0.0005% by mass or greater, and still more preferably 0.001% by mass or greater.

The above-described upper limit values and lower limit values can be arbitrarily combined.

In the composition (1) according to the present embodiment, the content ratio of the component (1) with respect to the total mass of the composition (1) is preferably 0.0001% by mass or more and 50% by mass or less.

In the composition (1) according to the present embodiment, the amount of the component (1) is preferably 0.0001% by mass or greater and 2% by mass or less, more preferably 0.0005% by mass or greater and 1% by mass or less, and still more preferably 0.001% by mass or greater and 0.5% by mass or less, with respect to the total mass of the composition (1).

From the viewpoints of making the component (1) difficult to aggregate and exhibiting an excellent light-emitting property, the composition (1) according to the present embodiment is preferably a composition in which the amount of the component (1) with respect to the total mass of the composition is in the above-described range.

In the composition (1) according to the present embodiment, the content ratio of the component (2) with respect to the total mass of the composition (1) is not particularly limited as long as the effects of the present invention can be achieved.

In the composition (1) according to the present embodiment, from the viewpoint of improving durability of the component (1), the amount of the component (2) is preferably 50% by mass or less, more preferably 20% by mass or less, still more preferably 10% by mass or less, and particularly preferably 8% by mass or less with respect to the total mass of the composition (1).

In the composition (1) according to the present embodiment, from the viewpoint of improving the durability of the component (1), the amount of the component (2) with respect to the total mass of the composition (1) is preferably 0.001% by mass or greater, more preferably 0.01% by mass or greater, and still more preferably 0.1% by mass or greater.

The above-described upper limit values and lower limit values can be arbitrarily combined.

In the composition (1) according to the present embodiment, the content ratio of the component (2) with respect to the total mass of the composition (1) is preferably 0.001% by mass or more and 50% by mass or less.

In the composition (1) according to the present embodiment, the amount of the component (2) is preferably 0.01% by mass or greater and 20% by mass or less, more preferably 0.02% by mass or greater and 10% by mass or less, and still more preferably 0.1% by mass or greater and 8% by mass or less, with respect to the total mass of the composition (1).

From the viewpoint of improving durability, the composition (1) according to the present embodiment is preferably a composition in which the amount of the component (2) with respect to the total mass of the composition (1) is in the above-described range.

In the composition (1) according to the present embodiment, the total content ratio of the component (1) and the component (2) with respect to the total mass of the composition (1) is not particularly limited as long as the effects of the present invention can be achieved.

In the composition (1) according to the present embodiment, from the viewpoints of making the component (1) difficult to be condensed and preventing the concentration quenching, the total content ratio of the component (1) and the component (2) is preferably 60% by mass or less, more preferably 30% by mass or less, still more preferably 20% by mass or less, and particularly preferably 10% by mass or less with respect to the total mass of the composition (1).

In the composition (1) according to the present embodiment, from the viewpoint of obtaining an excellent quantum yield, the total content ratio of the component (1) and the component (2) with respect to the total mass of the composition (1) is preferably 0.0002% by mass or greater, more preferably 0.002% by mass or greater, and still more preferably 0.005% by mass or greater.

The above-described upper limit values and lower limit values can be arbitrarily combined.

In the composition (1) according to the present embodiment, the total content ratio of the component (1) and the component (2) with respect to the total mass of the composition (1) is preferably 0.0002% by mass or greater and 60% by mass or less.

In the composition (1) according to the present embodiment, the total content ratio of the component (1) and the component (2) is preferably 0.001% by mass or greater and 30% by mass or less, more preferably 0.002% by mass or greater and 20% by mass or less, and still more preferably 0.005% by mass or greater and 10% by mass or less, with respect to the total mass of the composition (1).

From the viewpoints of making the component (1) difficult to aggregate and exhibiting an excellent light-emitting property, the composition (1) according to the present embodiment is preferably a composition in which the total content ratio of the component (1) and the component (2) with respect to the total mass of the composition (1) is in the above-described range.

In the composition (2) according to the present embodiment, the content ratio of the component (1) with respect to the total mass of the composition (2) is not particularly limited as long as the effects of the present invention can be achieved.

In the composition (2) according to the present embodiment, from the viewpoints of making the component (1) difficult to be condensed and preventing the concentration quenching, the amount of the component (1) is preferably 50% by mass or less, more preferably 1% by mass or less, and still preferably 0.5% by mass or less with respect to the total mass of the composition (2).

In the composition (2) according to the present embodiment, from the viewpoint of obtaining an excellent emission intensity, the amount of the component (1) with respect to the total mass of the composition (2) is preferably 0.0001% by mass or greater, more preferably 0.0005% by mass or greater, and still more preferably 0.001% by mass or greater.

The above-described upper limit values and lower limit values can be arbitrarily combined.

In the composition (2) according to the present embodiment, the content ratio of the component (1) with respect to the total mass of the composition (2) is preferably 0.0001% by mass or greater and 50% by mass or less.

In the composition (2) according to the present embodiment, the amount of the component (1) is preferably 0.0001% by mass or greater and 1% by mass or less, more preferably 0.0005% by mass or greater and 1% by mass or less, and still more preferably 0.001% by mass or greater and 0.5% by mass or less, with respect to the total mass of the composition (2).

From the viewpoint of exhibiting an excellent light-emitting property, the composition (2) according to the present embodiment is preferably a composition in which the amount of the component (1) with respect to the total mass of the composition is in the above-described range.

In the composition (2) according to the present embodiment, the content ratio of the component (2) with respect to the total mass of the composition (2) is not particularly limited as long as the effects of the present invention can be achieved.

In the composition (2) according to the present embodiment, from the viewpoint of improving durability, the amount of the component (2) is preferably 50% by mass or less, more preferably 20% by mass or less, still more preferably 10% by mass or less, and particularly preferably 8% by mass or less with respect to the total mass of the composition (2).

In the composition (2) according to the present embodiment, from the viewpoint of improving durability, the amount of the component (2) with respect to the total mass of the composition (2) is preferably 0.001% by mass or greater, more preferably 0.01% by mass or greater, and still more preferably 0.1% by mass or greater.

The above-described upper limit values and lower limit values can be arbitrarily combined.

In the composition (2) according to the present embodiment, the content ratio of the component (2) with respect to the total mass of the composition (2) is preferably 0.001% by mass or more and 50% by mass or less.

In the composition (2) according to the present embodiment, the amount of the component (2) is preferably 0.01% by mass or greater and 20% by mass or less, more preferably 0.02% by mass or greater and 10% by mass or less, and still more preferably 0.1% by mass or greater and 8% by mass or less, with respect to the total mass of the composition (2).

From the viewpoint of improving durability, the composition (2) according to the present embodiment is preferably a composition in which the amount of the component (2) with respect to the total mass of the composition (2) is in the above-described range.

In the composition (2) according to the present embodiment, the total content ratio of the component (1) and the component (2) with respect to the total mass of the composition (2) is not particularly limited as long as the effects of the present invention can be achieved.

In the composition (2) according to the present embodiment, from the viewpoints of making the component (1) difficult to be condensed and preventing the concentration quenching, the total content ratio of the component (1) and the component (2) is preferably 60% by mass or less, more preferably 40% by mass or less, still more preferably 30% by mass or less, and particularly preferably 20% by mass or less, with respect to the total mass of the composition (2).

In the composition (2) according to the present embodiment, from the viewpoint of obtaining an excellent quantum yield, the total content ratio of the component (1) and the component (2) is preferably 0.0002% by mass or greater, more preferably 0.001% by mass or greater, still more preferably 0.002% by mass or greater, and particularly preferably 0.005% by mass or greater, with respect to the total mass of the composition (2).

The above-described upper limit values and lower limit values can be arbitrarily combined.

In the composition (2) according to the present embodiment, the total content ratio of the component (1) and the component (2) with respect to the total mass of the composition (2) is preferably 0.0002% by mass or more and 60% by mass or less.

In the composition (2) according to the present embodiment, the total content ratio of the component (1) and the component (2) is preferably 0.001% by mass or greater and 40% by mass or less, more preferably 0.002% by mass or greater and 30% by mass or less, and still more preferably 0.005% by mass or greater and 20% by mass or less, with respect to the total mass of the composition (2).

From the viewpoint of exhibiting an excellent light-emitting property, the composition (2) according to the present embodiment is preferably a composition in which the total content ratio of the component (1) and the component (2) with respect to the total mass of the composition is in the above-described range.

Hereinbelow, explanations are made with respect to the composition of the present invention referring to the embodiments thereof.

[Component (1)]

The composition according to the present embodiment (the composition (1) and the composition (2)) includes the component (1), and the component (1) is preferably dispersed. Examples of the dispersion medium for dispersing the component (1) include the component (3), the component (4), and the component (4').

As the component (1), a semiconductor fine particle which contains a compound having a cadmium (Group 12) element, a semiconductor fine particle which contains a compound having an indium (Group 13) element, or a semiconductor fine particle which contains a perovskite compound is preferable from the viewpoint of obtaining an excellent quantum yield. As the component (1), a semiconductor fine particle which contains a compound having an indium (Group 13) element or a semiconductor fine particle which contains a perovskite compound is more preferable. As the component (1), a semiconductor fine particle having a perovskite compound is still more preferable from the viewpoint of easily obtaining an emission peak with a narrow half value width without a need to strictly control the particle diameter.

When the component (1) is a semiconductor fine particle containing a compound containing a cadmium (Group 12) element, the amount of the compound containing the cadmium (Group 12) element with respect to the total mass of the semiconductor fine particle is preferably 1% by mass or greater and 100% by mass or less, more preferably 5% by mass or greater and 90% by mass or less, and still more preferably 10% by mass or more and 80% by mass or less.

When the component (1) is a semiconductor fine particle containing a compound containing an indium (Group 13) element, the amount of the compound containing the indium (Group 13) element with respect to the total mass of the semiconductor fine particle is preferably 1% by mass or greater and 100% by mass or less, more preferably 5% by mass or greater and 90% by mass or less, and still more preferably 10% by mass or more and 80% by mass or less.

Examples of the compound containing a cadmium element include II-V group compounds and II-VI group compounds, which are described below.

From the viewpoint of obtaining sufficient emission intensity, as the compound containing a cadmium element, CdS, CdSe, ZnCdS, CdSeS, CdSeTe, CdSTe, CdZnS, CdZnSe, CdZnTe, ZnCdSSe, CdZnSeS, CdZnSeTe, or CdZnSTe is preferable. More preferable examples of the compound containing a cadmium element include CdS, CdSe, ZnCdS, CdSeS, CdZnS, CdZnSe, ZnCdSSe and CdZnSeS. Still more preferable examples of the compound containing a cadmium element include CdS, CdSe, ZnCdS, ZnCdSSe, and CdZnSeS, among which CdSe and CdZnSeS are particularly preferable.

Examples of the compound containing indium element include III-V group compounds, III-VI group indium compounds, and I-III-VI group compounds, which are described below.

As the compound containing an indium element, III-V group indium compounds are preferable, and indium compounds containing a phosphorus element as the V group element are preferable.

From the viewpoint of obtaining a sufficient emission intensity, InP, CuInS$_2$, InNP, or GaInNP is preferable, and InP or CuInS$_2$ is more preferable as the compound containing an indium element.

When the component (1) is a semiconductor fine particle containing a compound containing a cadmium element, the average particle diameter of the component (1) is preferably 1.0 nm or greater, more preferably 1.1 nm or greater, and more preferably 1.2 nm or greater.

When the component (1) is a semiconductor fine particle containing a compound containing a cadmium element, the average particle diameter of the component (1) is preferably 100 nm or less, more preferably 10 nm or less, and more preferably 8 nm or less.

The above-described upper limit values and lower limit values can be arbitrarily combined.

According to another aspect of the present invention, when the component (1) is a semiconductor fine particle containing a compound containing a cadmium element, the average particle diameter of the component (1) is preferably 1.0 nm or greater and 100 nm or less, more preferably 1.1 nm or greater and 10 nm or less, and more preferably 1.2 nm or greater and 8 nm or less.

When the component (1) is a semiconductor fine particle containing a compound containing an indium element, the average particle diameter of the component (1) is preferably 0.8 nm or greater, more preferably 1.0 nm or greater, and more preferably 1.1 nm or greater.

When the component (1) is a semiconductor fine particle containing a compound containing an indium element, the average particle diameter of the component (1) is preferably 30 nm or less, more preferably 10 nm or less, and more preferably 4 nm or less.

The above-described upper limit values and lower limit values can be arbitrarily combined.

According to another aspect of the present invention, when the component (1) is a semiconductor fine particle containing a compound containing an indium element, the average particle diameter of the component (1) is preferably 0.8 nm or greater and 30 nm or less, more preferably 1.0 nm or greater and 10 nm or less, and more preferably 1.1 nm or greater and 4 nm or less.

In the present specification, when the component (1) is a semiconductor fine particle containing a compound containing a cadmium element or an indium element, the average particle diameter of the component (1) contained in the composition can be measured using, for example, a transmission electron microscope (hereinafter, also referred to as a TEM) and a scanning electron microscope (hereinafter, also referred to as a SEM). Specifically, the average particle diameter can be acquired by observing the maximum Feret diameter of twenty units of component (1) contained in the composition using a TEM or a SEM and calculating the average maximum Feret diameter which is an average value of the obtained values. The "maximum Feret diameter" in the present specification indicates the maximum distance between two straight lines parallel to each other which interpose the component (1) therebetween on a TEM or SEM image.

The semiconductor fine particle containing a compound containing a cadmium element or the semiconductor fine particle containing a compound containing an indium element may have an inorganic protective layer on the surface of each particle in order to improve the emission intensity or the durability.

The inorganic protective layer may be formed of two or more layers or one layer.

The inorganic material which can form the inorganic protective layer is not particularly limited, and examples thereof include a semiconductor having a larger band gap than that of the semiconductor fine particle containing a compound containing a cadmium element or the semiconductor fine particle containing a compound containing an indium element.

For example, the inorganic protective layer on the surface of each particle is formed of a known inorganic material such as ZnS.

Explanations are made below with respect to the following component (1-1) and the following component (1-2) as the embodiments of the component (1). In addition, the component (1) is not limited to the following semiconductor fine particles.

Component (1-1): semiconductor fine particle containing Group II-V compound, semiconductor fine particle containing Group II-VI compound, semiconductor fine particle containing Group III-IV compound, semiconductor fine particle containing Group III-V compound, semiconductor fine particle containing Group III-VI compound, semiconductor fine particle containing Group IV-VI compound, and semiconductor fine particle containing Group I-III-VI compound (1-1), which may be referred to simply as "component (1-1)".

Component (1-2): semiconductor fine particle containing a perovskite compound, which may be referred to simply as "component (1-2)".

[Component (1-1)]

A Group II-V compound indicates a compound containing a Group II element and a Group V element.

A Group II-VI compound indicates a compound containing a Group II element and a Group VI element.

A Group III-IV compound indicates a compound containing a Group III element and a Group IV element.

A Group III-V compound indicates a compound containing a Group III element and a Group V element.

A Group III-VI compound indicates a compound containing a Group III element and a Group VI element.

A Group IV-VI compound indicates a compound containing a Group IV element and a Group VI element.

A Group I-III-VI compound indicates a compound containing a Group I element, a Group III element, and a Group VI element.

Here, the Group I indicates a Group 11 of the periodic table. The Group II indicates a Group 2 or 12 of the periodic table. The Group III indicates a Group 13 of the periodic table. The Group IV indicates a Group 14 of the periodic table. The Group V indicates a Group 15 of the periodic table. The Group VI indicates a Group 16 of the periodic table. The same applies hereafter.

In the present specification, the "periodic table" indicates the long-period type periodic table.

Each of these compounds may be binary, ternary, or quaternary.

(Semiconductor Fine Particle Containing Group II-V Compound)

Examples of the binary Group II-V compound include $Zn_3P_2$, $Zn_3As_2$, $Cd_3P_2$, $Cd_3As_2$, $Cd_3N_2$, and $Zn_3N_2$.

The ternary Group II-V compound may be a ternary Group II-V compound containing one element (first element) selected from the Group 2 and Group 12 elements in the periodic table and two elements (second elements) selected from the Group 15 elements in the periodic table. The ternary Group II-V compound may be a ternary Group II-V compound containing two elements (first elements) selected from the Group 2 and Group 12 elements in the periodic table and one element (second element) selected from the Group 15 elements in the periodic table.

Examples of the ternary Group II-V compound include $Cd_3PN$, $Cd_3PAs$, $Cd_3AsN$, $Cd_2ZnP_2$, $Cd_2ZnAs_2$, and $Cd_2ZnN_2$.

The quaternary Group II-V compound may be a quaternary Group II-V compound containing two elements (first elements) selected from the Group 2 and Group 12 elements in the periodic table and two elements (second elements) selected from the Group 15 elements in the periodic table.

Examples of the quaternary Group II-V compound include $CdZnPN$, $CdZnPAs$, and $Cd_2ZnAsN$.

The semiconductor fine particle containing a Group II-V compound may contain an element other than the Group 2 elements or the Group 12 elements and the Group 15 elements in the periodic table as a doping element.

(Semiconductor Fine Particle Containing Group II-VI Compound)

Examples of the binary Group II-VI compound containing a Group 12 element in the periodic table include CdS, CdSe, CdTe, ZnS, ZnSe, ZnTe, HgS, HgSe, and HgTe.

Examples of the binary Group II-VI compound containing a Group 2 element in the periodic table include MgS, MgSe, MgTe, CaS, CaSe, CaTe, SrS, SrSe, SrTe, BaS, BaSe, and BaTe.

The ternary Group II-VI compound may be a ternary Group II-VI compound containing two elements (first elements) selected from the Group 2 and Group 12 elements in the periodic table and two elements (second elements) selected from the Group 16 elements in the periodic table.

The ternary Group II-VI compound may be a ternary Group II-VI compound containing two elements (first elements) selected from the Group 2 and Group 12 elements in the periodic table and two elements (second elements) selected from the Group 16 elements in the periodic table.

Examples of the ternary Group II-VI compound include CdSeS, CdSeTe, CdSTe, CdZnS, CdZnSe, CdZnTe, CdHgS, CdHgSe, and CdHgTe.

The quaternary Group II-VI compound may be a quaternary Group II-VI compound containing two elements (first elements) selected from the Group 2 and Group 12 elements in the periodic table and two elements (second elements) selected from the Group 16 elements in the periodic table.

Examples of the quaternary Group II-VI compound include CdZnSeS, CdZnSeTe, CdZnSTe, CdHgSeS, CdHgSeTe, and CdHgSTe.

The semiconductor fine particle containing a Group II-VI compound may contain an element other than the Group 2 elements, the Group 12 elements, and the Group 16 elements in the periodic table as a doping element.

(Semiconductor Fine Particle Containing Group III-IV Compound)

Examples of the binary Group III-IV compound include $B_4C_3$, $Al_4C_3$, and $Ga_4C_3$.

The ternary Group III-IV compound may be a ternary Group III-IV compound containing one element (first element) selected from the Group 13 elements in the periodic table and two elements (second elements) selected from the Group 14 elements in the periodic table.

The ternary Group III-IV compound may be a ternary Group III-IV compound containing two elements (first elements) selected from the Group 13 elements in the periodic table and one element (second elements) selected from the Group 14 elements in the periodic table.

The quaternary Group III-IV compound may be a quaternary Group III-IV compound containing two elements (first elements) selected from the Group 13 elements in the periodic table and two elements (second elements) selected from the Group 14 elements in the periodic table.

The semiconductor fine particle containing a Group III-IV compound may contain an element other than the Group 13 elements and the Group 14 elements in the periodic table as a doping element.

(Semiconductor Fine Particle Containing Group III-V Compound)

Examples of the binary Group III-V compound include BP, AlP, AlAs, AlSb, GaN, GaP, GaAs, GaSb, InN, InP, InAs, InSb, AlN, and BN.

The ternary Group III-V compound may be a ternary Group III-V compound containing one element (first element) selected from the Group 13 elements in the periodic table and two elements (second elements) selected from the Group 15 elements in the periodic table. The ternary Group III-V compound may be a ternary Group III-V compound containing two element (first elements) selected from the Group 13 elements in the periodic table and one element (second element) selected from the Group 15 elements in the periodic table.

Examples of the ternary Group III-V compound include InPN, InP As, InPSb, and InGaP.

The quaternary Group III-V compound may be a quaternary Group III-V compound containing two elements (first elements) selected from the Group 13 elements in the periodic table and two elements (second elements) selected from the Group 15 elements in the periodic table.

Examples of the quaternary Group III-V compound include InGaPN, InGaPAs, and InGaPSb.

The semiconductor fine particle containing a Group III-V compound may contain an element other than the Group 13 elements and the Group 15 elements in the periodic table.

(Semiconductor Fine Particle Containing Group III-VI Compound)

Examples of the binary Group III-VI compound include $Al_2S_3$, $Al_2Se_3$, $Al_2Te_3$, $Ga_2S_3$, $Ga_2Se_3$, $Ga_2Te_3$, GaTe, $In_2S_3$, $In_2Se_3$, $In_2Te_3$, and InTe.

The ternary Group III-VI compound may be a ternary Group III-VI compound containing one element (first element) selected from the Group 13 elements in the periodic table and two elements (second elements) selected from the Group 16 elements in the periodic table. The ternary Group III-VI compound may be a ternary Group III-VI compound containing two elements (first elements) selected from the Group 13 elements in the periodic table and one element (second element) selected from the Group 16 elements in the periodic table.

Examples of the ternary Group III-VI compound include $InGaS_3$, $InGaSe_3$, $InGaTe_3$, $In_2SSe_2$, and $In_2TeSe_2$.

The quaternary Group III-VI compound may be a quaternary Group III-VI compound containing two elements (first elements) selected from the Group 13 elements in the periodic table and two elements (second elements) selected from the Group 16 elements in the periodic table.

Examples of the quaternary Group III-VI compound include $InGaSSe_2$, $InGaSeTe_2$, and $InGaSTe_2$.

The semiconductor fine particle containing a Group III-VI compound may contain an element other than the Group 13 elements and the Group 16 elements in the periodic table as a doping element.

(Semiconductor Fine Particle Containing Group IV-VI Compound)

Examples of the binary Group IV-VI compound include PbS, PbSe, PbTe, SnS, SnSe, and SnTe.

The ternary Group IV-VI compound may be a ternary Group IV-VI compound containing one element (first element) selected from the Group 14 elements in the periodic table and two elements (second elements) selected from the Group 16 elements in the periodic table.

The ternary Group IV-VI compound may be a ternary Group IV-VI compound containing two elements (first elements) selected from the Group 14 elements in the periodic table and one element (second element) selected from the Group 16 elements in the periodic table.

The quaternary Group III-VI compound may be a quaternary Group III-VI compound containing two elements (first elements) selected from the Group 14 elements in the periodic table and two elements (second elements) selected from the Group 16 elements in the periodic table.

The semiconductor fine particle containing a Group IV-VI compound may contain an element other than the Group 14 elements and the Group 16 elements in the periodic table as a doping element.

(Semiconductor Fine Particle Containing Group I-III-VI Compound)

Examples of the ternary Group I-III-VI compound include $CuInS_2$.

The semiconductor fine particle containing a Group I-III-VI compound may contain an element other than the Group 11 elements, the Group 13 elements, and the Group 16 elements in the periodic table as a doping element.

[Component (1-2)]

The component (1-2) is a compound which includes constituent components A, B, and X and has a perovskite type crystal structure.

The constituent component A indicates a component positioned at each vertex of a hexahedron having the constituent component B at the center in a perovskite type crystal structure and is a monovalent cation.

The constituent component X indicates a component positioned at each vertex of an octahedron having the constituent component B at the center in the perovskite type crystal structure and is one or more kinds of anions selected from the group consisting of a halide ion and a thiocyanate ion.

The constituent component B indicates a component positioned at the centers of the hexahedron where the constituent component A is disposed at each vertex and the octahedron where the constituent component X is disposed at each vertex in the perovskite type crystal structure, and is a metal ion.

The perovskite compound having the constituent components A, B, and X is not particularly limited and may be a compound having any of a three-dimensional structure, a two-dimensional structure, and a quasi-two-dimensional structure.

In a case of the three-dimensional structure, the composition of the perovskite compound is represented by $ABX_{(3+\delta)}$.

In a case of the two-dimensional structure, the composition of the perovskite compound is represented by $A_2BX_{(4+\delta)}$.

Here, the parameter $\delta$ is a number which can be appropriately changed according to the charge balance of B and is in a range of −0.7 to 0.7.

As the perovskite compound, a perovskite compound represented by Formula (1) is preferable.

$$ABX_{(3+\delta)} \quad (-0.7 \leq \delta \leq 0.7) \qquad (1)$$

The constituent component A indicates a component positioned at each vertex of a hexahedron having the constituent component B at the center in a perovskite type crystal structure and is a monovalent cation.

The constituent component X indicates a component positioned at each vertex of an octahedron having the constituent component B at the center in the perovskite type crystal structure and is one or more kinds of anions selected from the group consisting of a halide ion and a thiocyanate ion.

The constituent component B indicates a component positioned at the centers of the hexahedron where the constituent component A is disposed at each vertex and the octahedron where the constituent component X is disposed at each vertex in the perovskite type crystal structure and is a metal ion.

[A]

In the perovskite compound, the constituent component A indicates a component positioned at each vertex of a hexahedron having the constituent component B at the center in a perovskite type crystal structure and is a monovalent cation.

Examples of the monovalent cation include a cesium ion, an organic ammonium ion, and an amidinium ion. In a case where the constituent component A is a cesium ion, an organic ammonium ion having 3 or less carbon atoms, or an amidinium ion having 3 or less carbon atoms in the perovskite compound, the perovskite compound typically has a three-dimensional structure represented by $ABX_{(3+\delta)}$.

In the perovskite compound, a cesium ion or an organic ammonium ion is preferable as the constituent component A.

Specific examples of the organic ammonium ion as the constituent component A include a cation represented by Formula (A3).

(A3)

In Formula (A3), $R^6$ to $R^9$ each independently represent a hydrogen atom, an alkyl group which may contain an amino group as a substituent, or a cycloalkyl group which may contain an amino group as a substituent. Here, not all of $R^6$ to $R^9$ simultaneously represent hydrogen atoms.

The alkyl group represented by each of independent $R^6$ to $R^9$ may be linear or branched and may have an amino group as a substituent.

In a case where $R^6$ to $R^9$ represent an alkyl group, the number of carbon atoms of each of independent $R^6$ to $R^9$ is typically in a range of 1 to 20, preferably in a range of 1 to 4, still more preferably in a range of 1 to 3, and even still more preferably 1.

The cycloalkyl group represented by each of independent $R^6$ to $R^9$ may contain an alkyl group or an amino group as a substituent.

The number of carbon atoms of the cycloalkyl group represented by each of independent $R^6$ to $R^9$ is typically in a range of 3 to 30, preferably in a range of 3 to 11, and more preferably in a range of 3 to 8. The number of carbon atoms include the number of carbon atoms in a substituent.

As the group represented by each of independent $R^6$ to $R^9$, a hydrogen atom or an alkyl group is preferable.

A compound having a perovskite type crystal structure of a three-dimensional structure with high emission intensity can be obtained by decreasing the number of alkyl groups and cycloalkyl groups which can be included in Formula (A3) and decreasing the number of carbon atoms in the alkyl group and the cycloalkyl group.

In a case where the number of carbon atoms in the alkyl group or the cycloalkyl group is 4 or more, a compound partially or entirely having a two-dimensional and/or quasi-two-dimensional (quasi-2D) perovskite type crystal structure can be obtained. In a case where two-dimensional perovskite type crystal structures are laminated at infinity, the resulting structure becomes equivalent to the three-dimensional perovskite type crystal structure (reference literature: P. P. Boix et al., J. Phys. Chem. Lett. 2015, 6, 898 to 907, etc.).

It is preferable that the total number of carbon atoms in the alkyl group represented by $R^6$ to $R^9$ is in a range of 1 to 4, and the total number of carbon atoms in the cycloalkyl group represented by $R^6$ to $R^9$ is in a range of 3 to 4. It is more preferable that one of $R^6$ to $R^9$ is an alkyl group having 1 to 3 carbon atoms, while three of $R^6$ to $R^9$ are hydrogen atoms.

Examples of the alkyl group as $R^6$ to $R^9$ include a methyl group, an ethyl group, an n-propyl group, an isopropyl group, an n-butyl group, an isobutyl group, a sec-butyl group, a tert-butyl group, an n-pentyl group, an isopentyl group, a neopentyl group, a tert-pentyl group, a 1-methylbutyl group, an n-hexyl group, a 2-methylpentyl group, a 3-methylpentyl group, a 2,2-dimethylbutyl group, a 2,3-dimethylbutyl group, an n-heptyl group, a 2-methylhexyl group, a 3-methylhexyl group, a 2,2-dimethylpentyl group, a 2,3-dimethylpentyl group, a 2,4-dimethylpentyl group, a 3,3-dimethylpentyl group, a 3-ethylpentyl group, a 2,2,3-trimethylbutyl group, an n-octyl group, an isooctyl group, a 2-ethylhexyl group, a nonyl group, a decyl group, an undecyl group, a dodecyl group, a tridecyl group, a tetradecyl group, a pentadecyl group, a hexadecyl group, a heptadecyl group, an octadecyl group, a nonadecyl group, and an icosyl group.

As the cycloalkyl group as $R^6$ to $R^9$, a group in which an alkyl group having 3 or more carbon atoms which has been exemplified as the alkyl group represented by each of independent $R^6$ to $R^9$ forms a ring is an exemplary example, and examples thereof include a cyclopropyl group, a cyclobutyl group, a cyclopentyl group, a cyclohexyl group, a cycloheptyl group, a cyclooctyl group, a cyclononyl group, a cyclodecyl group, a norbornyl group, an isobornyl group, a 1-adamantyl group, a 2-adamantyl group, and a tricyclodecyl group.

As the organic ammonium ion represented by A, $CH_3NH_3^+$ (also referred to as a methylammonium ion), $C_2H_5NH_3^+$ (also referred to as an ethylammonium ion), or $C_3H_7NH_3^+$ (also referred to as a propylammonium ion) is preferable, $CH_3NH_3^+$ or $C_2H_5NH_3^+$ is more preferable, and $CH_3NH_3^+$ is still more preferable.

As the amidinium ion represented by A, an amidinium ion represented by Formula (A4) is an exemplary example.

$$(R^{10}R^{11}N=CH-NR^{12}R^{13})^+ \quad (A4)$$

In Formula (A4), $R^{10}$ to $R^{13}$ each independently represent a hydrogen atom, an alkyl group which may contain an amino group as a substituent, or a cycloalkyl group which may contain an amino group as a substituent.

The alkyl group represented by each of independent $R^{10}$ to $R^{13}$ may be linear or branched and may have an amino group as a substituent.

The number of carbon atoms in the alkyl group represented by each of independent $R^{10}$ to $R^{13}$ is typically in a range of 1 to 20, preferably in a range of 1 to 4, and still more preferably in a range of 1 to 3.

The cycloalkyl group represented by each of independent $R^{10}$ to $R^{13}$ may contain an alkyl group or an amino group as a substituent.

The number of carbon atoms of the cycloalkyl group represented by each of independent $R^{10}$ to $R^{13}$ is typically in a range of 3 to 30, preferably in a range of 3 to 11, and more preferably in a range of 3 to 8. The number of carbon atoms include the number of carbon atoms in a substituent.

Specific examples of the alkyl group as $R^{10}$ to $R^{13}$ are the same as those provided as exemplary examples of the alkyl group represented by each of independent $R^6$ to $R^9$.

Specific examples of the cycloalkyl group as $R^{10}$ to $R^{13}$ are the same as those provided as exemplary examples of the cycloalkyl group represented by each of independent $R^6$ to $R^9$.

As the group represented by each of independent $R^{10}$ to $R^{13}$, a hydrogen atom or an alkyl group is preferable.

A perovskite compound having a three-dimensional structure with high emission intensity can be obtained by decreasing the number of alkyl groups and cycloalkyl groups which can be included in Formula (A4) and decreasing the number of carbon atoms in the alkyl group and the cycloalkyl group.

It is preferable that the total number of carbon atoms in the alkyl group represented by $R^{10}$ to $R^{13}$ is in a range of 1 to 4, and the total number of carbon atoms in the cycloalkyl group represented by $R^{10}$ to $R^{13}$ is in a range of 3 to 4. It is preferable that $R^{10}$ is an alkyl group having 1 to 3 carbon atoms, while $R^{11}$ to $R^{13}$ are hydrogen atoms.

[B]

In the perovskite compound, the constituent component B indicates a component positioned at the centers of the hexahedron where the constituent component A is disposed at each vertex and the octahedron where the constituent component X is disposed at each vertex in the perovskite type crystal structure and is a metal ion. The metal ion as the component B may be an ion of one or more kinds selected from the group consisting of a monovalent metal ion, a divalent metal ion, and a trivalent metal ion. It is preferable that the component B contains a divalent metal ion and more preferable that the component B contains one or more ions of metals selected from the group consisting of lead and tin.

[X]

The constituent component X may be one or more anions selected from the group consisting of a halide ion, and a thiocyanate ion. The constituent component X may be one or more anions selected from the group consisting of a chloride ion, a bromide ion, a fluoride ion, an iodide ion, and a thiocyanate ion.

The constituent component X can be appropriately selected according to a desired emission wavelength. For example, the constituent component X may contain a bromide ion.

In a case where the constituent component X is two or more kinds of halide ions, the amount of the halide ions can be appropriately selected according to the emission wavelength. For example, a combination of a bromide ion and a chloride ion or a combination of a bromide ion and an iodide ion can be employed.

[Crystal Structure of Perovskite Compound]

In the case where the perovskite compound has the three-dimensional structure, the structure has a three-dimensional network of a vertex-sharing octahedron which has B as the center and X as a vertex and is represented by $BX_6$.

When the perovskite compound has a two-dimensional structure, a structure in which a layer formed of two-dimensionally connected $BX_6$ and a layer formed of A are alternately laminated is formed in a case where the octahedron which has B as the center and X as a vertex and is represented by $BX_6$ shares Xs of four vertexes in the same plane.

B represents a metal cation which can have octahedral coordination of X.

In the present specification, the crystal structure of the perovskite compound can be confirmed by measuring an X-ray diffraction pattern using an X-ray diffractometer.

When the perovskite compound is a compound having the perovskite type crystal structure of the three-dimensional structure, typically, one or both of the following peaks in the X ray diffraction pattern are confirmed: a peak derived from (hkl)=(001) at a position where 2θ is in a range of 12° to 18° and a peak derived from (hkl)=(110) at a position where 2θ is in a range of 18° to 25°.

When the perovskite compound is a compound having the perovskite type crystal structure of the three-dimensional structure, it is more preferable that one or both of the following peaks are confirmed: a peak derived from (hkl)=(001) at a position where 2θ is in a range of 13° to 16° and a peak derived from (hkl)=(110) at a position where 2θ is in a range of 20° to 23°.

When the perovskite compound is a compound having the perovskite type crystal structure of the two-dimensional structure, typically, a peak derived from (hkl)=(002) is confirmed at a position where 2θ is in a range of 1° to 10°.

When the perovskite compound is a compound having the perovskite type crystal structure of the two-dimensional structure, it is more preferable that a peak derived from (hkl)=(002) is confirmed at a position where 2θ is in a range of 2° to 8°.

Specific preferred examples of the compound which is represented by $ABX_{(3+\delta)}$ and has the perovskite type crystal structure of the three-dimensional structure in the perovskite compound include $CH_3NH_3PbBr_3$, $CH_3NH_3PbCl_3$, $CH_3NH_3PbI_3$, $CH_3NH_3PbBr_{(3-y)}I_y(0<y<3)$, $CH_3NH_3PbBr_{(3-y)}Cl_y(0<y<3)$, $(H_2N=CH-NH_2)PbBr_3$, $(H_2N=CH-NH_2)PbCl_3$, $(H_2N=CH-NH_2)PbI_3$, $CH_3NH_3Pb_{(1-a)}Ca_aBr_3(0<a\le0.7)$, $CH_3NH_3Pb_{(1-a)}Sr_aBr_3(0<a\le0.7)$, $CH_3NH_3Pb_{(1-a)}La_aBr_{(3+\delta)}(0<a\le0.7, 0<\delta\le0.7)$, $CH_3NH_3Pb_{(1-a)}Ba_aBr_3(0<a\le0.7)$, $CH_3NH_3Pb_{(1-a)}Dy_aBr_{(3+\delta)}(0<a\le0.7, 0<\delta\le0.7)$, $CH_3NH_3Pb_{(1-a)}Na_aBr_{(3+\delta)}(0<a\le0.7, -0.7\le\delta<0)$, $CH_3NH_3Pb_{(1-a)}Li_aBr_{(3+\delta)}(0<a\le0.7, -0.7\le\delta<0)$, $CsPb_{(1-a)}Na_aBr_{(3+\delta)}(0<a\le0.7, -0.7\le\delta<0)$, $CsPb_{(1-a)}Li_aBr_{(3+\delta)}(0<a\le0.7, -0.7\le\delta<0)$, $CH_3NH_3Pb_{(1-a)}Na_aBr_{(3+\delta-y)}I_y(0<a\le0.7, -0.7\le\delta<0, 0<y<3)$, $CH_3NH_3Pb_{(1-a)}Li_aBr_{(3+\delta-y)}I_y(0<a\le0.7, -0.7\le\delta<0, 0<y<3)$, $CH_3NH_3Pb_{(1-a)}Na_aBr_{(3+\delta-y)}Cl_y(0<a\le0.7, -0.7\le\delta<0, 0<y<3)$, $CH_3NH_3Pb_{(1-a)}Li_aBr_{(3+\delta-y)}Cl_y(0<a\le0.7, -0.7\le\delta<0, 0<y<3)$, $(H_2N=CH-NH_2)Pb_{(1-a)}Na_aBr_{(3+\delta)}(0<a\le0.7, -0.7\le\delta<0)$, $(H_2N=CH-NH_2)Pb_{(1-a)}Li_aBr_{(3+\delta)}(0<a\le0.7, -0.7\le\delta<0)$, $(H_2N=CH-NH_2)Pb_{(1-a)}Na_aBr_{(3+\delta-y)}I_y(0<a\le0.7, -0.7\le\delta<0, 0<y<3)$, $(H_2N=CH-NH_2)Pb_{(1-a)}Na_aBr_{(3+\delta-y)}Cl_y(0<a\le0.7, -0.7\le\delta<0, 0<y<3)$, $CsPbBr_3$, $CsPbCl_3$, $CsPbI_3$, $CsPbBr_{(3-y)}I_y(0<y<3)$, $CsPbBr_{(3-y)}Cl_y(0<y<3)$, $CH_3NH_3PbBr_{(3-y)}Cl_y(0<y<3)$, $CH_3NH_3Pb_{(1-a)}Zn_aBr_3(0<a\le0.7)$, $CH_3NH_3Pb_{(1-a)}Al_aBr_{(3+\delta)}(0<a\le0.7, 0\le\delta\le0.7)$, $CH_3NH_3Pb_{(1-a)}Co_aBr_3(0<a\le0.7)$, $CH_3NH_3Pb_{(1-a)}Mn_aBr_3(0<a\le0.7)$, $CH_3NH_3Pb_{(1-a)}Mg_aBr_3(0<a\le0.7)$, $CsPb_{(1-a)}Zn_aBr_3(0<a\le0.7)$, $CsPb_{(1-a)}Al_aBr_{(3+\delta)}(0<a\le0.7, 0<\delta\le0.7)$, $CsPb_{(1-a)}Co_aBr_3(0<a\le0.7)$, $CsPb_{(1-a)}Mn_aBr_3(0<a\le0.7)$, $CsPb_{(1-a)}Mg_aBr_3(0<a\le0.7)$, $CH_3NH_3Pb_{(1-a)}Zn_aBr_{(3-y)}I_y(0<a\le0.7, 0<y<3)$, $CH_3NH_3Pb_{(1-a)}Al_aBr_{(3+\delta-y)}I_y(0<a\le0.7, 0<\delta\le0.7, 0<y<3)$, $CH_3NH_3Pb_{(1-a)}Co_aBr_{(3-y)}I_y(0<a\le0.7, 0<y<3)$, $CH_3NH_3Pb_{(1-a)}Mn_aBr_{(3-y)}I_y(0<a\le0.7, 0<y<3)$, $CH_3NH_3Pb_{(1-a)}Mg_aBr_{(3-y)}I_y(0<a\le0.7, 0<y<3)$, $CH_3NH_3Pb_{(1-a)}Zn_aBr_{(3-y)}Cl_y(0<a\le0.7, 0<y<3)$, $CH_3NH_3Pb_{(1-a)}Al_aBr_{(3+\delta-y)}Cl_y(0<a\le0.7, 0<\delta\le0.7, 0<y<3)$, $CH_3NH_3Pb_{(1-a)}Co_aBr_{(3+\delta-y)}Cl_y(0<a\le0.7, 0<y<3)$, $CH_3NH_3Pb_{(1-a)}Mn_aBr_{(3-y)}Cl_y(0<a\le0.7, 0<y<3)$, $CH_3NH_3Pb_{(1-a)}Mg_aBr_{(3-y)}Cl_y(0<a\le0.7, 0<y<3)$, $(H_2N=CH-NH_2)Zn_aBr_3(0<a\le0.7)$, $(H_2N=CH-NH_2)Mg_aBr_3(0<a\le0.7)$, $(H_2N=CH-NH_2)Pb_{(1-a)}Zn_aBr_{(3-y)}I_y(0<a\le0.7, 0<y<3)$, and $(H_2N=CH-NH_2)Pb_{(1-a)}Zn_aBr_{(3-y)}Cl_y(0<a\le0.0<y<3)$.

According to one aspect of the present invention, as the perovskite compound which is a compound represented by $ABX_{(3+\delta)}$ and having the perovskite type crystal structure of the three-dimensional structure, $CsPbBr_3$ or $CsPbBr_{(3-y)}I_y(0<y<3)$ is preferable.

Specific preferred examples of the compound which is represented by $A_2BX_{(4+\delta)}$ and has the perovskite type crystal structure of the two-dimensional structure in the perovskite compound include $(C_4H_9NH_3)_2PbBr_4$, $(C_4H_9NH_3)_2PbCl_4$, $(C_4H_9NH_3)_2PbI_4$, $(C_7H_{15}NH_3)_2PbBr_4$, $(C_7H_{15}NH_3)_2PbCl_4$, $(C_7H_{15}NH_3)_2PbI_4$, $(C_4H_9NH_3)_2Pb_{(1-a)}Li_aBr_{(4+\delta)}(0<a\le0.7, -0.7\le\delta<0)$, $(C_4H_9NH_3)_2Pb_{(1-a)}Na_aBr_{(4+\delta)}(0<a\le0.7, -0.7\le\delta<0)$, $(C_4H_9NH_3)_2Pb_{(1-a)}Rb_aBr_{(4+\delta)}(0<a\le0.7, -0.7\le\delta<0)$, $(C_7H_{15}NH_3)_2Pb_{(1-a)}Na_aBr_{(4+\delta)}(0<a\le0.7, -0.7\le\delta<0)$, $(C_7H_{15}NH_3)_2Pb_{(1-a)}Li_aBr_{(4+\delta)}(0<a\le0.7, -0.7\le\delta<0)$, $(C_7H_{15}NH_3)_2Pb_{(1-a)}Rb_aBr_{(4+\delta)}(0<a\le0.7, -0.7\le\delta<0)$, $(C_4H_9NH_3)_2Pb_{(1-a)}Na_aBr_{(4+\delta-y)}I_y(0<a\le0.7, -0.7\le\delta<0, 0<y<4)$, $(C_4H_9NH_3)_2Pb_{(1-a)}Li_aBr_{(4+\delta-y)}I_y(0<a\le0.7, -0.7\le\delta<0, 0<y<4)$, $(C_4H_9NH_3)_2Pb_{(1-a)}Rb_aBr_{(4+\delta-y)}I_y(0<a\le0.7, -0.7\le\delta<0, 0<y<4)$, $(C_4H_9NH_3)_2Pb_{(1-a)}Na_aBr_{(4+\delta-y)}Cl_y(0<a\le0.7, -0.7\le\delta<0, 0<y<4)$, $(C_4H_9NH_3)_2Pb_{(1-a)}Li_aBr_{(4+\delta-y)}Cl_y(0<a\le0.7, -0.7\le\delta<0, 0<y<4)$, $(C_4H_9NH_3)_2Pb_{(1-a)}Rb_aBr_{(4+\delta-y)}Cl_y(0<a\le0.7, -0.7\le\delta<0, 0<y<4)$, $(C_4H_9NH_3)_2PbBr_4$, $(C_7H_{15}NH_3)_2PbBr_4$, $(C_4H_9NH_3)_2PbBr_{(4-y)}Cl_y(0<y<4)$, $(C_4H_9NH_3)_2PbBr_{(4-y)}I_y(0<y<4)$, $(C_4H_9NH_3)_2Pb_{(1-a)}Zn_aBr_4(0<a\le0.7)$, $(C_4H_9NH_3)_2Pb_{(1-a)}Mg_aBr_4(0<a\le0.7)$, $(C_4H_9NH_3)_2Pb_{(1-a)}Co_aBr_4(0<a\le0.7)$, $(C_4H_9NH_3)_2Pb_{(1-a)}Mn_aBr_4(0<a\le0.7)$, $(C_7H_{15}NH_3)_2Pb_{(1-a)}Zn_aBr_4(0<a\le0.7)$, $(C_7H_{15}NH_3)_2Pb_{(1-a)}Mg_aBr_4(0<a\le0.7)$, $(C_7H_{15}NH_3)_2Pb_{(1-a)}Co_aBr_4(0<a\le0.7)$, $(C_7H_{15}NH_3)_2Pb_{(1-a)}Mn_aBr_4(0<a\le0.7)$, $(C_4H_9NH_3)_2Pb_{(1-a)}Zn_aBr_{(4-y)}I_y(0<a\le0.7, 0<y<4)$, $(C_4H_9NH_3)_2Pb_{(1-a)}Mg_aBr_{(4-y)}I_y(0<a\le0.7, 0<y<4)$, $(C_4H_9NH_3)_2Pb_{(1-a)}Co_aBr_{(4-y)}I_y(0<a\le0.7, 0<y<4)$, $C_4H_9NH_3)_2Pb_{(1-a)}Mn_aBr_{(4-y)}I_y(0<a\le0.7, 0<y<4)$, $(C_4H_9NH_3)_2Pb_{(1-a)}Zn_aBr_{(4-y)}Cl_y(0<a\le0.7, 0<y<4)$, $(C_4H_9NH_3)_2Pb_{(1-a)}Mg_aBr_{(4-y)}Cl_y(0<a\le0.7, 0<y<4)$, $(C_4H_9NH_3)_2Pb_{(1-a)}Co_aBr_{(4-y)}Cl_y(0<a\le0.7, 0<y<4)$, and $(C_4H_9NH_3)_2Pb_{(1-a)}Mn_aBr_{(4-y)}Cl_y(0<a\le0.7, 0<y<4)$.

[Particle Diameter]

When the component (1) is the perovskite compound, the average particle diameter of the component (1) contained in the composition according to the present embodiment is not particularly limited as long as the effects of the present invention can be achieved.

In the composition according to the present embodiment, from the viewpoint of maintaining a desirable crystal structure of the component (1), the average particle diameter of the component (1) is preferably 1 nm or greater, more preferably 2 nm or greater, and still more preferably 3 nm or greater.

Further, in the composition according to the present embodiment, from the viewpoint of suppressing precipitation of the component (1), the average particle diameter of the component (1) is preferably 10 μm or less, more preferably 1 μm or less, and still more preferably 500 nm or less.

The above-described upper limit values and lower limit values can be arbitrarily combined.

In the composition of the present embodiment, the average particle diameter of the component (1) is preferably in a range of 1 nm to 10 μm, more preferably in a range of 2 nm to 1 µm, and still more preferably 3 nm to 500 nm from the viewpoints of making the component (1) difficult to be precipitated and satisfactorily maintaining the crystal structure of the component (1).

In the present embodiment, the average particle diameter of the component (1) can be acquired as an average maximum Feret diameter obtained through an observation of the perovskite compound using a transmission electron microscope (JEM-2200FS, manufactured by JEOL Ltd.). The sample for observation is observed by setting the acceleration voltage to 200 kV.

As the average maximum Feret diameter, an average value of the maximum ferret diameters of 20 particles of the perovskite compound can be adopted.

In the composition according to the present embodiment, the median diameter (D50) of the component (1) is not particularly limited as long as the effects of the present invention can be achieved.

In the composition according to the present embodiment, from the viewpoint of maintaining a desirable crystal structure of the component (1), the median diameter (D50) of the component (1) is preferably 3 nm or greater, more preferably 4 nm or greater, and still more preferably 5 nm or greater.

Further, in the composition according to the present embodiment, from the viewpoint of suppressing precipitation of the component (1), the median diameter (D50) of the component (1) is preferably 5 µm or less, more preferably 500 nm or less, and still more preferably 100 nm or less.

According to another aspect of the present invention, the median diameter (D50) of the component (1) is preferably in a range of 3 nm to 5 µm, more preferably in a range of 4 nm to 500 nm, and still more preferably in a range of 5 nm to 100 nm.

In the present specification, the median diameter of the component (1) contained in the composition can be measured using, for example, a TEM or a SEM. Specifically, the median diameter (D50) can be acquired by observing the maximum Feret diameter of twenty particles of the component (1) contained in the composition using a TEM or a SEM and calculating the median diameter based on the distribution.

[Emission Spectrum]

When the component (1) is a semiconductor fine particle containing a compound containing an indium element or a compound containing a cadmium element, the component (1) is a light emitting material which is capable of emitting fluorescence in a visible light wavelength range.

In a case where the average particle diameter of the semiconductor fine particle containing a compound containing an indium element is 1 nm or greater and less than 2 nm, the semiconductor fine particle is capable of emitting fluorescence having a maximum peak of the emission intensity in a wavelength range of preferably 300 nm or greater, more preferably 310 nm or greater, and still more preferably 330 nm or greater and preferably 600 nm or less, more preferably 580 nm or less, and still more preferably 550 nm or less.

In a case where the average particle diameter of the semiconductor fine particle containing a compound containing an indium element is 1 nm or greater and less than 2 nm, the semiconductor fine particle is capable of emitting fluorescence having a maximum peak of the emission intensity in a wavelength range of preferably 300 nm or greater and 600 nm or less, more preferably 310 nm or greater and 580 nm or less, and still more preferably 330 nm or greater and 550 nm or less.

In a case where the average particle diameter of the semiconductor fine particle containing a compound containing an indium element is 2 nm or greater and less than 3 nm, the semiconductor fine particle is capable of emitting fluorescence having a maximum peak of the emission intensity in a wavelength range of preferably 480 nm or greater, more preferably 500 nm or greater, and still more preferably 520 nm or greater and preferably 700 nm or less, more preferably 600 nm or less, and still more preferably 580 nm or less.

That is, in a case where the average particle diameter of the semiconductor fine particle containing a compound containing an indium element is 2 nm or greater and less than 3 nm, the semiconductor fine particle is capable of emitting fluorescence having a maximum peak of the emission intensity in a wavelength range of preferably 480 nm or greater and 700 nm or less, more preferably 500 nm or greater and 600 nm or less, and still more preferably 520 nm or greater and 580 nm or less.

In a case where the average particle diameter of the semiconductor fine particle containing a compound containing an indium element is 3 nm or greater, the semiconductor fine particle is capable of emitting fluorescence having a maximum peak of the emission intensity in a wavelength range of preferably 520 nm or greater, more preferably 530 nm or greater, and still more preferably 540 nm or greater and preferably 800 nm or less, more preferably 750 nm or less, and still more preferably 730 nm or less.

That is, in a case where the average particle diameter of the semiconductor fine particle containing a compound containing an indium element is 3 nm or greater, the semiconductor fine particle is capable of emitting fluorescence having a maximum peak of the emission intensity in a wavelength range of preferably 520 nm or greater and 800 nm or less, more preferably 530 nm or greater and 750 nm or less, and still more preferably 540 nm or greater and 730 nm or less.

In a case where the average particle diameter of the semiconductor fine particle containing a compound containing a cadmium element is 1 nm or greater and less than 3 nm, the semiconductor fine particle is capable of emitting fluorescence having a maximum peak of the emission intensity in a wavelength range of preferably 300 nm or greater, more preferably 310 nm or greater, and still more preferably 330 nm or greater and preferably 600 nm or less, more preferably 580 nm or less, and still more preferably 550 nm or less.

That is, in a case where the average particle diameter of the semiconductor fine particle containing a compound containing a cadmium element is 1 nm or greater and less than 3 nm, the semiconductor fine particle is capable of emitting fluorescence having a maximum peak of the emission intensity in a wavelength range of preferably 300 nm or greater and 600 nm or less, more preferably 310 nm or greater and 580 nm or less, and still more preferably 330 nm or greater and 550 nm or less.

In a case where the average particle diameter of the semiconductor fine particle containing a compound containing a cadmium element is 3 nm or greater and less than 6 nm, the semiconductor fine particle is capable of emitting fluorescence having a maximum peak of the emission intensity in a wavelength range of preferably 480 nm or greater, more preferably 500 nm or greater, and still more preferably 520 nm or greater and preferably 700 nm or less, more preferably 600 nm or less, and still more preferably 580 nm or less.

That is, in a case where the average particle diameter of the semiconductor fine particle containing a compound containing a cadmium element is 3 nm or greater and less than 6 nm, the semiconductor fine particle is capable of emitting fluorescence having a maximum peak of the emission intensity in a wavelength range of preferably 480 nm or greater and 700 nm or less, more preferably 500 nm or greater and 600 nm or less, and still more preferably 520 nm or greater and 580 nm or less.

In a case where the average particle diameter of the semiconductor fine particle containing a compound containing a cadmium element is 6 nm or greater, the semiconductor fine particle is capable of emitting fluorescence having a maximum peak of the emission intensity in a wavelength range of preferably 520 nm or greater, more preferably 530 nm or greater, and still more preferably 540 nm or greater and preferably 800 nm or less, more preferably 750 nm or less, and still more preferably 730 nm or less.

That is, in a case where the average particle diameter of the semiconductor fine particle containing a compound containing a cadmium element is 6 nm or greater, the semiconductor fine particle is capable of emitting fluorescence having a maximum peak of the emission intensity in a wavelength range of preferably 520 nm or greater and 800 nm or less, more preferably 530 nm or greater and 750 nm or less, and still more preferably 540 nm or greater and 730 nm or less.

When the component (1) is the perovskite compound, the component (1) is a light emitting material which is capable of emitting fluorescence in a visible light wavelength range.

In a case where the constituent component X is an iodide ion, the perovskite compound is capable of emitting fluorescence having a maximum peak of the intensity in a wavelength range of preferably 480 nm or greater, more preferably 500 nm or greater, and still more preferably 520 nm or greater and preferably 700 nm or less, more preferably 600 nm or less, and still more preferably 580 nm or less.

The above-described upper limit values and lower limit values can be arbitrarily combined.

According to another aspect of the present invention, in the case where the constituent component X is an iodide ion, the perovskite compound is capable of emitting fluorescence having a maximum peak of the intensity in a wavelength range of preferably 480 nm or greater and 700 nm or less, more preferably 500 nm or greater and 600 nm or less, and still more preferably 520 nm or greater and 580 nm or less.

In a case where the constituent component X is an iodide ion, the perovskite compound is capable of emitting fluorescence having a maximum peak of the intensity in a wavelength range of preferably 520 nm or greater, more preferably 530 nm or greater, and still more preferably 540 nm or greater and preferably 800 nm or less, more preferably 750 nm or less, and still more preferably 730 nm or less.

The above-described upper limit values and lower limit values can be arbitrarily combined.

According to another aspect of the present invention, in the case where the constituent component X is an iodide ion, the perovskite compound is capable of emitting fluorescence having a maximum peak of the intensity in a wavelength range of preferably 520 nm or greater and 800 nm or less, more preferably 530 nm or greater and 750 nm or less, and still more preferably 540 nm or greater and 730 nm or less.

In a case where the constituent component X is a chloride ion, the perovskite compound is capable of emitting fluorescence having a maximum peak of the intensity in a wavelength range of preferably 300 nm or greater, more preferably 310 nm or greater, and still more preferably 330 nm or greater and 600 nm or less, more preferably 580 nm or less, and still more preferably 550 nm or less.

The above-described upper limit values and lower limit values can be arbitrarily combined.

According to another aspect of the present invention, in the case where the constituent component X is a chloride ion, the perovskite compound is capable of emitting fluorescence having a maximum peak of the intensity in a wavelength range of preferably 300 nm or greater and 600 nm or less, more preferably 310 nm or greater and 580 nm or less, and still more preferably 330 nm or greater and 550 nm or less.

[Component (2)]

Component (2) is a compound represented by formula (X).

$$[R^{16}-Y-]_a-Si-[OR^{17}]_{4-a} \tag{X}$$

wherein:

Y is a direct bond, an oxygen atom, or a sulfur atom, with the proviso that, when Y is an oxygen atom, $R^{16}$ is an alkyl group having 3 to 20 carbon atoms, a cycloalkyl group having 3 to carbon atoms, or an unsaturated hydrocarbon group having 2 to 20 carbon atoms, and $R^{17}$ is an alkyl group, a cycloalkyl group, an unsaturated hydrocarbon group or a hydrogen atom, with the proviso that $R^{17}$ has a smaller number of carbon atoms than $R^{16}$, and when Y is a direct bond or a sulfur atom, $R^{16}$ is an alkyl group having 1 to 20 carbon atoms, a cycloalkyl group having 3 to carbon atoms, or an unsaturated hydrocarbon group having 2 to 20 carbon atoms, $R^{17}$ is an alkyl group having 1 to 20 carbon atoms, a cycloalkyl group having 3 to carbon atoms, an unsaturated hydrocarbon group having 2 to 20 carbon atoms, or a hydrogen atom, when Y is a direct bond or a sulfur atom, hydrogen atoms in the alkyl group, the cycloalkyl group and the unsaturated hydrocarbon group as $R^{16}$ or $R^{17}$ are each independently substituted by or not substituted by a halogen atom, and hydrogen atoms in the cycloalkyl group as $R^{16}$ or $R^{17}$ are each independently substituted by or not substituted by an alkyl group; and a is an integer of 1 to 3, with the proviso that, when a is 2 or 3, a plurality of Y may be the same or different, when a is 2 or 3, a plurality of $R^{16}$ may be the same or different, and when a is 1 or 2, a plurality of $R^{17}$ may be the same or different.

The component (2) may be used after being modified with silica by the method described below.

At least a part of the component (2) may be adsorbed by the component (1) contained in the composition or may be dispersed in the composition.

The alkyl group as $R^{16}$ or $R^{17}$ may be either linear or branched.

When Y is an oxygen atom, the number of carbon atoms of the alkyl group represented by $R^{16}$ is preferably in a range of 5 to 20, and more preferably in a range of 8 to 20.

When Y is a direct bond or a sulfur atom, the number of carbon atoms of the alkyl group represented by $R^{16}$ is preferably in a range of 5 to 20, and more preferably in a range of 8 to 20.

When Y is a direct bond, an oxygen atom, or a sulfur atom, the number of carbon atoms of the alkyl group represented by $R^{17}$ is preferably in a range of 1 to 5, more preferably in a range of 1 to 2, and still more preferably 1, from the viewpoint of advancing the modification reaction more rapidly.

The number of carbon atoms of the cycloalkyl group represented by $R^{16}$ or $R^{17}$ is preferably in a range of 3 to 20, and more preferably in a range of 3 to 11. The number of carbon atoms include the number of carbon atoms in a substituent.

When the hydrogen atoms in the cycloalkyl group as $R^{16}$ or $R^{17}$ are each independently substituted by an alkyl group, the number of carbon atoms of the cycloalkyl group is 4 or greater. The alkyl group that may substitute the hydrogen atoms of the cycloalkyl group has 1 to 27 carbon atoms.

The unsaturated hydrocarbon group as $R^{16}$ or $R^{17}$ may be linear or branched.

The number of carbon atoms in the unsaturated hydrocarbon group as $R^{16}$ or $R^{17}$ is preferably in a range of 5 to 20, and more preferably in a range of 8 to 20.

It is preferable that $R^{16}$ represents an alkyl group or an unsaturated hydrocarbon group. It is preferable that $R^{17}$ represents a hydrogen atom, an alkyl group or an unsaturated hydrocarbon group. The unsaturated hydrocarbon group as $R^{16}$ or $R^{17}$ is preferably an alkenyl group, and more preferably an alkenyl group having 8 to 20 carbon atoms.

According to one aspect of the present invention, the unsaturated hydrocarbon group as $R^{16}$ or $R^{17}$ is preferably an aryl group, and more preferably a phenyl group.

Specific examples of the alkyl group as $R^{16}$ and $R^{17}$ are the same as those provided as exemplary examples of the alkyl group represented by each of independent $R^6$ to $R^9$.

Specific examples of the cycloalkyl group as $R^{16}$ and $R^{17}$ are the same as those provided as exemplary examples of the cycloalkyl group represented by each of independent $R^6$ to $R^9$.

As the alkenyl group represented by $R^{16}$ or $R^{17}$, a group in which any one single bond (C—C) between carbon atoms is substituted with a double bond (C=C) in the alkyl group as $R^6$ to $R^9$ is an exemplary example, and the position of the double bond is not limited.

Preferred examples of such an alkenyl group include an ethenyl group, a propenyl group, a 3-butenyl group, a 2-butenyl group, a 2-pentenyl group, a 2-hexenyl group, a 2-nonenyl group, a 2-dodecenyl group, and a 9-octadecenyl group.

When the alkyl group, cycloalkyl group and unsaturated hydrocarbon group represented by $R^{17}$ have carbon atoms in a number described above, the component (2) is easily hydrolyzed and the generated silanol bonds can further be condensed. This facilitates the adsorption of the component (2) to the surface of the component (1).

This presumably enables the suppression of deterioration of the component (1) in the composition even in a wet heat environment, and enables the resulting composition to have high durability.

Examples of the halogen atom include a fluorine atom, a chlorine atom, a bromine atom, and an iodine atom, among which a fluorine atom is preferable due to its high chemical stability.

Specific examples of the component (2) include trimethoxyphenylsilane, ethoxytriethylsilane, methoxytrimethylsilane, methoxydimethyl (phenyl) silane, pentafluorophenylethoxydimethylsilane, trimethylethoxysilane, 3-chloropropyldimethoxymethylsilane, (3-chloropropyl) diethoxy (methyl) silane, (chloromethyl) dimethoxy (methyl) silane, (chloromethyl) diethoxy (methyl) silane, diethoxydimethylsilane, dimethoxydimethylsilane, dimethoxydiphenylsilane, dimethoxymethylphenylsilane, diethoxydiphenylsilane, dimethoxymethylvinylsilane, diethoxy (methyl) phenylsilane, dimethoxy (methyl) (3,3,3-trifluoropropyl) silane, allyltriethoxysilane, allyltrimethoxysilane, (3-bromopropyl) trimethoxysilane, cyclohexyltrimethoxysilane, (chloromethyl) triethoxysilane, (chloromethyl) trimethoxysilane, dodecyltriethoxysilane, dodecyltrimethoxysilane, triethoxyethylsilane, decyltrimethoxysilane, ethyltrimethoxysilane, hexyltriethoxysilane, hexyltrimethoxysilane, hexadecyltrimethoxysilane, trimethoxy (methyl) silane, triethoxymethylsilane, tetrabutoxysilane, tetrapropoxysilane, tetraisopropoxysilane, trimethoxy (1H,1H,-2H,2H-heptadecafluorodecyl) silane, triethoxy-1H,1H,2H,2H-tridecafluoro-n-octylsilane, trimethoxy (1H,1H,2H,2H-nonafluorohexyl) silane, trimethoxy (3,3,3-trifluoropropyl) silane, 1H,1H,2H,2H-perfluorooctyltriethoxysilane, and the like.

Among these, preferable as the component (2) are trimethoxyphenylsilane, methoxydimethyl (phenyl) silane, dimethoxydiphenylsilane, dimethoxymethylphenylsilane, cyclohexyltrimethoxysilane, dodecyltriethoxysilane, dodecyltrimethoxysilane, decyltrimethoxysilane, hexyltriethoxysilane, hexyltrimethoxysilane, hexadecyltrimethoxysilane, trimethoxy (1H,1H,2H,2H-heptadecafluorodecyl) silane, triethoxy-1H,1H,2H,2H-tridecafluoro-n-octylsilane, trimethoxy (1H,1H,2H,2H-nonafluorohexyl) silane, trimethoxy (3,3,3-trifluoropropyl) silane, and 1H,1H,2H,2H-perfluoro octyltriethoxysilane.

Further, the component (2) may be dodecyltrimethoxysilane, trimethoxyphenylsilane, 1H,1H,2H,2H-perfluorooctyltriethoxysilane, or trimethoxy (1H,1H,2H,2H-nonafluorohexyl) silane.

The component (2) may be a modified product of the component (2) which has been modified according to the method described below.

In the present specification, the modification of the component (2) indicates that a Si—O—Si bond is formed by condensation of Si—O—$R^{17}$ bonds in two or more molecules of the component (2). The modified product of the component (2) indicates a compound (condensation product) having a Si—O—Si bond obtained by the above reaction.

As the modified product of the component (2), a preferable example is a compound in which at least one $OR^{17}$ in Formula (X) representing the component (2) described above is condensed with $OR^{17}$ in another Formula (X).

[Component (3)]

Component (3) is a solvent. The solvent is not particularly limited as long as the solvent is a medium in which the compound (1) can be dispersed. Further, a solvent in which the compound (1) is unlikely to be dissolved is preferable.

In the present specification, the "solvent" indicates a substance (excluding a polymerizable compound and a polymer) that enters a liquid state at 25° C. and 1 atm.

In the present specification, the term "dispersed" indicates a state in which the compound (1) is floated or suspended in a solvent, a polymerizable compound, or a polymer or may be partially precipitated.

Examples of such a solvent include the following (a) to (k).
 (a): an ester
 (b): a ketone
 (c): an ether
 (d): an alcohol
 (e): glycol ether
 (f): an organic solvent having an amide group
 (g): an organic solvent having a nitrile group
 (h): an organic solvent having a carbonate group, such as ethylene carbonate and propylene carbonate
 (i): an organic solvent having a halogenated hydrocarbon group, such as methylene chloride and chloroform (j): an organic solvent having a hydrocarbon group, such as n-pentane, cyclohexane, n-hexane, benzene, toluene, xylene and 1-octadecene (k): dimethyl sulfoxide Examples of the ester (a) include methyl formate, ethyl formate, propyl formate, pentyl formate, methyl acetate, ethyl acetate, and pentyl acetate.

Examples of the ketone (b) include γ-butyrolactone, acetone, dimethyl ketone, diisobutyl ketone, cyclopentanone, cyclohexanone, and methylcyclohexanone.

Examples of the ether (c) include diethyl ether, methyl-tert-butyl ether, diisopropyl ether, dimethoxymethane, dimethoxyethane, 1,4-dioxane, 1,3-dioxolane, 4-methyldioxolane, tetrahydrofuran, methyltetrahydrofuran, anisole, and phenetole.

Examples of the alcohol (d) include methanol, ethanol, 1-propanol, 2-propanol, 1-butanol, 2-butanol, tert-butanol, 1-pentanol, 2-methyl-2-butanol, methoxypropanol, diacetone alcohol, cyclohexanol, 2-fluoroethanol, 2,2,2-trifluoroethanol, and 2,2,3,3-tetrafluoro-1-propanol.

Examples of the glycol ether (e) include ethylene glycol monomethyl ether, ethylene glycol monoethyl ether, ethylene glycol monobutyl ether, ethylene glycol monoethyl ether acetate, and triethylene glycol dimethyl ether.

Examples of the organic solvent (f) containing an amide group include N-methyl-2-pyrrolidone, N,N-dimethylformamide, acetamide, and N,N-dimethylacetamide.

Examples of the organic solvent (g) having a nitrile group include acetonitrile, isobutyronitrile, propionitrile, and methoxy acetonitrile.

Among these, (a) an ester, (b) a ketone, (c) an ether, (g) an organic solvent having a nitrile group, (h) an organic solvent having a carbonate group, (i) an organic solvent having a halogenated hydrocarbon group, (j) an organic solvent having a hydrocarbon group are preferable, because these have a low polarity and are considered to be unlikely to dissolve the component (1). More preferable examples are (i) an organic solvent having a halogenated hydrocarbon group, and (j) an organic solvent having a hydrocarbon group.

[Component (4)]

Component (4) is a polymerizable compound or a polymer. The polymerizable compound contained in the composition according to the present embodiment is not particularly limited, and one or two or more kinds thereof may be used. As the polymerizable compound, a polymerizable compound with a low solubility of the compound (1) at the temperature at which the composition according to the present embodiment is produced is preferable.

In the present specification, the "polymerizable compound" indicates a compound of a monomer containing a polymerizable group.

For example, in a case where the composition according to the present embodiment is produced at room temperature under normal pressure, the polymerizable compound is not particularly limited, and examples thereof include known polymerizable compounds such as styrene, acrylic acid esters, methacrylic acid esters, and acrylonitrile. Among these, any one or both of acrylic acid ester and methacrylic acid ester serving as monomer components of an acrylic resin are preferable as the polymerizable compound.

The polymer contained in the composition according to the present embodiment is not particularly limited, and one or two or more kinds thereof may be used. As the polymer, a polymer with a low solubility of the component (1) at the temperature at which the composition according to the present embodiment is produced is preferable.

For example, in a case where the composition according to the present embodiment is produced at room temperature under normal pressure, the polymer is not particularly limited, and examples thereof include known polymers such as polystyrene, acrylic resins, and epoxy resins. Among these, an acrylic resin is preferable as the polymer. The acrylic resin has a constitutional unit derived from any one or both of acrylic acid ester and methacrylic acid ester.

In the composition according to the present embodiment, the amount of the acrylic acid ester and/or methacrylic acid ester and the constitutional unit derived from these may be 10% by mole or greater, 30% by mole or greater, 50% by mole or greater, 80% by mole or greater, or 100% by mole with respect to the amount of all constitutional units contained in the polymerizable compound or the polymer as component (4).

The weight average molecular weight of the polymer is preferably in a range of 100 to 1200000, more preferably in a range of 1000 to 800000, and still more preferably in a range of 5000 to 150000.

In the present specification, the "weight average molecular weight" indicates a value in terms of polystyrene to be measured according to a gel permeation chromatography (GPC) method.

[Component (5)]

Component (5) is at least one compound or ion selected from group consisting of ammonia, amine, and carboxylic acid, and salts or ions thereof.

As for the component (5), each of the ammonia, the amine, and the carboxylic acid may be, for example, in the form of at least one compound or ion selected from the group consisting of salts and ions of these.

In other words, the component (5) may be at least one compound or ion selected from the group consisting of ammonia, an amine, a carboxylic acid, a salt of the ammonia, a salt of the amine, a salt of the carboxylic acid, an ion of the ammonia, an ion of the amine, and an ion of the carboxylic acid.

The ammonia, the amine, the carboxylic acid, and the salts and the ions of these typically function as capping ligands.

The "capping ligand" is a compound having a function of being adsorbed on the surface of the component (1) and stably dispersing the component (1) in the composition.

Examples of the ions or salts (such as an ammonium salt) of the ammonia or amine include an ammonium cation represented by Formula (A1) and an ammonium salt containing the ammonium cation.

The component (5) may be an ammonium cation represented by Formula (A1) or an ammonium salt containing the ammonium cation.

(A1)

In Formula (A1), $R^1$ to $R^3$ represent a hydrogen atom, and $R^4$ represents a hydrogen atom or a monovalent hydrocarbon group. The hydrocarbon group represented by $R^4$ may be a saturated hydrocarbon group (that is, an alkyl group or a cycloalkyl group) or an unsaturated hydrocarbon group.

The alkyl group as $R^4$ may be either linear or branched.

The number of carbon atoms in the alkyl group represented by $R^4$ is typically in a range of 1 to 20, preferably in a range of 5 to 20, and still more preferably in a range of 8 to 20.

The cycloalkyl group represented by $R^4$ may contain an alkyl group as a substituent. The number of carbon atoms in the cycloalkyl group is typically in a range of 3 to 30, preferably in a range of 3 to 20, and more preferably in a range of 3 to 11.

The number of carbon atoms include the number of carbon atoms in a substituent.

The unsaturated hydrocarbon group as $R^4$ may be linear or branched.

The number of carbon atoms in the unsaturated hydrocarbon group as $R^4$ is typically in a range of 2 to 20, preferably in a range of 5 to 20, and more preferably in a range of 8 to 20.

It is preferable that $R^4$ represents a hydrogen atom, an alkyl group or an unsaturated hydrocarbon group. As the unsaturated hydrocarbon group, an alkenyl group is preferable. $R^4$ is preferably an alkenyl group having 8 to 20 carbon atoms.

Specific examples of the alkyl group as $R^4$ include those provided as exemplary examples of the alkyl group represented by $R^6$ to $R^9$.

Specific examples of the cycloalkyl group as $R^4$ include those provided as exemplary examples of the cycloalkyl group represented by $R^6$ to $R^9$.

As the alkenyl group represented by $R^4$, a group in which any one single bond (C—C) between carbon atoms is substituted with a double bond (C=C) in the linear or branched alkyl group as $R^6$ to $R^9$ is an exemplary example, and the position of the double bond is not limited.

Preferred examples of such an alkenyl group include an ethenyl group, a propenyl group, a 3-butenyl group, a 2-butenyl group, a 2-pentenyl group, a 2-hexenyl group, a 2-nonenyl group, a 2-dodecenyl group, and a 9-octadecenyl group.

In a case where the ammonium cation forms a salt, the counter anion is not particularly limited, and preferred examples thereof include halide ions such as $Br^-$, $Cl^-$, $I^-$, and $F^-$; and carboxylate ions.

Preferred examples of the ammonium salt containing the ammonium cation represented by Formula (A1) and a counter anion include an n-octylammonium salt and an oleyl ammonium salt.

Examples of the ions or salts (such as a carboxylate) of the carboxylic acid include a carboxylate anion represented by Formula (A2) and a carboxylate containing the carboxylate anion.

The component (5) may be a carboxylate anion represented by Formula (A2) or a carboxylate containing the carboxylate anion.

$$R^5—CO_2^- \quad (A2)$$

In Formula (A2), $R^5$ represents a monovalent hydrocarbon group. The hydrocarbon group represented by $R^5$ may be a saturated hydrocarbon group (in other words, an alkyl group or a cycloalkyl group) or an unsaturated hydrocarbon group.

The alkyl group as $R^5$ may be either linear or branched. The number of carbon atoms in the alkyl group represented by $R^5$ is typically in a range of 1 to 20, preferably in a range of 5 to 20, and still more preferably in a range of 8 to 20.

The cycloalkyl group represented by $R^5$ may contain an alkyl group as a substituent. The number of carbon atoms in the cycloalkyl group is typically in a range of 3 to 30, preferably in a range of 3 to 20, and more preferably in a range of 3 to 11. The number of carbon atoms include the number of carbon atoms in a substituent.

The unsaturated hydrocarbon group as $R^5$ may be linear or branched.

The number of carbon atoms in the unsaturated hydrocarbon group as $R^5$ is typically in a range of 2 to 20, preferably in a range of 5 to 20, and more preferably in a range of 8 to 20.

It is preferable that $R^5$ represents an alkyl group or an unsaturated hydrocarbon group. As the unsaturated hydrocarbon group, an alkenyl group is preferable.

Specific examples of the alkyl group as $R^5$ include those provided as exemplary examples of the alkyl group represented by $R^6$ to $R^9$.

Specific examples of the cycloalkyl group as $R^5$ include those provided as exemplary examples of the cycloalkyl group represented by $R^6$ to $R^9$.

Specific examples of the alkenyl group as $R^5$ include those provided as exemplary examples of the alkenyl group represented by $R^4$.

As the carboxylate anion represented by Formula (A2), an oleate anion is preferable.

When the carboxylate anion forms a salt, the counter cation of the carboxylate anion is not particularly limited, and preferred examples thereof include an alkali metal cation, an alkaline earth metal cation, and an ammonium cation.

The composition according to the present embodiment may contain any one or both of an ammonium salt and a carboxylate.

[Other Components]

The composition according to the present embodiment may include a nonionic organic compound or a silicon-containing compound not encompassed by component (2), as well as the components (1) to (5).

(Nonionic Organic Compound)

Examples of the nonionic organic compound that may be contained in the composition of the present embodiment include an organic compound having a mercapto group, a halogenated hydrocarbon compound, and the like.

(Organic Compound Having Mercapto Group)

The organic compound having a mercapto group is represented by Formula (A5-1).

$$R^{18}—SH \quad (A5-1)$$

In Formula (A5-1), $R^{18}$ represents an alkyl group or a cycloalkyl group.

The alkyl group as $R^{18}$ may be either linear or branched. The number of carbon atoms in the alkyl group is preferably in a range of 1 to 20, more preferably in a range of 5 to 20, and still more preferably in a range of 8 to 20.

When $R^{18}$ is a cycloalkyl group, the cycloalkyl group may contain an alkyl group as a substituent. The number of carbon atoms in the cycloalkyl group is preferably in a range of 3 to 30, more preferably in a range of 3 to 20, and still more preferably in a range of 3 to 11. The number of carbon atoms include the number of carbon atoms in a substituent.

Among these, an alkyl group is preferable as $R^{18}$.

Specific examples of the alkyl group as $R^{18}$ include those provided as exemplary examples of the alkyl group represented by $R^6$ to $R^9$.

Specific examples of the cycloalkyl group as $R^{18}$ include those provided as exemplary examples of the cycloalkyl group represented by $R^6$ to $R^9$.

In Formula (A5-1), SH represents a mercapto group.

A part or all of the organic compound having a mercapto group, which compound is represented by Formula (A5-1), may be adsorbed on the surface of the component (1) or may be dispersed in the composition.

preferable examples of the alkyl or cycloalkyl organic compound having a mercapto group, which compound is represented by Formula (A5-1), include 1-dodecanethiol, 1-eicosanethiol, 1-octadecanethiol, 1-pentadecanethiol, 1-tetradecanethiol, 1-hexadecanethiol, 1-decanethiol, and 1-docosanethiol, among which 1-hexadecanethiol, 1-decanethiol, and 1-docosanthiol are more preferable.

(Halogenated Hydrocarbon Compound)

The halogenated hydrocarbon compound is represented by any of Formulae (A5-2) to (A5-4).

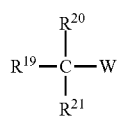

(A5-2)

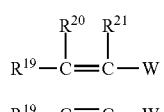

(A5-3)

(A5-4)

In Formulae (5-2) to (A5-4), CW represents a halogenated hydrocarbon group, C represents a carbon atom, $R^{19}$ to $R^{21}$ each independently represent a hydrogen atom, or a monovalent organic group. The organic group is preferably a hydrocarbon group such as an alkyl group which may have a substituent or a cycloalkyl group which may have a substituent.

The alkyl group as $R^{19}$ to $R^{21}$ may be either linear or branched, and may have an alkoxysilyl group or a halogeno group as a substituent. The number of carbon atoms in the alkyl group is preferably in a range of 1 to 20, more preferably in a range of 5 to 20, and still more preferably in a range of 8 to 20. The number of carbon atoms include the number of carbon atoms in a substituent.

When $R^{19}$ to $R^{21}$ is a cycloalkyl group, the cycloalkyl group may have an alkoxysilyl group, a halogeno group, or an alkyl group as a substituent. The number of carbon atoms in the cycloalkyl group is preferably in a range of 3 to 30, more preferably in a range of 3 to 20, and still more preferably in a range of 3 to 11. The number of carbon atoms include the number of carbon atoms in a substituent.

The alkyl group and the cycloalkyl group preferably has no substituent.

Among these, $R^{19}$ to $R^{21}$ are each preferably a hydrogen atom or an alkyl group, and it is more preferable that at least one of $R^{19}$ to $R^{21}$ is the alkyl group. In Formula (A5-2), one of $R^{19}$ to $R^{21}$ is an alkyl group having 1 to 20 carbon atoms, and it is more preferable that two of $R^{19}$ to $R^{21}$ are hydrogen atoms.

Specific examples of the alkyl group as $R^{19}$ to $R^{21}$ are the same as those provided as exemplary examples of the alkyl group represented by each of independent $R^6$ to $R^9$. Specific examples of the cycloalkyl group as $R^{19}$ to $R^{21}$ are the same as those provided as exemplary examples of the cycloalkyl group represented by each of independent $R^6$ to $R^9$.

In Formulae (A5-2) to (A5-4), W represents a halogen element. Examples of the halogen element represented by W include a fluorine atom, a chlorine atom, a bromine atom, and an iodine atom, and a bromine atom is preferable.

A part or all of the halogenated hydrocarbon compounds represented by Formulae (A5-2) to (A5-4) may be adsorbed on the surface of the component (1) or may be dispersed in the composition.

Examples of the organic compound having a halogenated alkyl group, which compound is represented by each of Formulae (A5-2) to (A5-4), include an alkyl fluoride, an alkyl chloride, an alkyl bromide, and an alkyl iodide.

Among these, preferable as the organic compound having a halogenated alkyl group, which compound is represented by each of Formulae (A5-2) to (A5-4), are 1-bromooctadecane, 1-bromopentadecane, 1-bromotetradecane, 1-bromoundecane, 1-bromohexadecane, 1-chlorohexadecane, 1-chlorooctadecane, 1-cyclopentane, 1-chlorotetradecane, 1-fluorooctadecane, 1-fluoropentadecane, 1-fluorotetradecane, 1-fluoroundecane, 1-fluorohexadecane, 1-iodooctadecane, 1-iodopentadecane, 1-iodotetradecane, 1-iodoundecane and 1-iodohexadecane.

Further, more preferable as the organic compound having a halogenated alkyl group, which compound is represented by each of Formulae (A5-2) to (A5-4), are 1-bromohexadecane, 1-fluorohexadecane, 1-iodohexadecane and 1-chlorohexadecane.

(Silicon-Containing Compound not Encompassed by Component (2))

Examples of the silicon-containing compound not encompassed by the component (2) contained in the composition of the present embodiment include at least one compound selected from the group consisting of an organic compound having an amino group, an alkoxy groups and a silicon atom, silazane and a modified product thereof, and the like.

(Organic Compound Having Amino Group, Alkoxy Group and Silicon Atom)

The composition according to the present embodiment may contain an organic compound having an amino group, an alkoxy group, and a silicon atom.

The organic compound having an amino group, an alkoxy group, and a silicon atom may be an organic compound having an amino group, an alkoxy group, and a silicon atom, which is represented by Formula (A5-5).

The organic compound represented by Formula (A5-5) has an amino group and an alkoxysilyl group.

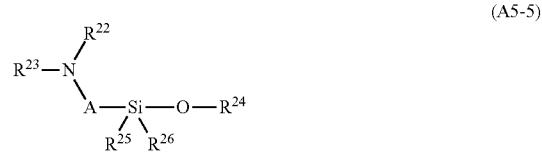

(A5-5)

In Formula (A5-5), A is a divalent hydrocarbon group, O is an oxygen atom, N is a nitrogen atom, Si is a silicon atom, $R^{22}$ to $R^{23}$ are each independently a hydrogen atom, an alkyl group, or a cycloalkyl group, $R^{24}$ represents an alkyl group or a cycloalkyl group, and $R^{25}$ to $R^{26}$ represent a hydrogen atom, an alkyl group, an alkoxy group, or a cycloalkyl group.

The alkyl group as any of $R^{22}$ to $R^{26}$ may be either linear or branched. The number of carbon atoms in the alkyl group is preferably in a range of 1 to 20, more preferably in a range of 5 to 20, and still more preferably in a range of 8 to 20.

When $R^{22}$ to $R^{26}$ is a cycloalkyl group, the cycloalkyl group may contain an alkyl group as a substituent. The number of carbon atoms in the cycloalkyl group is preferably in a range of 3 to 30, more preferably in a range of 3 to 20, and still more preferably in a range of 3 to 11.

The number of carbon atoms include the number of carbon atoms in a substituent.

Specific examples of the alkyl group as $R^{22}$ to $R^{26}$ are the same as those provided as exemplary examples of the alkyl group represented by each of independent $R^6$ to $R^9$.

Specific examples of the cycloalkyl group as $R^{22}$ to $R^{26}$ are the same as those provided as exemplary examples of the cycloalkyl group represented by each of independent $R^6$ to $R^9$.

Examples of the alkoxy group as $R^{25}$ to $R^{26}$ include a monovalent group in which the linear or branched alkyl group exemplified as $R^6$ to $R^9$ is bonded to an oxygen atom.

When $R^{25}$ to $R^{26}$ are alkoxy groups, examples thereof include a methoxy group, an ethoxy group, and a butoxy group, and a methoxy group is preferable.

The divalent hydrocarbon group represented by A may be a group obtained by removing two hydrogen atoms from a hydrocarbon compound, and the hydrocarbon compound may be an aliphatic hydrocarbon, an aromatic hydrocarbon or a saturated aliphatic hydrocarbon. The alkylene group as A may be either linear or branched. The number of carbon atoms in the alkylene group is preferably in a range of 1 to 100, more preferably in a range of 1 to 20, and still more preferably in a range of 1 to 5.

A part or all of the organic compound having an amino group, an alkoxy group, and a silicon atom, which compound is represented by Formula (A5-5), may be adsorbed on the surface of the component (1) or may be dispersed in the composition.

Preferable examples of the organic compound having an amino group, an alkoxy group, and a silicon atom, which compound is represented by Formula (A5-5), include trimethoxy[3-(methylamino)propyl]silane, 3-aminopropyltriethoxysilane, 3-aminopropyldimethoxymethylsilane, 3-aminopropyldiethoxymethylsilane, and 3-aminopropyltrimethoxysilane, among which 3-aminopropyltrimethoxysilane is more preferable.

As the organic compound having an amino group, an alkoxy group, and a silicon atom, a preferable example is an organic compound represented by Formula (A5-5), in which $R^{22}$ and $R^{23}$ are hydrogen atoms, $R^{24}$ is the above-described alkyl group, and $R^{25}$ and $R^{26}$ are alkoxy groups.

(At Least One Compound Selected from the Group Consisting of Silazane and Modified Product Thereof)

A silazane is a compound having a Si—N—Si bond.

The silazane may be linear, branched, or cyclic. Further, the silazane may be of a low molecular weight or a high molecular weight (the latter may be hereinafter also referred to as a polysilazane).

The term "low-molecular-weight silazane" in the present specification indicates a silazane having a number average molecular weight of less than 600, and the term "high-molecular-weight silazane" (polysilazane) indicates a silazane having a number average molecular weight in a range of 600 to 2000.

In the present specification, the "number average molecular weight" indicates a value in terms of polystyrene to be measured according to a gel permeation chromatography (GPC) method.

For example, a low-molecular-weight silazane represented by Formula (B1) or (B2) or a polysilazane which has a constituent unit represented by Formula (B3) or has a group represented by Formula (B4) is preferable.

The silazane may be used after being modified with silica by the method described below.

At least a part of the silazane or modified product thereof may be adsorbed by the component (1) contained in the composition or may be dispersed in the composition.

In Formula (B1), $R^{14}$ and $R^{15}$ each independently represent a hydrogen atom, an alkyl group having 1 to 20 carbon atoms, an alkenyl group having 1 to 20 carbon atoms, a cycloalkyl group having 3 to 20 carbon atoms, an aryl group having 6 to 20 carbon atoms, or an alkylsilyl group having 1 to 20 carbon atoms. A plurality of $R^{15}$'s may be the same as or different from one another.

Examples of the low-molecular-weight silazane represented by Formula (B1) include 1,3-divinyl-1,1,3,3-tetramethyldisilazane, 1,3-diphenyltetramethyldisilazane, and 1,1,1,3,3,3-dexamethyldisilazane.

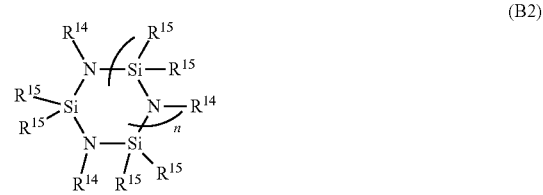

In Formula (B2), $R^{14}$ and $R^{15}$ each have the same definition as described above. A plurality of $R^{14}$'s may be the same as or different from one another.

A plurality of $R^{15}$'s may be the same as or different from one another.

n represents a number of 1 or 2.

Examples of the low-molecular-weight silazane represented by Formula (B2) include octamethylcyclotetrasilazane, 2,2,4,4,6,6,-hexamethylcyclotrisilazane, and 2,4,6-trimethyl-2,4,6-trivinylcyclotrisilazane.

As the low-molecular-weight silazane, octamethylcyclotetrasilazane or 1,3-diphenyltetramethyldisilazane is preferable, and octamethylcyclotetrasilazane is more preferable.

The polysilazane is not particularly limited, and examples thereof include a polymer compound having a constituent unit represented by Formula (B3). The constituent unit represented by Formula (B3) which is contained in the polysilazane may be used alone or in combination of a plurality of kinds thereof.

In Formula (B3), $R^{14}$ and $R^{15}$ each have the same definition as described above. A plurality of $R^{14}$'s may be the same as or different from one another. A plurality of $R^{15}$'s may be the same as or different from one another, m represents an integer of 2 to 10,000.

The polysilazane may have a ring structure in a portion of a molecule. For example, the polysilazane may have a structure represented by Formula (B4).

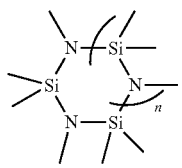

(B4)

In Formula (B4), n has the same definition as described above.

The polysilazane having a constituent unit represented by Formula (B3) may be a perhydropolysilazane in which all of $R^{14}$'s and $R^{15}$'s represent a hydrogen atom.

The polysilazane having a constituent unit represented by Formula (B3) may be an organopolysilazane in which at least one $R^{15}$ represents a group other than the hydrogen atom. According to the application thereof, the perhydropolysilazane or organopolysilazane may be appropriately selected or can be used by being mixed.

A typical polysilazane is presumed to have a structure in which a linear structure and a ring structure such as a 6-membered ring or a 8-membered ring are present. The molecular weight thereof is approximately 600 to 2000 in terms of the number average molecular weight (Mn), and the polysilazane may be a substance in a liquid or solid state depending on the molecular weight thereof.

As the polysilazane, a commercially available product may be used, and examples of the commercially available product include NN120-10, NN120-20, NAX120-20, NN110, NAX120, NAX110, NL120A, NL110A, NL150A, NP110, and NP140 (all manufactured by AZ Electronic Materials plc), AZNN-120-20, Durazane (registered trademark) 1500 Slow Cure, Durazane (registered trademark) 1500 Rapid Cure, and Durazane (registered trademark) 1800 (all manufactured by Merck Performance Materials Ltd.).

As the polysilazane having a constituent unit represented by Formula (B3), AZNN-120-20, Durazane (registered trademark) 1500 Slow Cure or Durazane (registered trademark) 1500 Rapid cure is preferable, and Durazane (registered trademark) 1500 Slow Cure is more preferable.

The silazane contained in the composition according to the present embodiment may be a modified product of a silazane which has been modified according to the method described below.

In the present specification, the modification of a silazane indicates that a Si—O—Si bond is formed by substituting N with O in at least some Si—N—Si bonds contained in the silazane. The modified product of the silazane indicates a compound having a Si—O—Si bond.

As the modified product of the silazane, a low-molecular-weight compound in which at least one N in Formula (B1) or (B2) is substituted with O, a high-molecular-weight compound in which at least one N in a polysilazane having a constituent unit represented by Formula (B3) is substituted with O, or a high-molecular-weight compound in which at least one N in a polysilazane having a structure represented by Formula (B4) is substituted with O is preferable.

The ratio of the number of substituted Os with respect to the total amount of N in Formula (B2) is preferably in a range of 0.1% to 99%, more preferably in a range of 10% to 95%, and still more preferably in a range of 30% to 90%.

The ratio of the number of substituted Os with respect to the total amount of N in Formula (B3) is preferably in a range of 0.1% to 99%, more preferably in a range of 10% to 95%, and still more preferably in a range of 30% to 90%.

The ratio of the number of substituted Os with respect to the total amount of N in Formula (B4) is preferably in a range of 0.1% to 99%, more preferably in a range of 10% to 95%, and still more preferably in a range of 30% to 90%.

The modified product of a silazane may be used alone or in the form of a mixture of two or more kinds thereof.

The number of Si atoms, the number of N atoms, and the number of O atoms contained in the silazane or the modified product of the silazane can be calculated according to nuclear magnetic resonance spectroscopy (hereinafter, also referred to as NMR), X-ray photoelectron spectroscopy (hereinafter, also referred to as XPS), or energy dispersive X-ray analysis (hereinafter, also referred to as EDX) using a transmission electron microscope (TEM).

According to a particularly preferable method, the calculation can be made by measuring the number of Si atoms, the number of N atoms, and the number of O atoms in the composition according to the X-ray photoelectron spectroscopy (XPS).

The ratio of the number of O atoms to the number of N atoms contained in the silazane and modified product thereof to be measured according to the above-described method is preferably in a range of 0.1% to 99%, more preferably in a range of 10% to 95%, and still more preferably 30% to 90%.

[Regarding Compounding Ratio of Each Component]

The compounding ratio between the component (1) and the component (2) in the composition according to the present embodiment may be at the level where the action of improvement in the durability with respect to water vapor due to the component (2) is exhibited and can be appropriately determined depending on the kind and the like of the component (1) and the component (2).

In the composition according to the present embodiment, in a case where the component (1) is a semiconductor fine particle containing the perovskite compound, the molar ratio [Si/B] of the Si element in the component (2) to the metal ion in the component B of the perovskite compound may be in a range of 0.001 to 2000 or in a range of 0.01 to 500.

From the viewpoint that the action of improvement in the durability with respect to water vapor due to the component (2) is particularly satisfactorily exhibited, a composition in which the compounding ratio between the component (1) and the component (2) is in the above-described range is preferable.

In the composition according to the present embodiment, in a case where the component (1) is a semiconductor fine particle containing the perovskite compound, the molar ratio of the nonionic organic compound or the silicon-containing compound not encompassed by the component (2) with respect to the metal ion of the component B of the perovskite compound may be 0.01 or greater and 1000 or less, or may be 1 or greater and 200 or less.

From the viewpoint that the action of improvement in the durability with respect to water vapor due to the component (2) is particularly satisfactorily exhibited, a composition in which the compounding ratio between the component (1) and the nonionic organic compound or the silicon-containing compound not encompassed by the component (2) is in the above-described range is preferable.

The compounding ratio between the component (1) and the component (3) and/or the component (4) in the composition according to the present embodiment may be at the level where the light-emission action due to the component (1) is desirably exhibited and can be appropriately determined depending on the kind and the like of the components (1) to (4).

In the composition (1) according to the present embodiment, the ratio of the mass of the component (1) to the mass of one or both of the component (3) and the component (4) may be 0.00001 or greater and 10 or less, 0.0001 or greater and 2 or less, or 0.0005 or greater and 1 or less.

From the viewpoints of making the compound (1) difficult to aggregate and exhibiting an excellent light-emitting property, a composition in which the compounding ratio between the component (1) and the component (3) and/or the component (4) is in the above-described range is preferable.

The compounding ratio between the component (1) and the component (4') in the composition according to the present embodiment may be at the level where the light-emission action due to the component (1) is desirably exhibited and can be appropriately determined depending on the kind and the like of the component (1), the component (2) and the component (4').

In the composition (2) according to the present embodiment, the ratio of the mass of the component (1) to the mass of the component (4') may be 0.00001 or greater and 10 or less, 0.0001 or greater and 2 or less, or 0.0005 or greater and 1 or less.

From the viewpoints of making the compound (1) difficult to aggregate and exhibiting an excellent light-emitting property, it is preferable that the compounding ratio between the component (1) and the component (4') is in the above-described range.

The present invention in one aspect thereof provides a composition (3) including the component (1), the component (2), and the component (4'), in which the component (1) is a perovskite compound represented by $CsPbBr_3$, the component (2) is trimethoxyphenylsilane or dodecyltrimethoxysilane, and the molar ratio [Si/B] of the Si element in the component (2) to the metal ion in the component B of the perovskite compound is in a range of 5 to 150.

The present invention in another aspect thereof provides a composition (4) which is the composition (3) further including an organic compound having an amino group, an alkoxy group, and a silicon atom, which is represented by Formula (A5-5), in which the molar ratio [Si/B] of the Si element in the organic compound having an amino group, an alkoxy group, and a silicon atom, which is represented by Formula (A5-5), with respect to the metal ion in the component B of the perovskite compound is in a range of 1 to 20.

The present invention in still another aspect thereof provides a composition (5) including the component (1), the component (2), the component (4'), and an organic compound having an amino group, an alkoxy group, and a silicon atom, which is represented by Formula (A5-5), in which the component (1) is a perovskite compound represented by $CsPbBr_{(3-y)}I_y(0<y<3)$, the component (2) is trimethoxyphenylsilane or 1H,1H,2H,2H-perfluorooctyltriethoxysilane, the molar ratio [Si/B] of the Si element in the component (2) to the metal ion in the component B of the perovskite compound is in a range of 2 to 150, and the molar ratio [Si/B] of the Si element in the organic compound having an amino group, an alkoxy group, and a silicon atom, which is represented by Formula (A5-5), with respect to the metal ion in the component B of the perovskite compound is in a range of 5 to 60.

The present invention in still another aspect thereof provides a composition (6) which is the composition (5) in which the component (2) is a modified product thereof.

The present invention in still another aspect thereof provides a composition (7) including the component (1), the component (2), and the component (3), in which the component (1) is a perovskite compound represented by $CsPbBr_{(3-y)}I_y(0<y<3)$, the component (2) is trimethoxyphenylsilane or 1H,1H,2H,2H-perfluorooctyltriethoxysilane, and the molar ratio [Si/B] of the Si element in the component (2) to the metal ion in the component B of the perovskite compound is in a range of 1 to 50.

<Production Method for Composition>

Hereinbelow, explanations are made with respect to the production method for the composition of the present invention referring to the embodiments thereof. The production method according to the present embodiment enables the production of the composition according to the embodiments of the present invention. Further, the composition of the present invention is not limited to a composition produced by a method for producing a composition according to the embodiment described below.

Production Method for Component (1)>

Hereinafter, the production method for the component (1) will be described.

The production method for the component (1-1) and the production method for the component (1-2) will be described with reference to the embodiments thereof. The production method for the component (1) is not limited to those produced according to the following production method.

[Production Method for Component (1-1)]

The component (1-1) may be a commercially available product or may be produced by a known production method.

Examples of the known production method include a method of heating a single element constituting the semiconductor fine particle or a mixed solution obtained by mixing a compound thereof with a fat-soluble solvent.

The single element constituting the semiconductor fine particle or the compound thereof is not particularly limited, and examples thereof include a metal, an oxide, an acetate, an organometallic compound, a halide, and a nitrate.

Examples of the fat-soluble solvent include a nitrogen-containing compound which contains a hydrocarbon group having 4 to 20 carbon atoms and an oxygen-containing compound which contains a hydrocarbon group having 4 to 20 carbon atoms.

Examples of the hydrocarbon group having 4 to 20 carbon atoms include a saturated aliphatic hydrocarbon group such as an n-butyl group, an isobutyl group, an n-pentyl group, an octyl group, a decyl group, a dodecyl group, a hexadecyl group, or an octadecyl group; an unsaturated aliphatic hydrocarbon group such as an oleyl group; an alicyclic hydrocarbon group such as a cyclopentyl group or a cyclohexyl group; and an aromatic hydrocarbon group such as a phenyl group, a benzyl group, a naphthyl group, or a naphthylmethyl group. Among these, a saturated aliphatic hydrocarbon group or an unsaturated aliphatic hydrocarbon group is preferable as the hydrocarbon group having 4 to 20 carbon atoms.

Examples of the nitrogen-containing compound include amines and amides.

Examples of the oxygen-containing compound include fatty acids.

Among such fat-soluble solvents, a nitrogen-containing compound which contains a hydrocarbon group having 4 to 20 carbon atoms is preferable, and preferred examples thereof include an alkylamine such as n-butylamine, isobutylamine, n-pentylamine, n-hexylamine, octylamine, decylamine, dodecylamine, hexadecylamine, or octadecylamine, and an alkenylamine such as oleylamine.

Such a fat-soluble solvent can be bonded to the surface of the component (1). Examples of the mode of bonding of the fat-soluble solvent to the surface of the component (1) include chemical bonds such as a covalent bond, an ionic bond, a coordination bond, a hydrogen bond, and a van der Waals bond.

The heating temperature of the mixed solution may be appropriately set depending on the kind of a single atom or compound to be used. For example, it is preferable that the heating temperature thereof is set to be in a range of 130° C. to 300° C. and more preferable that the heating temperature thereof is set to be in a range of 240° C. to 300° C. From the viewpoint of easily unifying the crystal structure, it is preferable that the heating temperature is higher than or equal to the above-described lower limit. Further, the heating time may also be appropriately set depending on the kind of a single atom or compound to be used and the heating temperature. Typically, it is preferable that the heating time is set to be in a range of several seconds to several hours and more preferable that the heating time is set to be in a range of 1 minute to 60 minutes.

In the production method for the component (1) according to the present invention, the heated mixed solution is cooled, the supernatant is separated from the precipitate, and the separated component (1) (precipitate) is added to an organic solvent (such as chloroform, toluene, hexane, or n-butanol) to obtain a solution containing the component (1). Alternatively, the heated mixed solution is cooled, the supernatant is separated from the precipitate, a solvent in which nanoparticles are insoluble or sparingly soluble (such as methanol, ethanol, acetone, or acetonitrile) is added to the separated supernatant to generate precipitates, the precipitates are collected and added to the organic solvent to obtain a solution containing the component (1).

[Production Method for Component (1-2)]

The perovskite compound can be produced according to a method of a first embodiment or a second embodiment described below with reference to, for example, the known literature (Nano Lett. 2015, 15, 3692 to 3696, ACSNano, 2015, 9, 4533 to 4542).

First Embodiment of Production Method for Perovskite Compound

For example, the production method for a perovskite compound according to the present invention may be a production method including a step of obtaining a solution (hereinafter, "step S1") and a step of mixing (hereinafter, "step S2"). In step S1, the component B, the component X, and the component A are dissolved in a solvent (1).

In step S2, the solution obtained in step S1 is mixed with a solvent in which the solubility of the perovskite compound therein is lower than that of the solvent (1).

The mixing of the solution obtained in step S1 with a solvent in which the solubility of the perovskite compound therein is lower than that of the solvent (1) allows the perovskite compound to precipitate.

More specifically, in step S1, a compound containing the component B and the component X and a compound containing the component A or a compound containing the component A and the component X are dissolved in the solvent (1).

Hereinafter, the production method including step S1 and step S2 will be described.

The solubility indicates the solubility at the temperature of carrying out the mixing step.

From the viewpoint of stably dispersing the perovskite compound, it is preferable that the production method includes a step of adding capping ligands. It is preferable that the capping ligands are added before the step S2. When a capping ligand is added before step S2, the capping ligand may be added to the solution obtained in step S1, or may be added in advance to the solvent used in step S2. Further, when the capping ligand is added before step S2, the capping ligand may be added to both the solution obtained in step S1 and the solvent used in step S2.

It is preferable that the production method includes a step of removing coarse particles using a method of carrying out centrifugation or filtration after the mixing step described above. The size of the coarse particles to be removed by the removal step is preferably 10 μm or greater, more preferably 1 μm or greater, and still more preferably 500 nm or greater.

Step S2 may be performed by a method (I) in which the solution obtained in step S1 is added dropwise to the solvent used in step S2, or a method (II) in which the solvent used in step S2 is added dropwise to the solution obtained in step S1. From the viewpoint of improving the dispersibility of the component (1-2), it is preferable to employ the method (I) for performing step S2.

It is preferable that stirring is performed during dropwise addition from the viewpoint of improving the dispersibility of the compound (1-2).

In the step of mixing the solution with the solvent in which the solubility of the perovskite compound therein is lower than that of the solvent used in the step of obtaining the solution, the temperature is not particularly limited, but is preferably in a range of −20° C. to 40° C. and more preferably in a range of −5° C. to 30° C. from the viewpoint that the component (1-2) is easily precipitated.

Two kinds of solvents with different solubilities in the solvent for the perovskite compound used in the production method are not particularly limited, and examples thereof include two solvents selected from the group consisting of the following (a) to (k). The following (a) to (k) are the same as those described above.

(a): an ester
(b): a ketone
(c): an ether
(d): an alcohol
(e): a glycol ether
(f): an organic solvent having an amide group
(g): an organic solvent having a nitrile group
(h): an organic solvent having a carbonate group
(i): an organic solvent having a halogenated hydrocarbon group
(j): an organic solvent having a hydrocarbon group
(k): dimethyl sulfoxide As the solvent used in the step of obtaining the solution which is included in the production method, a solvent with a higher solubility in the solvent for the perovskite compound is preferable, and examples thereof include, in a case where the step is performed at room temperature (10° C. to 30° C.), (d) an alcohol, (e) glycol ether, (f) an organic solvent having an amide group, and (k) dimethyl sulfoxide.

As the solvent used in the mixing step which is included in the production method, a solvent with a lower solubility in the solvent for the perovskite compound is preferable, and examples thereof include, in a case where the step is performed at room temperature (10° C. to 30° C.), (a) an ester, (b) a ketone, (c) an ether, (g) an organic solvent having a nitrile group, (h) an organic solvent having a carbonate group, (i) an organic solvent having a halogenated hydrocarbon group, and (j) an organic solvent having a hydrocarbon group.

A difference in solubility between two kinds of solvents with different solubilities is preferably in a range of (100 μg/100 g of solvent) to (90 g/100 g of solvent) and more preferably in a range of (1 mg/100 g of solvent) to (90 g/100 g of solvent). From the viewpoint of adjusting the difference in solubility to be in a range of (100 μg/100 g of solvent) to (90 g/100 g of solvent), for example, in a case where the mixing step is performed at room temperature (10° C. to 30° C.), it is preferable that the solvent used in the step of obtaining the solution is (f) an organic solvent having an amide group or (k) dimethyl sulfoxide, and the solvent used in the mixing step is (i) an organic solvent having a halogenated hydrocarbon group or (j) an organic solvent having a hydrocarbon group.

In a case where the perovskite compound is extracted from the obtained dispersion liquid containing the perovskite compound, it is possible to recover only the perovskite compound by performing solid-liquid separation.

Examples of the above-described solid-liquid separation method include a method of performing filtration or the like and a method of using evaporation of a solvent.

Second Embodiment of Production Method for Perovskite Compound

The production method for the perovskite compound may be a method including a step of adding the component B, the component X and the component A to a solvent having a high temperature to allow these components to be dissolved, thereby obtaining a solution, and a step of cooling the obtained solution.

More specifically, the production method may be a method including a step of adding a compound containing the component B and the component X, and a compound containing the component A or a compound containing the component A and the component X to a solvent having a high temperature to allow these components to be dissolved, thereby obtaining a solution, and a step of cooling the obtained solution.

According to the production method, the perovskite compound according to the present invention can be produced by allowing the perovskite compound according to the present invention to precipitate based on the difference in solubility caused by the difference in temperature.

From the viewpoint of stably dispersing the perovskite compound, it is preferable that the production method includes a step of adding capping ligands.

It is preferable that the production method includes a step of removing coarse particles using a method of carrying out centrifugation or filtration after the cooling step. The size of the coarse particles to be removed by the removal step is preferably 10 μm or greater, more preferably 1 μm or greater, and still more preferably 500 nm or greater.

Here, the solvent having a high temperature may be a solvent having a temperature at which the compound containing the component B and the component X and the compound containing the component A or the component A and the component X are dissolved. For example, a solvent having a temperature of 60° C. to 600° C. is preferable, and a solvent having a temperature of 80° C. to 400° C. is more preferable.

The cooling temperature is preferably in a range of −20° C. to 50° C. and more preferably in a range of −10° C. to 30° C.

The cooling rate is preferably in a range of 0.1° C. to 1500° C./min and more preferably in a range of 10° C. to 150° C./min.

The solvent used in the above production method is not particularly limited as long the solvent can dissolve therein the compound containing the component B and the component X, and the compound containing the component A or the compound containing the component A and the component X, and the effects of the present invention can be achieved. Examples of such a solvent include (a) an ether, (d) an alcohol, (e) a glycol ether, (f) an organic solvent having an amide group, (g) an organic solvent having a nitrile group, (h) an organic solvent having a carbonate group, (i) an organic solvent having a halogenated hydrocarbon group, (j) an organic solvent having a hydrocarbon group, and (k) dimethyl sulfoxide.

In a case where the perovskite compound is extracted from the obtained dispersion liquid containing the perovskite compound, it is possible to recover only the perovskite compound by performing solid-liquid separation.

Examples of the above-described solid-liquid separation method include a method of performing filtration or the like and a method of using evaporation of a solvent.

[Method of Modifying Component (2) or Silazane]

Examples of method of modifying the component (2) or silazane include a method of modification by irradiation with vacuum ultraviolet rays using an excimer lamp or the like, or a method of modification by humidification treatment with water or the like. Among them, the method of modification by humidification treatment is preferable from the viewpoint of forming a protective layer with higher strength.

The wavelength of ultraviolet rays used in the method involving irradiation with ultraviolet rays is typically 10 to 400 nm, preferably 10 to 350 nm, and more preferably 100 to 180 nm. Examples of the light source that generates ultraviolet rays include a metal halide lamp, a high-pressure mercury lamp, a low-pressure mercury lamp, a xenon arc lamp, a carbon arc lamp, an excimer lamp, and a UV laser beam.

The method involving humidification treatment may be a method of reacting water vapor with the component (2) or a silazane.

In a case where the component (2) or the silazane in the composition is modified by the humidification treatment, for example, the composition may be allowed to stand or be stirred for a certain time under the temperature and humidity conditions described below.

From the viewpoint of improving the dispersibility of the component (2) or the silazane contained in the composition, it is preferable that stirring is carried out.

The temperature in the humidification treatment may be a temperature at which the modification proceeds sufficiently. For example, the temperature is preferably 5 to 150° C., more preferably 10 to 100° C., and more preferably 15 to 80° C.

The humidity during the humidification treatment may be a humidity at which the moisture is sufficiently supplied to the component (2) or the compound containing the silazane in the composition and is in a range of 30% to 100%, preferably in a range of 40% to 95%, and more preferably in a range of 60% to 90%.

In the present specification, the "humidity" indicates the relative humidity at a temperature at which the humidification treatment is performed.

The time required for the humidification treatment may be a time at which the modification sufficiently proceeds and is in a range of 10 minutes to 1 week, preferably in a range of 1 hour to 5 days, and more preferably in a range of 12 hours to 3 days.

[Production Method for Composition Containing Component (1), Component (2), and Component (3)]

For example, the production method for a composition containing the component (1), the component (2), and the component (3) may be the following production method (a1) or the following production method (a2).

Production method (a1): a production method for a composition, which includes a step of mixing the component (1) with the component (3), a step of mixing the resulting mixture of the component (1) and the component (3) with the component (2).

Production method (a2): a production method for a composition, which includes a step of mixing the component (1) with the component (2), a step of mixing the resulting mixture of the component (1) and the component (2) with the component (3).

In the production method (a1), it is preferable that the component (1) is dispersed in the component (3). The production method (a1) may be, for example, a production method for a composition, which includes a step of dispersing the component (1) in the component (3), a step of mixing the resulting dispersion with the component (2).

In the present embodiment, for producing the composition containing the modified product of the compound represented by Formula (X) as the component (2), the following production method (a3) or the following production method (a4) may be employed.

In the following explanations, among species of the component (2), only the compound represented by Formula (X) may be referred to as "component (2')". By modifying the component (2'), the modified product can be obtained.

Production method (a3): a production method for a composition, which includes a step of mixing the component (1) with the component (3), a step of mixing the resulting mixture of the component (1) and the component (3) with the component (2'), and a step of modifying the component (2') contained in the mixture of the component (1), the component (2') and the component (3).

Production method (a4): a production method for a composition, which includes a step of mixing the component (1) with the component (2'), a step of mixing the resulting mixture of the component (1) and the component (2') with the component (3), and a step of modifying the component (2') contained in the mixture of the component (1), the component (2') and the component (3).

From the viewpoint of improving the dispersibility, it is preferable that stirring is performed in the mixing step included in the above-described production method.

The temperature in the mixing step included in the above-described production method is not particularly limited, but is preferably in a range of 0° C. to 100° C. and more preferably in a range of 10° C. to 80° C. from the viewpoint of uniformly mixing the mixture.

As for the method for modification in the modifying step included in the above-described production method, the above-described method can be used.

From the viewpoint of improving the dispersibility of the component (1), it is preferable that the method for producing a composition is the method (a1) or the method (a3).

When the component (1) is the perovskite compound, the component (2) and the component (3) may be mixed in any of the steps involved in the production method for the component (1).

For example, the production method for a composition containing the component (1), the component (2) and the component (3) may be the following production method (a5) or the following production method (a6).

Production method (a5): a production method including a step of dissolving the component (2) and the component (3) as well as a compound containing the component B and the component X, and a compound containing the component A or a compound containing the component A and the component X in the component (3) to obtain a solution, and a step of mixing the obtained solution with a solvent in which the solubility of the component (1) therein is lower than that of the component (3).

Production method (a6): a production method including a step of adding the component (2) and the component (3) as well as a compound containing the component B and the component X, and a compound containing the component A or a compound containing the component A and the component X to the component (3) having a high temperature to allow these components to be dissolved in the component (3), and a step of cooling the resulting solution.

In the present embodiment, the production method for a composition containing the modified product of the component (2) may be the following production method (a7) or the following production method (a8).

Production method (a7): a production method including a step of dissolving the component (2') as well as a compound containing the component B and the component X, and a compound containing the component A or a compound containing the component A and the component X in the component (3) to obtain a solution, a step of mixing the obtained solution with a solvent in which the solubility of the component (1) therein is lower than that of the component (3), and a step of modifying the component (2') contained in the mixture of the component (1), the component (2') and the component (3).

Production method (a8): a production method including a step of adding the component (2') as well as a compound containing the component B and the component X, and a compound containing the component A or a compound containing the component A and the component X to the component (3) having a high temperature to allow these components to be dissolved in the component (3), a step of cooling the resulting mixture, and a step of modifying the component (2') contained in the mixture of the component (1), the component (2') and the component (3).

The conditions of each step included in these production methods are the same as those described above in relation to the first and second embodiments of the production method for the perovskite compound.

[Production Method for Composition Containing Component (1), Component (2), Component (3), and Component (5)]

For example, the production method for a composition containing the component (1), the component (2), the component (3), and the component (5) may be the same as the above-described production method for a composition containing the component (1), the component (2), and the component (3) except that the component (5) is mixed in any of the steps included in the production method for a composition containing the component (1), the component (2), and the component (3).

From the viewpoint of improving the dispersibility of the compound (1), it is preferable that the component (5) is mixed in any of the steps involved in the production method for the component (1). For example, the production is preferably performed by the production method (b1), the production method (b2), the production method (b3), or the production method (b4), which are described below.

Production method (b-1): a production method including a step of dissolving the component (2) and the component (5) as well as a compound containing the component B and the component X, and a compound containing the component A or a compound containing the component A and the component X in the component (3) to obtain a solution, and a step of mixing the obtained solution with a solvent in which the solubility of the component (1) therein is lower than that of the component (3).

Production method (b2): a production method including a step of adding the component (2) and the component (5) as well as a compound containing the component B and the component X, and a compound containing the component A or the component A and the component X to the component (3) having a high temperature to allow these components to be dissolved in the component (3), thereby obtaining a solution, and a step of cooling the obtained solution.

Production method (b3): a production method including a step of dissolving the component (2') and component (5) as well as a compound containing the component B and the component X, and a compound containing the component A or a compound containing the component A and the component X in the component (3) to obtain a solution, a step of mixing the obtained solution with a solvent in which the solubility of the component (1) therein is lower than that of the component (3), and a step of modifying the component (2') contained in the mixture of the component (1), the component (2') and the component (3).

Production method (b4): a production method including a step of adding the component (2') and the component (5) as well as a compound containing the component B and the component X, and a compound containing the component A or a compound containing the component A and the component X to the component (3) having a high temperature to allow these components to be dissolved in the component (3), thereby obtaining a solution, a step of cooling the solution, and a step of modifying the component (2') contained in the mixture of the component (1), the component (2') and the component (3).

[Production Method for Composition Containing Component (1), Component (2), and Component (4)]

The production method for a composition containing the component (1), the component (2), and the component (4) may be a method including mixing the component (1), the component (2), and the component (4).

From the viewpoint of improving the dispersibility of the component (1), it is preferable that stirring is performed in the step of mixing the component (1), the component (2) and the component (4).

The temperature in the step of mixing the component (1), the component (2) and the component (4) is not particularly limited, but is preferably in a range of 0° C. to 100° C. and more preferably in a range of 10° C. to 80° C. from the viewpoint of uniformly mixing the mixture.

For example, the production method for a composition containing the component (1), the component (2) and the component (4) may be the following production method (c1), the following production method (c2) or the following production method (c3).

Production method (c1): a production method including a step of dispersing the component (1) in the component (4), and a step of mixing the resulting dispersion with the component (2).

Production method (c2): a production method including a step of dispersing the component (2) in the component (4), and a step of mixing the resulting dispersion with the component (1).

Production method (c3): a production method including a step of dispersing a mixture of the component (1) and the component (2) in the component (4).

Among the production methods (c1) to (c3), the production method (c1) is preferable from the viewpoint of improving the dispersibility of the compound (1). According to the method described above, the composition of the present invention can be obtained as a mixture of the dispersion in which the component (1) is dispersed in the component (4) with the component (2).

In the steps of obtaining each dispersion included in the production methods (c1) to (c3), the component (4) may be added dropwise to the component (1) and/or the component (2), or the component (1) and/or the component (2) may be added dropwise to the component (4).

From the viewpoint of improving the dispersibility, it is preferable that the component (1) and/or the component (2) is added dropwise to the component (4).

In each mixing step included in the production methods (c1) to (c3), the component (1) or the component (2) may be added dropwise to the dispersion, or the dispersion may be added dropwise to the component (1) or the component (2).

From the viewpoint of improving the dispersibility, it is preferable that the component (1) or the component (2) is added dropwise to the dispersion.

In a case where a polymer is employed as the component (4), the polymer may be a polymer in a state of being dissolved in a solvent.

The solvent in which the above-described polymer is dissolved is not particularly limited as long the polymer (resin) can be dissolved in the solvent, but a solvent in which the component (1) described above is unlikely to be dissolved is preferable.

Examples of the solvent in which the above polymer is dissolved include (a) an ester, (b) a ketone, (c) an ether, (d) an alcohol, (e) a glycol ether, and (f) an organic solvent having an amide group, (g) an organic solvent having a nitrile group, (h) an organic solvent having a carbonate group, (i) an organic solvent having a halogenated hydrocarbon group, (j) an organic solvent having a hydrocarbon group, and (k) dimethyl sulfoxide.

Among these, (a) an ester, (b) a ketone, (c) an ether, (g) an organic solvent having a nitrile group, (h) a carbonate-based organic solvent, (i) an organic solvent having a halogenated hydrocarbon group, (j) an organic solvent having a hydrocarbon group are preferable, because these have a low polarity and are considered to be unlikely to dissolve the perovskite compound according to the present invention. More preferable examples are (i) an organic solvent having a halogenated hydrocarbon group, and (j) an organic solvent having a hydrocarbon group.

The production method for a composition containing the component (1), the component (2) and the component (4) may be the following production method (c4) or the following production method (c5).

Production method (c4): a production method for a composition, which includes a step of dispersing the component (1) in the component (3) to obtain a dispersion, a step of mixing the obtained dispersion with the component (4) to obtain a mixture, and a step of mixing the obtained mixture with the component (2).

Production method (c5): a production method for a composition, which includes a step of dispersing the component (1) in the component (3) to obtain a dispersion, a step of mixing the obtained dispersion with the component (2') to obtain a mixture, a step of modifying the component (2') contained in the mixture, and a step of mixing the resulting mixture with the component (4).

[Production Method for Composition Containing Component (1), Component (2), Component (4), and Component (5)]

The production method for a composition containing the component (1), the component (2), the component (4), and the component (5) may be the same as the above-described production method for a composition containing the component (1), the component (2), and the component (4), except for the addition of the component (5).

The component (5) may be added in any step included in the production method for the component (1) described above or may be added in any step included in the production method for a composition containing the component (1), the component (2), and the component (4) described above.

From the viewpoint of improving the dispersibility of the component (1), it is preferable that the component (5) is mixed in any of the steps involved in the production method for the component (1).

In the production method for a composition containing the component (1), the component (2), the component (4), and the component (5), the component (3) as a solvent may be used. This enables production of the composition according to the present embodiment in the form of: a mixture of a dispersion in which the component (1) that is at least partially coated with the component (5) is dispersed in the component (3), with the component (4); or a mixture of a dispersion in which the component (1) that is at least partially coated with the component (5) is dispersed together with the component (2) in the component (3), with the component (4).

[Production Method for Composition Containing Component (1), Component (2), and Component (4') in which Total Content Ratio of Component (1), Component (2), and Component (4') is 90% by Mass or Greater with Respect to Total Mass of Composition]

For example, the production method for a composition containing the component (1), the component (2), and the component (4') in which the total content ratio of the component (1), the component (2), and the component (4') is 90% by mass or greater with respect to the total mass of the composition may be the following production method (Y).

Production method (Y): a production method including a step of mixing the component (1), the component (2) and the polymerizable compound, or a production method including a step of mixing the component (1), the component (2) and the polymer dissolved in a solvent, and a step of removing the solvent.

As the mixing step included in the production method, the same mixing method as the method for producing the composition containing the component (1), the component (2), and the component (4) described above can be used.

Examples of the production method include the following production methods (d1) to (d6).

Production method (d1): a production method including a step of dispersing the component (1) in the polymerizable compound to obtain a dispersion, a step of mixing the obtained dispersion and the component (2), and a step of polymerizing the polymerizable compound.

Production method (d2): a production method including a step of dispersing the component (1) in the polymer dissolved in a solvent to obtain a dispersion, a step of mixing the obtained dispersion and the component (2), and a step of removing the solvent.

Production method (d3): a production method including a step of dispersing the component (2) in the polymerizable compound to obtain a dispersion, a step of mixing the obtained dispersion and the component (1), and a step of polymerizing the polymerizable compound.

Production method (d4): a production method including a step of dispersing the component (2) in the polymer dissolved in a solvent to obtain a dispersion, a step of mixing the obtained dispersion and the component (1), and a step of removing the solvent.

Production method (d5): a production method including a step of dispersing the mixture of the component (1) and the component (2) in the polymerizable compound, and a step of polymerizing the polymerizable compound.

Production method (d6): a production method including a step of dispersing the mixture of the component (1) and the component (2) in the polymer dissolved in a solvent, and a step of removing the solvent.

The step of removing the solvent included in the production method may be a step of allowing the solvent to stand at room temperature so as to be naturally dried or a step of evaporating the solvent by heating or drying under reduced pressure using a vacuum dryer.

For example, the solvent can be removed by drying at a temperature of 0° C. to 300° C. for 1 minute to 7 days.

The step of polymerizing the polymerizable compound included in the production method can be performed by appropriately using a known polymerization reaction such as radical polymerization.

For example, in a case of the radical polymerization, the polymerization reaction can be allowed to proceed by adding a radical polymerization initiator to the mixture of the component (1), the component (2), and the polymerizable compound to generate a radical.

The radical polymerization initiator is not particularly limited as long as the effects of the present invention can be achieved, and examples thereof include a photoradical polymerization initiator.

As the photoradical polymerization initiator, bis(2,4,6-trimethylbenzoyl)-phenylphosphine oxide is exemplary example.

[Production Method for Composition Containing Component (1), Component (2), Component (4'), and Component (5) in which Total Content Ratio of Component (1), Component (2), Component (4'), and Component (5) is 90% by Mass or Greater with Respect to Total Mass of Composition]

The production method for the composition which contains the component (1), the component (2), the component (4'), and the component (5) and in which the total amount of the component (1), the component (2), the component (4'), and the component (5) is 90% by mass or greater with respect to the total mass of the composition may be, for example, the same as the above-described production method for the composition which contains the component (1), the component (2), and the component (4') and in which the total amount of the component (1), the component (2), and the component (4') is 90% by mass or greater with respect to the total mass of the composition except that the component (5) is added in any steps included in the production method for the composition which contains the component (1), the component (2), and the component (4') and in which the total amount of the component (1), the component (2), and the component (4') is 90% by mass or greater with respect to the total mass of the composition.

The component (5) may be added in any steps included in the method for producing the component (1) described above. The component (5) may be added in the step of mixing the component (1), the component (2), and the polymerizable compound. Also, the component (5) may be added in the step of mixing the component (1), the component (2), and the polymer dissolved in a solvent.

From the viewpoint of improving the dispersibility of the component (1), it is preferable that the component (5) is mixed in any of the steps involved in the production method for the component (1).

[Measurement of Perovskite Compound]

The amount of the component (1) in the composition according to the present embodiment is measured using ICP-MS (e.g., ELAN DRCII, manufactured by PerkinElmer, Inc.) and ion chromatography (Integrion, manufactured by ThermoFisher Scientific Inc.).

A sample solution used for the measurement is obtained by adding the component (1) to a good solvent therefor, such as N,N-dimethylformamide.

[Measurement of Emission Spectrum]

The emission spectrum of the composition containing the component (1) is measured with excitation light having a wavelength of 450 nm at room temperature in the atmosphere using an absolute PL quantum yield measuring device (e.g., C9920-02, manufactured by Hamamatsu Photonics K. K.).

In the composition containing the component (1), the component (2), and the component (3), the emission spectrum is measured by adjusting the concentration of the component (1) contained in the composition to 1500 ppm (μg/g).

[Measurement of Quantum Yield]

The quantum yield of the composition containing the component (1) is measured with excitation light having a wavelength of 450 nm at room temperature in the atmosphere using an absolute PL quantum yield measuring device (e.g., C9920-02, manufactured by Hamamatsu Photonics K. K.).

In the composition containing the component (1), the component (2), and the component (3), the quantum yield is measured by adjusting the concentration of the component (1) contained in the composition to 200 ppm (μg/g) using toluene.

In the composition containing the component (1), the component (2), and the component (4) as well, the quantum yield is measured by adjusting the concentration of the component (1) contained in the composition to 1000 μg/mL.

The same applies to a case where the component (4) is replaced with the component (4').

In the composition according to the present embodiment, the quantum yield measured according to the above-described measuring method may be 25% or greater, 32% or greater, 40% or greater, 45% or greater, or 50% or greater.

In the composition according to the present embodiment, the quantum yield measured according to the above-described measuring method may be 100% or less.

The above-described upper limit values and lower limit values can be arbitrarily combined.

According to one aspect of the present invention, the quantum yield measured according to the above-described measuring method in the composition according to the present embodiment is preferably in a range of 25% to 100%, more preferably in a range of 32% to 100%, still more preferably in a range of 40% to 100%, still more preferably in a range of 45% to 100%, and particularly preferably in a range of 50% to 100%.

[Evaluation of Durability with Respect to Water Vapor]

(Evaluation 1)

In Evaluation 1, the composition according to the present embodiment is placed in a thermohygrostat bath under a constant condition of a temperature of 60° C. and a relative humidity of 80% or a constant condition of a temperature of 65° C. and a relative humidity of 95%, and a test for the durability with respect to water vapor is performed. Then, the quantum yields of the composition before and after the test for the durability are measured. The test piece to be used is a small piece of the composition having a thickness of 100 μm and a size of 1 cm×1 cm.

The durability with respect to water vapor is evaluated in terms of retention ratio calculated based on the following equation (S1).

$$\text{Retention ratio}=100\times\text{quantum yield after X days of durability test/quantum yield before durability test} \quad (S1)$$

wherein X represents the number of test days.

In the composition according to the present embodiment, the retention ratio when the number of test days is 4 days (X=4) may be more than 50%, may be 60% or greater, and may be 70% or greater.

In the composition according to the present embodiment, the retention ratio when the number of test days is 4 days (X=4) may be 100% or less.

The above-described upper limit values and lower limit values can be arbitrarily combined.

According to one aspect of the present invention, in the composition according to the present embodiment, the retention ratio when the number of test days is 4 days (X=4) may be more than 50% and 100% or less, may be 60% or greater and 100% or less, and may be 70% or greater and 100% or less.

In the composition according to the present embodiment, the retention ratio when the number of test days is 5 days (X=5) may be more than 50%, may be 60% or greater, and may be 70% or greater.

In the composition according to the present embodiment, the retention ratio when the number of test days is 5 days (X=5) may be 100% or less.

The above-described upper limit values and lower limit values can be arbitrarily combined.

According to one aspect of the present invention, in the composition according to the present embodiment, the retention ratio when the number of test days is 5 days (X=5) may be more than 50% and 100% or less, may be 60% or greater and 100% or less, and may be 70% or greater and 100% or less.

(Evaluation 2)

In Evaluation 2, the composition according to the present embodiment is placed in a thermohygrostat bath under a constant condition of a temperature of 25° C. and a relative humidity of 80%, and a test for the durability with respect to water vapor is performed. Then, the emission spectra of the composition before and after the test for the durability are measured. The sample to be used is a 5-mL liquid composition.

The durability with respect to water vapor is evaluated in terms of peak shift calculated based on the following equation (S2).

Peak shift=|Peak wavelength of emission spectrum before durability test−Peak wavelength of emission spectrum after 1 day of durability test| (S2)

In the composition according to the present embodiment, the peak shift may be 60 or less, 40 or less, or 20 or less.

According to another aspect of the present invention, in the composition according to the present embodiment, from the viewpoint of improving the durability after the test for the durability with respect to water vapor for 1 day measured using the above-described measuring method, the peak shift is preferably in a range of 0 to 60, more preferably in a range of 0 to 30, and still more preferably in a range of 0 to 10.

<Film>

A film according to the present invention is a film formed of the composition which contains the component (1), the component (2), and the component (4') and in which the total content ratio of the component (1), the component (2), and the component (4') is 90% by mass or greater with respect to the total mass of the composition. The composition may contain the compound (5).

The shape of the film is not particularly limited, and the film can be formed in a sheet shape or a bar shape. In the present specification, the "bar shape" indicates a shape having an anisotropy. As the shape having an anisotropy, a shape of a plate having sides with different lengths is an exemplary example.

The thickness of the film may be in a range of 0.01 μm to 1000 mm, in a range of 0.1 μm to 10 mm, or in a range of 1 μm to 1 mm.

The thickness of the film in the present specification can be obtained by measuring the thicknesses of the film at arbitrary three points using a micrometer and calculating the average value of the measured values.

The film may be formed of a single layer or a plurality of layers. In a case of a plurality of layers, the same kind of composition according to the embodiment may be used for each layer or different kinds of layers according to the embodiment may be used for respective layers.

The film can be obtained as a film formed on a substrate according to a method (i) to (iv) of producing a laminated structure described below. Further, the film can be obtained by being peeled off from the substrate.

<Laminated Structure>

The laminated structure according to the present invention has a plurality of layers, at least one of which is the above-described film.

Among the plurality of layers included in the laminated structure, examples of layers other than the above-described film include optional layers such as a substrate, a barrier layer, and a light scattering layer.

The shape of the film to be laminated is not particularly limited, and the film can be formed in an arbitrary shape such as a sheet shape or a bar shape.

(Substrate)

The layer which may be included in the laminated structure according to the present invention is not particularly limited, and examples thereof include a substrate.

The substrate is not particularly limited and may be a film. From the viewpoint of extracting light at the time of light emission, a transparent substrate is preferable. As the substrate, plastics such as polyethylene terephthalate or known materials such as glass can be used.

For example, the above-described film may be provided on the substrate in the laminated structure.

FIG. 1 is a cross-sectional view schematically showing the configuration of the laminated structure according to the present embodiment. A film 10 according to the present embodiment may be provided between a first substrate 20 and a second substrate 21 in a first laminated structure 1a. The film 10 is sealed by a sealing layer 22.

According to one aspect of the present invention, the laminated structure 1a includes the first substrate 20, the second substrate 21, the film 10 according to the present embodiment which is positioned between the first substrate 20 and the second substrate 21, and the sealing layer 22, and is configured such that the sealing layer is disposed on a surface that does not contact with the first substrate 20 and the second substrate 21 of the film 10.

(Barrier Layer)

The layer which may be included in the laminated structure according to the present invention is not particularly limited, and examples thereof include a barrier layer. The laminated structure may include a barrier layer because the barrier layer protects the above-described composition from water vapor in outside air or the air in the atmosphere.

The barrier layer is not particularly limited, and a transparent barrier layer is preferable from the viewpoint of extracting emitted light. For example, a polymer such as polyethylene terephthalate or a known barrier layer such as a glass film can be employed.

(Light Scattering Layer)

The layer which can be included in the laminated structure according to the present invention is not particularly limited, and examples thereof include a light scattering layer. From the viewpoint of efficiently absorbing incident light, the laminated structure may include a light scattering layer.

The light scattering layer is not particularly limited, and a transparent light scattering layer is preferable from the viewpoint of extracting emitted light. For example, light scattering particles such as silica particles or a known light scattering layer such as an amplified diffusion film can be employed.

<Light-Emitting Device>

A light-emitting device according to the present invention can be obtained by combining the composition according to the embodiment of the present invention or the laminated structure described above with a light source. The light-emitting device is a device that extracts light by irradiating the composition or the laminated structure placed on the back stage with light emitted from the light source and allowing the composition or the laminated structure to emit light. The laminated structure in the light-emitting device may include layers such as a reflective film, a diffusion film, a brightness-reinforcing film, a prism sheet, a light-guiding plate, and a medium material layer between elements.

According to one aspect of the present invention, a light-emitting device 2 is formed by laminating a prism sheet 50, a light-guiding plate 60, the first laminated structure 1a, and a light source 30 in this order.

(Light Source)

The light source constituting the light-emitting device according to the present invention is not particularly limited. However, from the viewpoint of allowing the composition, or semiconductor fine particles in the laminated structure to emit light, a light source having an emission wavelength of 600 nm or less is preferable. Examples of the light source include known light sources, for example, a light-emitting diode (LED) such as a blue light-emitting diode, a laser, and an EL.

(Reflective Film)

The light-emitting device according to the present invention is not particularly limited and may include a light reflection member for irradiating the composition or the laminated structure with light from the light source.

The reflective film is not particularly limited and may contain suitable optional known materials such as a reflecting mirror, a reflective particle film, a reflective metal film, and a reflector.

(Diffusion Film)

The light-emitting device according to the present invention is not particularly limited and may include a diffusion film for diffusing light emitted from the light source or light emitted from the composition. Examples of the diffusion film include optional diffusion films known in the technical field such as an amplified diffusion film.

(Brightness-Reinforcing Unit)

The light-emitting device according to the present invention is not particularly limited and may include a brightness-reinforcing unit that reflects partial light to be returned to the direction in which the light is transmitted.

(Prism Sheet)

A prism sheet typically includes a base material portion and a prism portion. Further, the base material portion may not be provided depending on a member adjacent to the base material portion. The prism sheet is obtained by being bonded to a member adjacent thereto through an optional appropriate adhesion layer (for example, an adhesive layer or a pressure sensitive adhesive layer). The prism sheet is configured such that a plurality of unit prisms which become projections are arranged in parallel with one another on a side (rear side) opposite to a viewing side. Light transmitted through the prism sheet is likely to be focused by arranging the projections of the prism sheet toward the rear side. Further, in a case where the projections of the prism sheet are arranged toward the rear side, the quantity of light to be reflected without being incident on the prism sheet is small compared to a case where the projections are arranged toward the viewing side, and a display with high brightness can be obtained.

(Light-Guiding Plate)

As the light-guiding plate, an optional appropriate light-guiding plate can be used. For example, a light-guiding plate in which a lens pattern is formed on the rear side such that light from the lateral direction can be deflected in the thickness direction or a light-guiding plate in which a prism shape or the like is formed on the rear side and/or the viewing side is used.

(Medium Material Layer Between Elements)

The light-emitting device according to the present invention is not particularly limited and may include a layer formed of one or more medium materials on an optical path between elements (layers) adjacent to each other. Examples of one or more mediums include vacuum, air, gas, an optical material, an adhesive, an optical adhesive, glass, a polymer, a solid, a liquid, a gel, a curing material, an optical bonding material, a refractive index matching or refractive index mismatching material, a refractive index gradient material, a cladding or anti-gladding material, a spacer, a silica gel, a brightness-reinforcing material, a scattering or diffusing material, a reflective or anti-reflective material, a wavelength selective material, a wavelength selective anti-reflective material, a color filter, and other suitable media known in the technical field. However, the present invention is not limited to these, and optional suitable materials may be employed.

Specific examples of the light-emitting device according to the present invention include those provided with wavelength conversion materials for an EL display and a liquid crystal display.

Specific examples thereof include:

a backlight (E1) (on-edge type backlight) that converts blue light to green light or red light by putting the composition of the present invention into a glass tube or the like so as to be sealed and disposing the glass tube or the like between a light-guiding plate and a blue light-emitting diode serving as a light source such that the glass tube or the like is along with an end surface (side surface) of the light-guiding plate;

a backlight (E2) (surface-mounting type backlight) that converts blue light to be applied to a sheet after passing through a light-guiding plate from a blue light-emitting diode placed on an end surface (side surface) of the light-guiding plate to green light or red light by forming the sheet using the composition of the present invention and placing a film obtained by interposing the sheet between two barrier films so as to be sealed on the light-guiding plate;

a backlight (E3) (on-chip type backlight) that converts blue light to be applied to green light or red light by dispersing the composition of the present invention in a resin or the like and placing the resin or the like in the vicinity of a light-emitting unit of a blue light-emitting diode; and a backlight (E4) that converts blue light to be applied from a light source to green light or red light by dispersing the composition of the present invention in a resist and placing the resist on a color filter.

Further, specific examples of the light-emitting device according to the present invention include an illumination emitting white light which is obtained by forming the composition according to the embodiment of the present invention, disposing the composition on a back stage of a blue light-emitting diode serving as a light source, and converting blue light to green light or red light.

<Display>

Figure 2:
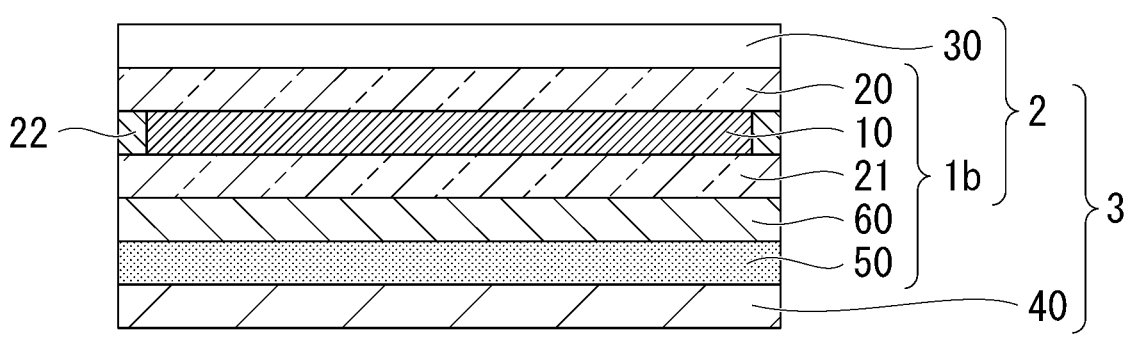
FIG. 2 is a cross-sectional view showing an embodiment of a display according to the present invention.

As shown in FIG. 2, a display 3 according to the present embodiment includes a liquid crystal panel 40 and the light-emitting device 2 described above in this order from the viewing side. The light-emitting device 2 includes a second laminated structure 1*b* and a light source 30. The second laminated structure 1*b* is formed of the first laminated structure 1*a* which further includes a prism sheet 50 and a light-guiding plate 60.

The liquid crystal panel typically includes a liquid crystal cell; a viewing-side polarizing plate disposed on a viewing side of the liquid crystal cell; and a rear-surface-side polarizing plate disposed on a rear surface side of the liquid crystal cell. The display may further include other appropriate optional members.

According to one aspect of the present invention, the display is the liquid crystal display 3 obtained by laminating the liquid crystal panel 40, the prism sheet 50, the light-guiding plate 60, the first laminated structure 1*a*, and the light source 30 in this order.

<Liquid Crystal Panel>

The liquid crystal panel typically includes a liquid crystal cell; a viewing-side polarizing plate disposed on a viewing side of the liquid crystal cell; and a rear-surface-side polarizing plate disposed on a rear surface side of the liquid crystal cell. The viewing-side polarizing plate and the rear-surface-side polarizing plate can be disposed such that respective absorption axes are substantially orthogonal or parallel to each other.

(Liquid Crystal Cell)

The liquid crystal cell includes a pair of substrates; and a liquid crystal layer serving as a display medium interposed between the substrates. In a typical configuration, a color filter and a black matrix are provided on one substrate.

Further, a switching element that controls electro-optical characteristics of a liquid crystal; a scanning line that sends a gate signal to the switching element and a signal line that sends a source signal to the switching element; and a pixel electrode and a counter electrode are provided on the other substrate. The interval (cell gap) between the substrates can be controlled by a spacer or the like. An alignment film formed of polyimide can be provided on a side of the substrate that contacts the liquid crystal layer.

(Polarizing Plate)

The polarizing plate typically includes a polarizer; and a protective layer disposed on both sides of the polarizer.

As the polarizer, an appropriate optional polarizer is used. Examples thereof include a polarizer obtained by adsorbing a dichroic material such as iodine or a dichroic dye on a hydrophilic polymer film such as a polyvinyl alcohol-based film, a partially formalized polyvinyl alcohol-based film, or an ethylene-vinyl acetate copolymer-based partially saponified film, followed by uniaxially stretching the resulting film; and a polyene-based alignment film such as a dehydrated product of polyvinyl alcohol or a dehydrochlorinated product of polyvinyl chloride. Among these, an example particularly preferable from the viewpoint of a high dichroic ratio is a polarizer obtained by adsorbing a dichroic material such as iodine on a polyvinyl alcohol-based film, followed by uniaxially stretching the resulting film.

As the applications of the composition according to the present invention, a wavelength conversion material for a laser diode is an exemplary example.

<LED>

The composition according to the present invention can be used as a material for a light-emitting layer of an LED.

As the LED containing the composition of the present invention, an LED which has a structure in which the composition of the present invention and conductive particles such as ZnS are mixed and laminated in a film shape, an n-type transport layer is laminated on one surface, and a p-type transport layer is laminated on the other surface and emits light by circulating the current so that positive holes of a p-type semiconductor and electrons of an n-type semiconductor cancel the charge in the particles in the semiconductor fine particle (1) and the silazane or modified product thereof (2) contained in the bonding surface of the composition is an exemplary example.

<Solar Cell>

The composition of the present invention can be used as an electron transport material contained in an active layer of a solar cell.

The configuration of the solar cell is not particularly limited, and examples thereof include a solar cell which includes a fluorine-doped tin oxide (FTO) substrate, a titanium oxide dense layer, a porous aluminum oxide layer, an active layer containing the composition of the present invention, a hole transport layer such as 2,2',7,7'-tetrakis-(N,N'-di-p-methoxyphenylamine)-9,9'-spirobifluorene (Spiro-OMeTAD), and a silver (Ag) electrode in this order.

The titanium oxide dense layer has a function of transporting electrons, an effect of suppressing the roughness of FTO, and a function of suppressing movement of inverse electrons.

The porous aluminum oxide layer has a function of improving the light absorption efficiency.

The composition of the present invention which is contained in the active layer plays a role of charge separation and electron transport.

<Method of Producing Laminated Structure>

Examples of the method of producing a laminated structure include the following methods (i), (ii), (iii) and (iv):

Production method (i): a production method for a laminated structure, which includes a step of mixing the component (1), the component (2), the component (3) and the component (4'), a step of coating a substrate with the resulting mixture, and a step of removing the solvent.

Production method (ii): a production method for a laminated structure, which includes a step of mixing the component (1), the component (2) and the polymer dissolved in a solvent, a step of coating a substrate with the resulting mixture, and a step of removing the solvent.

Production method (iii): a production method for a laminated structure, which includes a step of laminating a mixture, which contains the component (1), the component (2), and the component (4') and in which the total amount of the component (1), the component (2), and the component (4') is 90% by mass or greater with respect to the total mass of the mixture, on a substrate.

Production method (iv): a production method including a step of mixing the component (1), the component (2) and the polymerizable compound, and a step of coating a substrate with the resulting mixture, and a step of allowing the polymerizable compound to polymerize.

With respect to the following steps:

the mixing step and the step of removing the solvent which are included in the production method (i), the mixing step and the step of removing the solvent which are included in the production method (ii), and the mixing step and the step of polymerizing the polymerizable compound which are included in the production method (iv), these can be designed to be the same steps as those included in the above-described method for producing the composition which contains the component (1), the component (2), and the component (4') and in which the total amount of the component (1), the component (2), and the component (4') is 90% by mass with respect to the total mass of the composition.

Each step of coating a substrate with the mixture, included in the production methods (i), (ii), and (iv) is not particularly limited and can be carried out using a known coating method such as a gravure coating method, a bar coating method, a printing method, a spray method, a spin coating method, a dip method, or a die coating method.

In the step of laminating the mixture on the substrate, included in the production method (iii), an optional adhesive can be used.

The adhesive is not particularly limited as long as the component (1) and the component (2) are not dissolved therein, and a known adhesive can be used.

The method of producing a laminated structure may be a production method including a step of further laminating an optional film on the laminated structure obtained by the production methods (i) to (iv).

Examples of the film to be laminated include a reflective film and a diffusion film. An optional adhesive can be used in the step of laminating the film on the substrate.

The above-described adhesive is not particularly limited as long as the component (1) and the component (2) are not dissolved therein, and a known adhesive can be used.

<Method of Producing Light-Emitting Device>

A production method including a step of placing the light source, the composition on the optical path of a back stage from the light source, or the laminated structure is an exemplary example.

Further, the technical scope of the present invention is not limited to the above-described embodiments, and various modifications can be added within the range not departing from the spirit of the present invention.

Further, the technical scope of the present invention is not limited to the above-described embodiments, and various modifications can be added within the range not departing from the spirit of the present invention.

EXAMPLES

Hereinbelow, the present invention will be described with reference to Examples which, however, should not be construed as limiting the present invention.

(Measurement of Concentration of Perovskite Compound in Dispersion Liquid)

N,N-dimethylformamide was added to the dispersion liquid described below to dissolve the semiconductor fine particles, thereby obtaining a sample solution.

Using the obtained sample solution, the measurement was performed with ICP-MS (ELAN DRCII, manufactured by PerkinElmer, Inc.) and ion chromatography (Integrion, manufactured by ThermoFisher Scientific Inc.).

(Measurement of Average Maximum Feret Diameter of Semiconductor Fine Particles)

The semiconductor fine particles were observed using a transmission electron microscope (JEM-2200FS, manufactured by JEOL Ltd.). The sample for observation was one collected on a grid provided with a support film from the dispersion liquid described below. The sample for observation was observed by setting the acceleration voltage to 200 kV.

As the average maximum Feret diameter, an average value of the maximum ferret diameters of 20 particles of the perovskite compound was adopted.

(Analysis of Crystal Structure of Perovskite Compound)

X-ray diffraction pattern of the perovskite compound was measured using an X-ray diffraction measuring device (XRD, Cu Kα ray, X'pert PRO MPD, manufactured by Spectris pic) to confirm the crystal structure.

[Evaluation of Durability]

(Evaluation 1-1)

Small pieces of the compositions obtained in Examples 1 to 7 and Comparative Examples 1 to 3 were placed in an oven under a constant condition of a temperature of 60° C. and a relative humidity of 80%, and the durability test was performed for 4 days or 5 days. Then, the quantum yields of the small pieces of the compositions before and after the durability test were measured.

(Evaluation 1-2)

Small pieces of the compositions obtained in Examples 8 to 12 and Comparative Examples 4 and 5 were placed in an oven under a constant condition of a temperature of 65° C. and a humidity of 95%, and the durability test was performed. Then, the quantum yields of the small pieces of the compositions before the durability test and after 4 days of the durability test were measured.

(Measurement of Quantum Yield)

The quantum yield of each composition obtained in Examples 1 to 12 and Comparative Examples 1 to 5 was measured with excitation light having a wavelength of 450 nm at room temperature in the atmosphere using an absolute PL quantum yield measuring device (C9920-02, manufactured by Hamamatsu Photonics K. K.).

In Examples 1 to 12 and Comparative Examples 1 to 5, the durability was evaluated in terms of retention ratio calculated based on the following equation (S1).

Retention ratio=100×quantum yield after X days of durability test/quantum yield before durability test (S1)

wherein X represents the number of 4 or 5.

(Evaluation 2)

The liquid compositions obtained in Examples 13 to 17 and Comparative Example 6 were placed in an oven under a constant condition of a temperature of 25° C. and a relative humidity of 80%, and the durability test was performed. Then, the quantum yields of the liquid compositions before the durability test and after 1 day of the durability test were measured.

(Measurement of Emission Spectrum)

The emission spectrum of each liquid composition obtained in Examples 13 to 17 and Comparative Example 6 was measured with excitation light having a wavelength of 450 nm at room temperature in the atmosphere using an absolute PL quantum yield measuring device (C9920-02, manufactured by Hamamatsu Photonics K. K.).

In Examples 13 to 17 and Comparative Example 6, the durability was evaluated in terms of peak shift calculated based on the following equation (S2).

Peak shift=|Peak wavelength of emission spectrum before durability test−Peak wavelength of emission spectrum after 1 day of durability test| (S2)

In the Examples, the following materials were used.

[Component (2)]
Compound (A): Trimethoxyphenylsilane
Compound (B): Dodecyltrimethoxysilane
Compound (D): 1H,1H,2H,2H-perfluorooctyltriethoxysilane

[Other Components]
Compound (C): Tetramethoxysilane
Compound (E): Aminopropyltrimethoxysilane
Compound (F): Polysilazane As the polysilazane as the compound (F), Durazane (registered trademark) 1500 Slow Cure (manufactured by Merck Performance Materials Ltd.) was used.

Example 1

(Production of Small Piece of Composition)

0.814 g (2.5 mmol) of cesium carbonate, 40 mL of 1-octadecene, and 2.5 mL of oleic acid were mixed. The resulting mixture containing cesium carbonate was stirred using a magnetic stirrer and heated at 150° C. for 1 hour while circulating nitrogen, thereby obtaining a cesium carbonate solution.

0.276 g (0.752 mmol) of lead bromide ($PbBr_2$) was mixed into 20 mL of 1-octadecene. The resulting mixture containing lead bromide was stirred using a magnetic stirrer and heated at 120° C. for 1 hour while circulating nitrogen. To the mixture after heating, 2 mL of oleic acid and 2 mL of oleylamine were added to prepare a lead bromide dispersion liquid.

Then, the lead bromide dispersion liquid was heated to a temperature of 160° C., and 1.6 mL of the above-described cesium carbonate solution was added thereto.

The reaction container containing the resulting liquid mixture was immersed in ice water to cool the mixture to room temperature, thereby obtaining a reaction liquid containing the perovskite compound.

Next, the obtained reaction liquid was subjected to centrifugation at 10000 rpm for 5 minutes to separate the precipitated perovskite compound.

The obtained perovskite compound was dispersed in 5 mL of toluene, and 500 µL of the resulting liquid was taken out, followed by re-dispersing the liquid in 4.5 mL of toluene to obtain a dispersion liquid having the perovskite compound dispersed therein.

The concentration of the perovskite compound in the dispersion liquid was measured by the above-described method using ICP-MS and ion chromatography, and found to be 1500 ppm (μg/g).

With respect to the perovskite compound recovered by natural drying of the solvent of the dispersion, an X-ray diffraction pattern was measured using an X-ray diffractometer to thereby confirm the crystal structure of the perovskite compound. In the obtained X-ray diffraction pattern, a peak derived from (hkl)=(001) was confirmed at a position where 2θ=14°. From this result, it was confirmed that the perovskite compound had a three-dimensional perovskite type crystal structure.

The average maximum Feret diameter of the perovskite compound measured by the above-described method using a TEM was 11 nm.

Subsequently, the compound (A) was mixed with the above-described dispersion liquid to obtain a preparation liquid. In this process, the molar ratio of the addition amount (mol) of the compound (A) in terms of silicon with respect to the amount (mol) of the perovskite compound in terms of lead converted from the measured concentration of the perovskite compound was set to 10.8.

A methacrylic resin was mixed with a toluene so as to adjust the concentration of the methacrylic resin in the resulting mixture to 16.5% by mass. The resulting mixture was heated at 60° C. for 3 hours to obtain a resin solution in which the methacrylic resin was dissolved. As the methacrylic resin, SUMIPEX (registered trademark) MH, manufactured by Sumitomo Chemical Co., Ltd. (molecular weight of approximately 120000, specific gravity of 1.2 g/ml), was used.

0.15 g of the obtained preparation liquid and 0.913 g of the resin solution were mixed in an aluminum cup (4.5 φcm) to obtain a composition.

Further, toluene was evaporated off from the above-described composition by natural drying to obtain a small piece of the composition having a size of 1 cm×1 cm×100 μm as a whole. The concentration of the perovskite compound in the obtained small piece of the composition was adjusted to 1000 μg/mL based on the charged amount of the perovskite compound and the size of the small piece.
(Evaluation 1-1)

The 1 cm×1 cm small piece of the composition had a quantum yield of 26% before the durability test. On the other hand, the 1 cm×1 cm small piece of the composition had a quantum yield of 25% after 5 days of the durability test. The retention ratio calculated based on this result was 96%.

Example 2

(Production of Small Piece of Composition)

A 1 cm×1 cm small piece of a composition was obtained in the same manner as in Example 1, except that the molar ratio of the addition amount (mol) of the compound (A) in terms of silicon with respect to the amount (mol) of the perovskite compound in terms of lead converted from the measured concentration of the perovskite compound was changed to 36.1.
(Evaluation 1-1)

The 1 cm×1 cm small piece of the composition had a quantum yield of 29% before the durability test. On the other hand, the 1 cm×1 cm small piece of the composition had a quantum yield of 25% after 5 days of the durability test. The retention ratio calculated based on this result was 86%.

Example 3

(Production of Small Piece of Composition)

A 1 cm×1 cm small piece of a composition was obtained in the same manner as in Example 1, except that the molar ratio of the addition amount (mol) of the compound (A) in terms of silicon with respect to the amount (mol) of the perovskite compound in terms of lead converted from the measured concentration of the perovskite compound was changed to 108.
(Evaluation 1-1)

The 1 cm×1 cm small piece of the composition had a quantum yield of 31% before the durability test. On the other hand, the 1 cm×1 cm small piece of the composition had a quantum yield of 27% after 5 days of the durability test. The retention ratio calculated based on this result was 87%.

Example 4

(Production of Small Piece of Composition)

A 1 cm×1 cm small piece of the composition was obtained in the same manner as in Example 1, except that the compound (B) was used instead of the compound (A), and the molar ratio of the addition amount (mol) of the compound (B) in terms of silicon with respect to the amount (mol) of the perovskite compound in terms of lead converted from the measured concentration of the perovskite compound was set to 6.21.
(Evaluation 1-1)

The 1 cm×1 cm small piece of the composition had a quantum yield of 29% before the durability test. On the other hand, the 1 cm×1 cm small piece of the composition had a quantum yield of 20% after 5 days of the durability test. The retention ratio calculated based on this result was 69%.

Example 5

(Production of Small Piece of Composition)

A 1 cm×1 cm small piece of a composition was obtained in the same manner as in Example 4, except that the molar ratio of the addition amount (mol) of the compound (B) in terms of silicon with respect to the amount (mol) of the perovskite compound in terms of lead converted from the measured concentration of the perovskite compound was changed to 20.7.
(Evaluation 1-1)

The 1 cm×1 cm small piece of the composition had a quantum yield of 28% before the durability test. On the other hand, the 1 cm×1 cm small piece of the composition had a quantum yield of 20% after 5 days of the durability test. The retention ratio calculated based on this result was 71%.

Example 6

(Production of Small Piece of Composition)

A 1 cm×1 cm small piece of a composition was obtained in the same manner as in Example 4, except that the molar ratio of the addition amount (mol) of the compound (B) in terms of silicon with respect to the amount (mol) of the perovskite compound in terms of lead converted from the measured concentration of the perovskite compound was changed to 62.1.

(Evaluation 1-1)

The 1 cm×1 cm small piece of the composition had a quantum yield of 26% before the durability test. On the other hand, the 1 cm×1 cm small piece of the composition had a quantum yield of 19% after 5 days of the durability test. The retention ratio calculated based on this result was 73%.

Example 7

(Production of Small Piece of Composition)

A dispersion liquid was obtained in the same manner as in Example 1.

Subsequently, the compound (A) and the compound (E) were mixed with the above-described dispersion liquid to obtain a preparation liquid. In this process, the molar ratio of the addition amount (mol) of the compound (A) in terms of silicon with respect to the amount (mol) of the perovskite compound in terms of lead converted from the measured concentration of the perovskite compound was set to 108. Further, the molar ratio of the addition amount (mol) of the compound (E) in terms of silicon with respect to the amount (mol) of the perovskite compound in terms of lead converted from the measured concentration of the perovskite compound was set to 3.80.

Then, a resin solution was obtained in the same manner as in Example 1.

0.15 g of the obtained preparation liquid and 0.913 g of the resin solution were mixed in an aluminum cup (4.5 φcm) to obtain a composition.

Further, a 1 cm×1 cm small piece of the composition was obtained in the same manner as in Example 1, using the composition of Example 7.

(Evaluation 1-1)

The 1 cm×1 cm small piece of the composition had a quantum yield of 62% before the durability test. On the other hand, the 1 cm×1 cm small piece of the composition had a quantum yield of 42% after 4 days of the durability test. The retention ratio calculated based on this result was 68%.

Comparative Example 1

(Production of Small Piece of Composition)

A 1 cm×1 cm small piece of the composition was obtained in the same manner as in Example 1, except that the compound (A) was not used.

(Evaluation 1-1)

The 1 cm×1 cm small piece of the composition had a quantum yield of 27% before the durability test. On the other hand, the 1 cm×1 cm small piece of the composition had a quantum yield of 9% after 5 days of the durability test. The retention ratio calculated based on this result was 33%.

Comparative Example 2

(Production of Small Piece of Composition)

A 1 cm×1 cm small piece of the composition was obtained in the same manner as in Example 7, except that the compound (A) was not used.

(Evaluation 1-1)

The 1 cm×1 cm small piece of the composition had a quantum yield of 72% before the durability test. On the other hand, the 1 cm×1 cm small piece of the composition had a quantum yield of 0% after 4 days of durability test. The retention ratio calculated based on this result was 0%.

Comparative Example 3

(Production of Small Piece of Composition)

A 1 cm×1 cm small piece of a composition was obtained in the same manner as in Example 3, except that the compound (C) was used instead of the compound (A).

(Evaluation 1-1)

The 1 cm×1 cm small piece of the composition had a quantum yield of 30% before the durability test. On the other hand, the 1 cm×1 cm small piece of the composition had a quantum yield of 15% after 5 days of the durability test with respect to water vapor. The retention ratio calculated based on this result was 50%.

The evaluation results of Examples 1 to 7 and Comparative Examples 1 to 3 are shown in Table 1. In the following table, the "molar ratio" means the addition amount (mol) of each component with respect to the amount (mol) of the perovskite compound in terms of lead.

In the following Evaluation 1, evaluation criteria for the durability are as follows.
A: Retention ratio exceeds 50%
B: Retention ratio is not more than 50%

TABLE 1

| | Component (2) | | Other components | | Quantum yield [%] | | | Retention ratio [%] | | |
| | [Molar ratio] | | [Molar ratio] | | Before durability test | After 4 days of durability test | After 5 days of durability test | After 4 days | After 5 days | Evaluation |
| | (A) | (B) | (C) | (E) | | | | | | |
| Example 1 | 10.8 | — | — | — | 26 | — | 25 | — | 96 | A |
| Example 2 | 36.1 | — | — | — | 29 | — | 25 | — | 86 | A |
| Example 3 | 108 | — | — | — | 31 | — | 27 | — | 87 | A |
| Example 4 | — | 6.21 | — | — | 29 | — | 20 | — | 69 | A |
| Example 5 | — | 20.7 | — | — | 28 | — | 20 | — | 71 | A |
| Example 6 | — | 62.1 | — | — | 26 | — | 19 | — | 73 | A |
| Example 7 | 108 | — | — | 3.80 | 62 | 42 | — | 68 | — | A |
| Comparative Example 1 | — | — | — | — | 27 | — | 9 | — | 33 | B |
| Comparative Example 2 | — | — | — | 3.80 | 72 | 0 | — | 0 | — | B |
| Comparative Example 3 | — | — | 108 | — | 30 | — | 15 | — | 50 | B |

As shown in Table 1, the small pieces of the compositions according to Examples 1 to 7 to which the present invention was applied had high retention ratios exceeding 50% between before and after the durability test. This indicates that the small pieces of the compositions according to Examples 1 to 7 had high durability with respect to water vapor.

On the other hand, the small pieces of the compositions according to Comparative Examples 1 to 3 to which the present invention was not applied had low retention ratios not more than 50% between before and after the durability test. This indicates that the small pieces of the compositions according to Comparative Examples 1 to 3 had low durability with respect to water vapor.

Example 8

(Production of Small Piece of Composition)

A cesium carbonate solution was obtained in the same manner as in Example 1.

Meanwhile, 0.110 g (0.300 mmol) of lead bromide ($PbBr_2$) and 0.208 g (0.451 mmol) of lead iodide ($PbI_2$) were mixed into 20 mL of 1-octadecene. The resulting mixture containing lead bromide and lead iodide was stirred using a magnetic stirrer and heated at 120° C. for 1 hour while circulating nitrogen. To the mixture after heating, 2 mL of oleic acid and 2 mL of oleylamine were added to prepare a lead bromide-lead iodide dispersion liquid.

Then, the lead bromide-lead iodide dispersion liquid was heated to a temperature of 160° C., and 1.6 mL of the above-described cesium carbonate solution was added thereto.

The reaction container containing the resulting liquid mixture was immersed in ice water to cool the mixture to room temperature, thereby obtaining a reaction liquid containing the perovskite compound.

The average maximum Feret diameter of the perovskite compound measured by the above-described method using a TEM was 11 nm.

Then, a dispersion liquid was obtained in the same manner as in Example 1, using the reaction liquid of Example 8.

Subsequently, the compound (A) and the compound (F) were mixed with the above-described dispersion liquid to obtain a preparation liquid. In this process, the molar ratio of the addition amount (mol) of the compound (A) in terms of silicon with respect to the amount (mol) of the perovskite compound in terms of lead converted from the measured concentration of the perovskite compound was set to 57.3. Further, the molar ratio of the addition amount (mol) of the compound (F) in terms of silicon with respect to the amount (mol) of the perovskite compound in terms of lead converted from the measured concentration of the perovskite compound was set to 36.2.

Then, a composition was obtained in the same manner as in Example 1, using the preparation liquid of Example 8.

Further, a 1 cm×1 cm small piece of a composition was obtained in the same manner as in Example 1, using the composition of Example 8.

(Evaluation 1-2)

The 1 cm×1 cm small piece of the composition had a quantum yield of 54% before the durability test. On the other hand, the 1 cm×1 cm small piece of the composition had a quantum yield of 35% after 4 days of the durability test. The retention ratio calculated based on this result was 65%.

Example 9

(Production of Small Piece of Composition)

A 1 cm×1 cm small piece of a composition was obtained in the same manner as in Example 8, except that the molar ratio of the addition amount (mol) of the compound (A) in terms of silicon with respect to the amount (mol) of the perovskite compound in terms of lead was set to 172, and the molar ratio of the addition amount (mol) of the compound (F) in terms of silicon with respect to the amount (mol) of the perovskite compound in terms of lead converted from the measured concentration of the perovskite compound was set to 36.2.

(Evaluation 1-2)

The 1 cm×1 cm small piece of the composition had a quantum yield of 48% before the durability test. On the other hand, the 1 cm×1 cm small piece of the composition had a quantum yield of 31% after 4 days of the durability test. The retention ratio calculated based on this result was 65%.

Example 10

(Production of Small Piece of Composition)

A dispersion liquid was obtained in the same manner as in Example 8.

Subsequently, the compound (D) and the compound (F) were mixed with the above-described dispersion liquid to obtain a preparation liquid.

In this process, the molar ratio of the addition amount (mol) of the compound (D) in terms of silicon with respect to the amount (mol) of the perovskite compound in terms of lead converted from the measured concentration of the perovskite compound was set to 8.30. Further, the molar ratio of the addition amount (mol) of the compound (F) in terms of silicon with respect to the amount (mol) of the perovskite compound in terms of lead converted from the measured concentration of the perovskite compound was set to 36.2.

Then, a composition was obtained in the same manner as in Example 8, using the preparation liquid of Example 10.

Further, a 1 cm×1 cm small piece of the composition was obtained in the same manner as in Example 8, using the composition of Example 10.

(Evaluation 1-2)

The 1 cm×1 cm small piece of the composition had a quantum yield of 38% before the durability test. On the other hand, the 1 cm×1 cm small piece of the composition had a quantum yield of 34% after 4 days of the durability test. The retention ratio calculated based on this result was 89%.

Example 11

(Production of Small Piece of Composition)

A 1 cm×1 cm small piece of a composition was obtained in the same manner as in Example 10, except that the molar ratio of the addition amount (mol) of the compound (D) in terms of silicon with respect to the amount (mol) of the perovskite compound in terms of lead converted from the measured concentration of the perovskite compound was set to 83.0, and the molar ratio of the addition amount (mol) of the compound (F) in terms of silicon with respect to the amount (mol) of the perovskite compound in terms of lead converted from the measured concentration of the perovskite compound was set to 36.2.

(Evaluation 1-2)

The 1 cm×1 cm small piece of the composition had a quantum yield of 57% before the durability test. On the other hand, the 1 cm×1 cm small piece of the composition had a quantum yield of 41% after 4 days of the durability test. The retention ratio calculated based on this result was 72%.

Example 12

(Production of Small Piece of Composition)

A dispersion liquid was obtained in the same manner as in Example 9.

The above-described dispersion liquid was stirred using a magnetic stirrer for 1 day at 25° C. under a humidity condition of 80%, thereby modifying the component (A) and the component (F) contained in the dispersion liquid.

Then, a 1 cm×1 cm small piece of a composition was obtained in the same manner as in Example 9, using the dispersion liquid after the modification treatment.
(Evaluation 1-2)

The 1 cm×1 cm small piece of the composition had a quantum yield of 48% before the durability test. On the other hand, the 1 cm×1 cm small piece of the composition had a quantum yield of 38% after 4 days of the durability test. The retention ratio calculated based on this result was 79%.

Comparative Example 4

(Production of Small Piece of Composition)

A 1 cm×1 cm small piece of the composition was obtained in the same manner as in Example 8, except that the compound (A) and the compound (F) were not used.
(Evaluation 1-2)

The 1 cm×1 cm small piece of the composition had a quantum yield of 25% before the durability test. On the other hand, the 1 cm×1 cm small piece of the composition had a quantum yield of 4% after 4 days of the durability test. The retention ratio calculated based on this result was 16%.

Comparative Example 5

(Production of Small Piece of Composition)

A 1 cm×1 cm small piece of a composition was obtained in the same manner as in Example 8, except that the compound (A) was not used.
(Evaluation 1-2)

The 1 cm×1 cm small piece of the composition had a quantum yield of 51% before the durability test. On the other hand, the 1 cm×1 cm small piece of the composition had a quantum yield of 11% after 4 days of the durability test. The retention ratio calculated based on this result was 22%.

The evaluation results of Examples 8 to 11 and Comparative Examples 4 and 5 are shown in Table 2. Further, the evaluation results of Examples 9 and 12 are shown in Table 3.

TABLE 2

| | Component (2) [Molar ratio] | | Other components [Molar ratio] | Quantum yield [%] | | Retention ratio [%] | Evaluation |
|---|---|---|---|---|---|---|---|
| | (A) | (D) | (F) | Before durability test | After 4 days of durability test | | |
| Example 8 | 57.3 | — | 36.2 | 54 | 35 | 65 | A |
| Example 9 | 172 | — | 36.2 | 48 | 31 | 65 | A |
| Example 10 | — | 8.30 | 36.2 | 38 | 34 | 89 | A |
| Example 11 | — | 83.0 | 36.2 | 57 | 41 | 72 | A |
| Comparative Example 4 | — | — | — | 25 | 4 | 16 | B |
| Comparative Example 5 | — | — | 36.2 | 51 | 11 | 22 | B |

TABLE 3

| | Component (2) [Molar ratio] (A) | Other components [Molar ratio] (F) | Modification treatment | Quantum yield [%] | | Retention ratio [%] | Evaluation |
|---|---|---|---|---|---|---|---|
| | | | | Before durability test | After 4 days of durability test | | |
| Example 9 | 172 | 36.2 | — | 48 | 31 | 65 | A |
| Example 12 | 172 | 36.2 | ○ | 48 | 38 | 79 | A |

As shown in Table 2, the small pieces of the compositions according to Examples 8 to 11 to which the present invention was applied had high retention ratios exceeding 50% between before and after the durability test. This indicates that the small pieces of the compositions according to Examples 8 to 11 had high durability with respect to water vapor.

On the other hand, the small pieces of the compositions according to Comparative Examples 4 and 5 to which the present invention was not applied had low retention ratios not more than 50% between before and after the durability test. This indicates that the small pieces of the compositions according to Comparative Examples 4 and 5 had low durability with respect to water vapor.

As shown in Table 3, even when the modified compound (A) was used, the resulting small piece of the composition had a high retention ratio exceeding 50% as in the case where the non-modified compound (A) was used. This indicates that the small piece of the composition according to Example 12 had a high durability with respect to water vapor as in Example 9.

Example 13

(Production of liquid composition) A dispersion liquid was obtained in the same manner as in Example 8.

Subsequently, the compound (A) was mixed with the above-described dispersion liquid to obtain a liquid composition. In this process, the molar ratio of the addition amount (mol) of the compound (A) in terms of silicon with respect to the amount (mol) of the perovskite compound in terms of lead converted from the measured concentration of the perovskite compound was set to 5.73.

(Evaluation 2)

With respect to the obtained liquid composition, the peak wavelength of the emission spectrum was 638 nm as measured before the durability test. In contrast, with respect to this liquid composition, the peak wavelength of the emission spectrum was 582 nm as measured after 1 day of the durability test. The peak shift calculated based on this result was 56 nm.

Example 14

(Production of Liquid Composition)

A liquid composition was obtained in the same manner as in Example 13, except that the molar ratio of the addition amount (mol) of the compound (A) in terms of silicon with respect to the amount (mol) of the perovskite compound in terms of lead converted from the measured concentration of the perovskite compound was changed to 17.2.

(Evaluation 2)

With respect to the obtained liquid composition, the peak wavelength of the emission spectrum was 638 nm as measured before the durability test. In contrast, with respect to this liquid composition, the peak wavelength of the emission spectrum was 607 nm as measured after 1 day of the durability test. The peak shift calculated based on this result was 31 nm.

Example 15

(Production of Liquid Composition)

A liquid composition was obtained in the same manner as in Example 13, except that the molar ratio of the addition amount (mol) of the compound (A) in terms of silicon with respect to the amount (mol) of the perovskite compound in terms of lead converted from the measured concentration of the perovskite compound was changed to 28.7.

(Evaluation 2)

With respect to the obtained liquid composition, the peak wavelength of the emission spectrum was 638 nm as measured before the durability test. In contrast, with respect to this liquid composition, the peak wavelength of the emission spectrum was 608 nm as measured after 1 day of the durability test. The peak shift calculated based on this result was 30 nm.

Example 16

(Production of Liquid Composition)

A dispersion liquid was obtained in the same manner as in Example 8.

Subsequently, the compound (D) was mixed with the above-described dispersion liquid to obtain a liquid composition. In this process, the molar ratio of the addition amount (mol) of the compound (D) in terms of silicon with respect to the amount (mol) of the perovskite compound in terms of lead converted from the measured concentration of the perovskite compound was set to 2.77.

(Evaluation 2)

With respect to the obtained liquid composition, the peak wavelength of the emission spectrum was 638 nm as measured before the durability test. In contrast, with respect to this liquid composition, the peak wavelength of the emission spectrum was 626 nm as measured after 1 day of the durability test. The peak shift calculated based on this result was 12 nm.

Example 17

(Production of Liquid Composition)

A liquid composition was obtained in the same manner as in Example 16, except that the molar ratio of the addition amount (mol) of the compound (D) in terms of silicon with respect to the amount (mol) of the perovskite compound in terms of lead converted from the measured concentration of the perovskite compound was changed to 3.89.

(Evaluation 2)

With respect to the obtained liquid composition, the peak wavelength of the emission spectrum was 638 nm as measured before the durability test. In contrast, with respect to this liquid composition, the peak wavelength of the emission spectrum was 635 nm as measured after 1 day of the durability test. The peak shift calculated based on this result was 3 nm.

Comparative Example 6

(Production of Liquid Composition)

A liquid composition was obtained in the same manner as in Example 13, except that the compound (A) was not used.

(Evaluation 2)

With respect to the obtained liquid composition, the peak wavelength of the emission spectrum was 638 nm as measured before the durability test. In contrast, with respect to this liquid composition, the peak wavelength of the emission spectrum was 576 nm as measured after 1 day of the durability test. The peak shift calculated based on this result was 62 nm.

The evaluation results of Examples 13 to 17 and Comparative Example 6 are shown in Table 4.

In the Evaluation 2, evaluation criteria for the durability are as follows,

○: Peak shift is 60 nm or less
x: Peak shift exceeds 60 nm

TABLE 4

| | Component (2) [Molar ratio] | | Peak wavelength of emission spectrum [nm] | | Peak shift | |
|---|---|---|---|---|---|---|
| | | | Before durability test | After 1 day of durability test | | |
| | (A) | (D) | | | [nm] | Evaluation |
| Example 13 | 5.73 | — | 638 | 582 | 56 | A |
| Example 14 | 17.2 | — | 638 | 607 | 31 | A |
| Example 15 | 28.7 | — | 638 | 608 | 30 | A |
| Example 16 | — | 2.77 | 638 | 626 | 12 | A |

TABLE 4-continued

| | Peak wavelength of emission spectrum [nm] | | | | |
|---|---|---|---|---|---|
| Component (2) [Molar ratio] | | Before durability | After 1 day of durability | Peak shift | |
| (A) | (D) | test | test | [nm] | Evaluation |
| Example 17 | — | 3.89 | 638 | 635 | 3 | A |
| Comparative Example 6 | — | — | 638 | 576 | 62 | B |

As shown in Table 4, the small pieces of the compositions according to Examples 13 to 17 to which the present invention was applied had small peak shifts of not more than 60 nm between before and after the durability test. This indicates that the small pieces of the compositions according to Examples 13 to 17 had high durability with respect to water vapor.

On the other hand, the small piece of the composition according to Comparative Example 6 to which the present invention was not applied had a large peak shift exceeding 60 nm between before and after the durability test. This indicates that the small piece of the composition according to Comparative Example 6 had low durability with respect to water vapor.

[Manufacture of On-Edge Type Backlight]

Reference Examples 1-1 to 1-7

The small pieces of the compositions of Examples 1 to 7 are respectively placed in glass tubes and the glass tubes are sealed.

Then, each of these glass tubes is disposed between a blue LED as the light source and a light-guiding plate so as to extend along an end surface (side surface) of the light-guiding plate, thereby producing on-edge type backlights.

All of the obtained backlights can convert blue light of the blue LED into green light.

Reference Examples 1-8 to 1-12

On-edge type backlights are manufactured in the same manner as in Reference Examples 1-1 to 1-7, respectively, except that the small pieces of the compositions of Examples 8 to 12 are respectively used instead of the small pieces of the compositions of Examples 1 to 7.

All of the obtained backlights can convert the blue light of the blue LED into red light.

[Manufacture of Surface-Mounting Type Backlight]

Reference Examples 2-1 to 2-7

The small pieces of the compositions of Examples 1 to 7 are respectively formed into sheets.

Next, each of the obtained sheets is interposed between two barrier films and sealed, thereby obtaining films.

Then, the obtained films are respectively placed on light-guiding plates to thereby manufacture surface-mounting type backlights.

In each of the obtained backlights, blue light is irradiated toward the sheet through the light-guiding plate from a blue LED placed on an end surface (side surface) of the light-guiding plate. All of the obtained backlights can convert the blue light into green light.

Reference Examples 2-8 to 2-12

Surface-mounting type backlights are manufactured in the same manner as in Reference Examples 2-1 to 2-7, respectively, except that the small pieces of the compositions of Examples 8 to 12 are respectively used instead of the small pieces of the compositions of Examples 1 to 7.

All of the obtained backlights can convert the blue light of the blue LED into red light.

[Manufacture of On-Chip Type Backlight]

Reference Examples 3-1 to 3-7

On-chip type backlights are manufactured by respectively placing the small pieces of the compositions of Examples 1 to 7 in the vicinity of light-emitting units of blue light-emitting diodes.

All of the obtained backlights can convert blue light of the blue LED into green light.

Reference Examples 3-8 to 3-12

On-chip type backlights are manufactured in the same manner as in Reference Examples 3-1 to 3-7, respectively, except that the small pieces of the compositions of Examples 8 to 12 are respectively used instead of the small pieces of the compositions of Examples 1 to 7.

All of the obtained backlights can convert the blue light of the blue LED into red light.

[Manufacture of Wavelength Conversion Sheet Type Backlight]

Reference Examples 4-1 to 4-5

The liquid compositions of Examples 13 to 17 are respectively mixed into resists and coated. The solvent is removed from the resulting coatings to obtain respective wavelength conversion layers. Each of the obtained wavelength conversion layers is disposed on a back stage of a blue LED serving as a light source to thereby manufacture wavelength conversion sheet type backlights.

All of the obtained backlights can convert the blue light of the blue LED into red light.

[Production of LED]

Reference Examples 5-1 to 5-5

The liquid compositions of Examples 13 to 17 are respectively mixed with zinc sulfide (ZnS) as conductive particles, and formed into films.

Next, an n-type transport layer is laminated on one surface of each of the obtained films, and a p-type transport layer is laminated on the other surface of each of the films, thereby obtaining LEDs.

All of the obtained LEDs can emit light by recombination of holes generated in the p-type transport layers and electrons generated in the n-type transport layers in the films.

[Manufacture of Solar Cell]

Reference Examples 6-1 to 6-6

A titanium oxide dense layer is laminated on the surface of a substrate formed of fluorine-doped tin oxide (FTO) as a fabrication material, and a porous aluminum oxide layer is laminated on the titanium oxide dense layer.

On the porous aluminum oxide layers of the thus formed laminates, the liquid compositions of Examples 13 to 17 are respectively applied. The solvent is removed from the resulting coatings to form layers respectively containing the components (1) of Examples 13 to 17 in addition to the component (2).

Further, on each of the formed layers, a hole transport layer of 2,2',7,7'-tetrakis-(N, N'-di-p-methoxyphenylamine)-9,9'-spirobifluorene (Spiro-OMeTAD) is laminated, and a silver (Ag) layer is laminated on the hole transport layer, thereby manufacturing solar cells.

All of the obtained solar cells can generate electric power.

[Manufacture of Laser Diode Lighting]

Reference Examples 7-1 to 7-5

Each of the liquid compositions of Examples 13 to 17 is mixed into a resin and the solvent is removed from the resulting mixtures to obtain resin molded article respectively containing the components (1) of Examples 13 to 17 in addition to the component (2).

Each of the obtained resin molded articles is disposed on a light-emitting side of a blue LED to thereby manufacture LED lightings.

In each of the obtained LED lightings, blue light is irradiated toward the resin molded article. All of the obtained LED lightings can convert a part of the blue light into red light. Further, by using a material that converts a part of blue light into green light in combination with the LED lightings, the light LD lightings can emit white light.

The above results confirmed that the present invention is useful.

INDUSTRIAL APPLICABILITY

The present invention can provide a composition having a high durability as well as a film formed of the composition as a fabrication material, and a laminated structure including the film. Therefore, the composition of the present invention, the film using the composition as a fabrication material, and the laminated structure including the film can be suitably used in light emitting applications.

Further, the present invention can also provide a light emitting device including the laminated structure and a display including the laminated structure.

REFERENCE SIGNS LIST

1a First laminated structure
1b Second laminated structure
10 Film
20 First substrate
21 Second substrate
22 Sealing layer
2 Light-emitting device
30 Light source
3 Display
40 Liquid crystal panel
50 Prism sheet
60 Light-guiding plate

What is claimed is:
1. A light-emitting composition comprising:
component (1): semiconductor fine particles;
component (2): a compound represented by Formula (X) or a modified product thereof; and
component (5): at least one component selected from the group consisting of amines having an alkenyl group having 8 to 20 carbon atoms, carboxylic acids having an alkenyl group having 8 to 20 carbon atoms, and salts or ions thereof,
wherein:
Y is a direct bond, an oxygen atom, or a sulfur atom, with the proviso that,
when Y is an oxygen atom, $R^{16}$ is an alkyl group having 3 to 20 carbon atoms, a cycloalkyl group having 3 to 30 carbon atoms, or an unsaturated hydrocarbon group having 2 to 20 carbon atoms, and $R^{17}$ is an alkyl group, a cycloalkyl group, an unsaturated hydrocarbon group or a hydrogen atom, with the proviso that $R^{17}$ has a smaller number of carbon atoms than $R^{16}$,
when Y is a direct bond or a sulfur atom, $R^{16}$ is an alkyl group having 1 to 20 carbon atoms, a cycloalkyl group having 3 to 30 carbon atoms, or an unsaturated hydrocarbon group having 2 to 20 carbon atoms, $R^{17}$ is an alkyl group having 1 to 20 carbon atoms, a cycloalkyl group having 3 to 30 carbon atoms, an unsaturated hydrocarbon group having 2 to 20 carbon atoms, or a hydrogen atom,
hydrogen atoms in the alkyl group, the cycloalkyl group and the unsaturated hydrocarbon group as $R^{16}$ or $R^{17}$ are each independently substituted by or not substituted by a halogen atom, and
hydrogen atoms in the cycloalkyl group as $R^{16}$ or $R^{17}$ are each independently substituted by or not substituted by an alkyl group, and
a is an integer of 1 to 3, with the proviso that,
when a is 2 or 3, a plurality of Y may be the same or different,
when a is 2 or 3, a plurality of $R^{16}$ may be the same or different, and
when a is 1 or 2, a plurality of $R^{17}$ may be the same or different,

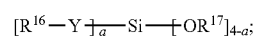

(X)

wherein the amines having an alkenyl group having 8 to 20 carbon atoms of component (5) have a salt or ion form represented by an ammonium cation of formula (A1):

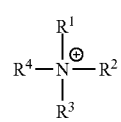

(A1)

wherein $R^1$ to $R^3$ represent a hydrogen atom and $R^4$ is an alkenyl group having 8 to 20 carbon atoms; and
wherein the carboxylic acids having an alkenyl group having 8 to 20 carbon atoms of component (5) have a salt or ion form represented by a carboxylate anion of formula (A2):

(A2)

wherein $R^5$ represents an alkenyl group having 8 to 20 carbon atoms.

2. The composition according to claim 1, which further comprises at least one component selected from the group consisting of:
component (3): a solvent; and
component (4): a polymerizable compound or a polymer.

3. The composition according to claim 1, which further comprises:
component (4'): a polymer,
wherein a total content ratio of the component (1), the component (2), and the component (4') is 90% by mass or greater with respect to the total mass of the composition.

4. The composition according to claim 1, wherein the component (1) comprises a perovskite compound comprising constituent components A, B, and X,
wherein the constituent component A indicates a component positioned at each vertex of a hexahedron having the constituent component B at its center in a perovskite type crystal structure and is a monovalent cation,
the constituent component X indicates a component positioned at each vertex of an octahedron having the constituent component B at the center in the perovskite type crystal structure and is one or more kinds of anions selected from the group consisting of a halide ion and a thiocyanate ion, and
the constituent component B indicates a component positioned at a center of a hexahedron where the constituent component A is disposed at each vertex and at a center of an octahedron where the constituent component X is disposed at each vertex in the perovskite type crystal structure and is a metal ion.

5. The composition according to claim 4, wherein a molar ratio [Si/B] of a Si element in the component (2) to a metal ion in a component B of the perovskite compound is 5.73 or more.

6. The composition according to claim 4, wherein an amount of the component (1) is 0.0001% by mass or greater and 2% by mass or less.

7. The composition according to claim 4, which further comprises:
component (4'): a polymer,
wherein a total content ratio of the component (1), the component (2), and the component (4') is 90% by mass or greater with respect to the total mass of the composition.

8. The composition according to claim 1, wherein a is 1.

9. The composition according to claim 1, wherein Y is a direct bond.

10. The composition according to claim 1, wherein the component (2) comprises at least one component selected from the group consisting of trimethoxyphenylsilane, dodecyltrimethoxysilane, and 1H,1H,2H,2H-perfluorooctyltriethoxysilane.

11. The composition according to claim 1, wherein the component (1) comprises at least one component selected from the group consisting of a cadmium element, an indium element, and a perovskite compound.

12. The composition according to claim 1, wherein the semiconductor fine particles have an average particle diameter from 1 nm to 8 nm.

13. The composition according to claim 1, wherein the semiconductor fine particles have an average particle diameter from 1 nm to 500 nm.

14. The composition according to claim 1, wherein component (2) directly adsorbs to a surface of component (1).

15. A light-emitting composition comprising:
component (1): semiconductor fine particles; and
component (2): a compound represented by Formula (X) or a modified product thereof,
wherein Y is a sulfur atom,
$R^{16}$ is an alkyl group having 1 to 20 carbon atoms, a cycloalkyl group having 3 to 30 carbon atoms, or an unsaturated hydrocarbon group having 2 to 20 carbon atoms,
$R^{17}$ is an alkyl group having 1 to 20 carbon atoms, a cycloalkyl group having 3 to 30 carbon atoms, an unsaturated hydrocarbon group having 2 to 20 carbon atoms, or a hydrogen atom,
hydrogen atoms in the alkyl group, the cycloalkyl group and the unsaturated hydrocarbon group as $R^{16}$ or $R^{17}$ are each independently substituted by or not substituted by a halogen atom,
hydrogen atoms in the cycloalkyl group as $R^{16}$ or $R^{17}$ are each independently substituted by or not substituted by an alkyl group, and
a is an integer of 1 to 3, with the proviso that,
when a is 2 or 3, a plurality of $R^{16}$ may be the same or different, and
when a is 1 or 2, a plurality of $R^{17}$ may be the same or different, $$[R^{16}-Y]_a-Si-[OR^{17}]_{4-a}. \quad (X)$$

16. A film comprising the composition according to claim 1 as a fabrication material.

17. A laminated structure comprising the film according to 16.

18. A light-emitting device comprising the laminated structure according to claim 17.

19. A display comprising the laminated structure according to claim 17.

* * * * *